United States Patent
Moriyama et al.

[11] Patent Number: 5,903,823
[45] Date of Patent: May 11, 1999

[54] RADIO APPARATUS WITH DISTORTION COMPENSATING FUNCTION

[75] Inventors: Yukihiro Moriyama, Kawasaki; Yoshiya Ohsaki, Fukuoka, both of Japan

[73] Assignee: Fujitsu Limited, Kawasaki, Japan

[21] Appl. No.: 08/617,269

[22] Filed: Mar. 18, 1996

[30] Foreign Application Priority Data

Sep. 19, 1995 [JP] Japan .................................. 7-239594
Nov. 30, 1995 [JP] Japan .................................. 7-311860
Feb. 21, 1996 [JP] Japan .................................. 8-33553

[51] Int. Cl.$^6$ ................................................ H01Q 11/12
[52] U.S. Cl. ........................... 455/126; 330/149; 375/297
[58] Field of Search ................................. 455/126, 115; 330/149; 375/296, 297

[56] References Cited

U.S. PATENT DOCUMENTS

| | | | |
|---|---|---|---|
| 4,700,151 | 10/1987 | Nagata | 455/126 X |
| 4,985,688 | 1/1991 | Nagata | 332/123 |
| 5,091,919 | 2/1992 | Kuisma | 455/126 X |
| 5,148,448 | 9/1992 | Karam | 455/126 X |
| 5,191,597 | 3/1993 | Ekelund et al. | 330/149 X |
| 5,396,190 | 3/1995 | Murata | 330/149 |
| 5,404,579 | 4/1995 | Obayashi et al. | 455/74 |
| 5,452,473 | 9/1995 | Weiland et al. | 455/126 X |

FOREIGN PATENT DOCUMENTS 4-290321 10/1992 Japan .

*Primary Examiner*—Thomas J. Mullen, Jr.
*Attorney, Agent, or Firm*—Staas & Halsey

[57] ABSTRACT

Disclosed is a radio apparatus in which modulating signals (I and Q signals) from an arithmetic/control unit are converted to analog signals, which are then applied to an orthogonal modulator. A modulated wave for transmission, which has been produced by orthogonally modulating a reference carrier wave by the modulating signals, is demodulated by the orthogonal detector. The arithmetic/control unit compares the modulating signals and the demodulated signals and, based upon the comparison, updates distortion compensation coefficients and applies pre-distortion processing to the modulating signal using the distortion compensation coefficients. Leakage of carrier produced due offset of the orthogonal modulator is detected and the arithmetic/control unit adjusts the level of the modulating signals or shifts the phase of the reference carrier wave in such a manner that the leakage of carrier (offset) becomes zero.

25 Claims, 69 Drawing Sheets

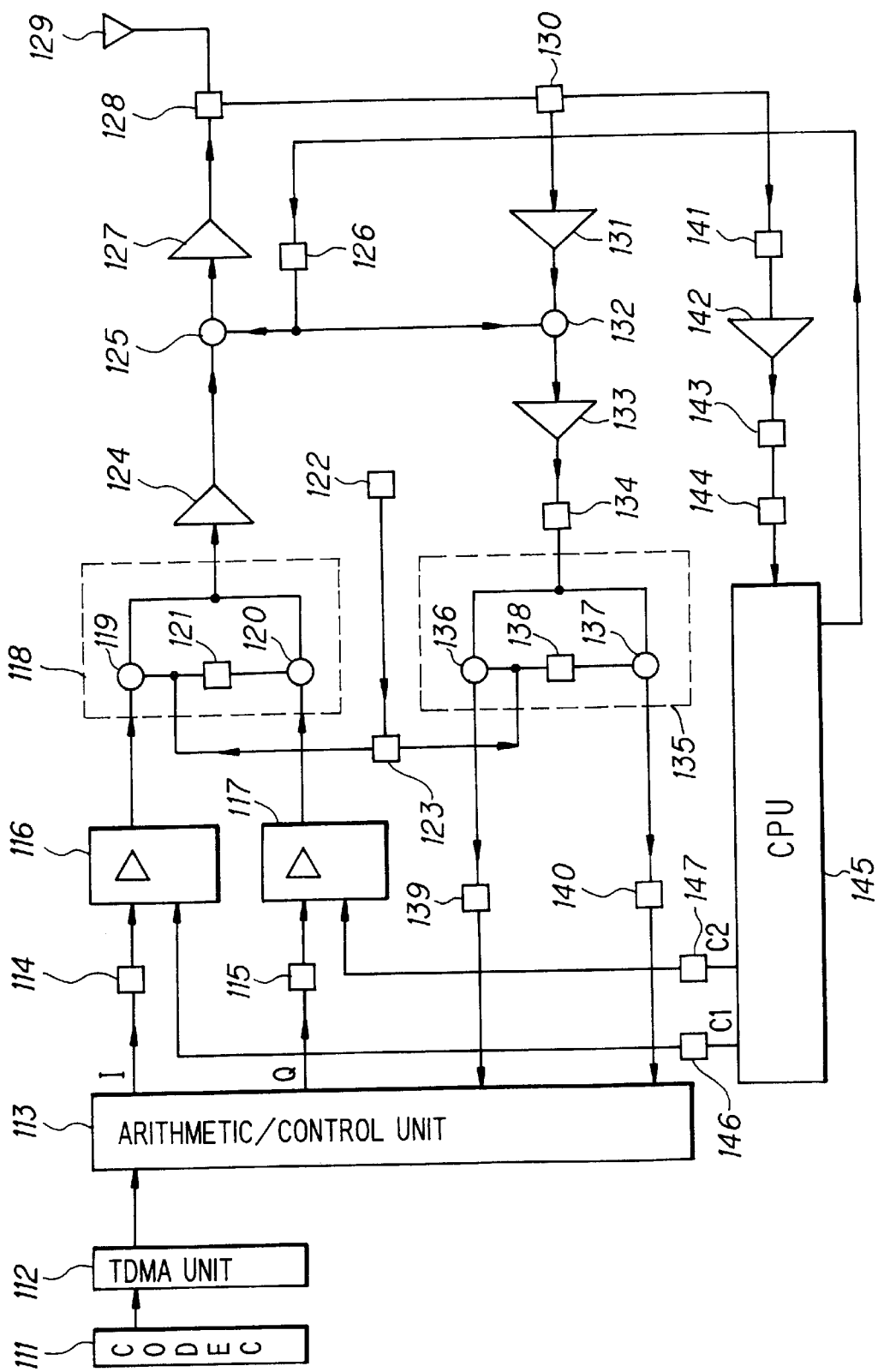

| TRANSMISSION DATA LEVEL | DISTORTION COMPENSATION COEFFICIENT | FLAG |
|---|---|---|
| 0 | $h(P_0)$ | |
| 1 | $h(P_1)$ | |
| 2 | $h(P_2)$ | |
| 3 | $h(P_3)$ | |
| ⋮ | ⋮ | |
| 1023 | $h(P_{1024})$ | |

FIG.51A

| | | TRANSMISSION POWER | | | |
|---|---|---|---|---|---|
| | | 0dB | −10dB | −20dB | −30dB |
| CARRIER | 1 | $H_{11}$ | $H_{12}$ | $H_{13}$ | $H_{14}$ |
| | 2 | $H_{21}$ | $H_{22}$ | $H_{23}$ | $H_{24}$ |
| | 3 | $H_{31}$ | $H_{32}$ | $H_{33}$ | $H_{34}$ |
| | N | $H_{41}$ | $H_{42}$ | $H_{43}$ | $H_{44}$ |

FIG.51B

| TEMPERATURE | DISTORTION COMPENSATION COEFFICIENT |
|---|---|
| $t \leq t_0$ | $H_0$ |
| $t_0 < t \leq t_1$ | $H_1$ |
| $t_1 < t \leq t_2$ | $H_2$ |
| $t_2 \leq t$ | $H_3$ |

FIG.51C

| POWER SUPPLY VOLTAGE | DISTORTION COMPENSATION COEFFICIENT |
|---|---|
| $V \leq V_0$ | $H_0'$ |
| $V_0 < V \leq V_1$ | $H_1'$ |
| $V_1 < V$ | $H_2'$ |

FIG. 53

| VSWR | TRANSMISSION DATA LEVEL | DISTORTION COMPENSATION COEFFICIENT |
|---|---|---|
| GREATER THAN 3 | 0 | $h(P_0)$ |
| | 1 | $h(P_1)$ |
| | 2 | $h(P_2)$ |
| | 3 | $h(P_3)$ |
| | ⋮ | ⋮ |
| | 1023 | $h(P_{1024})$ |
| LESS THAN 3 | 0 | $h(P_0)'$ |
| | 1 | $h(P_1)'$ |
| | 2 | $h(P_2)'$ |
| | 3 | $h(P_3)'$ |
| | ⋮ | ⋮ |
| | 1023 | $h(P_{1024})'$ |

FIG.64

| AMPLITUDE LEVEL A | PHASE DIFFE-RENCE $d\theta$ | PHASE-DIFFERENCE CORRECTION COEFFICIENTS | |
|---|---|---|---|
| | | $C_1$ | $C_2$ |
| $0 < A \leq A_1$ | $d\theta_1$ | | |
| | $d\theta_2$ | | |
| | ⋮ | | |
| | $d\theta_n$ | | |
| $A_1 < A \leq A_2$ | $d\theta_1$ | | |
| | $d\theta_2$ | | |
| | ⋮ | | |
| | $d\theta_n$ | | |
| $A_2 < A$ | $d\theta_1$ | | |
| | $d\theta_2$ | | |
| | ⋮ | | |
| | $d\theta_n$ | | | u(t) : SIGNAL WITH DISTORTION

RADIO APPARATUS WITH DISTORTION COMPENSATING FUNCTION

BACKGROUND OF THE INVENTION

This invention relates to a radio apparatus equipped with a distortion compensating function. More particularly, the invention relates to a radio apparatus with a distortion compensating function in which the amplification characteristic of a transmission power amplifier is linearized to suppress non-linear distortion and reduce power leakage between adjacent channels.

Frequency resources have become strained in recent years and greater reliance is being placed upon highly efficient digital transmission in radio communication. In a case where multivalued amplitude modulation is applied to radio communication, an important technique used on the transmitting side is to linearize the amplification characteristic of a power amplifier to thereby suppress non-linear distortion and reduce power leakage between adjacent channels. In a case where an amplifier having inferior linearity is used and an attempt is made to improve power efficiency, a technique which compensates for the distortion produced by this amplifier is essential.

FIG. 71 is a block diagram showing an example of a transmitter in a conventional radio apparatus. A group of digital data sent from an audio CODEC (coder/decoder) 1 is applied to a TDMA unit 2, where the data group is subjected to burst processing and to processing for A separating the digital data group into an I signal (in-phase) and a Q signal (quadratune phase). The I and Q signals are outputted to a DA converter 3 in an allocated time slot. The DA converter 3 converts the I and Q signals to analog baseband signals and enters or inputs the baseband signals into an orthogonal modulator 4. The latter multiplies the input I and Q signals (the transmission baseband signals) by a reference carrier wave and a signal phase-shifted from the reference carrier by 90°, respectively, adds the two products, thereby performing an orthogonal conversion, and outputs the result. A frequency converter 5 mixes the orthogonally modulated signal and a local oscillation signal to perform a frequency conversion, and a transmission power amplifier 6 amplifies the power of the carrier wave outputted by the frequency converter 5 and broadcasts the amplified signal into space from an antenna 7.

In such a communication apparatus, the input/output characteristic of the transmission power amplifier is a non-linear characteristic indicated by the dashed line in FIG. 72A. Non-linear distortion is produced as a result of the non-linear characteristic, and a frequency spectrum centered about a transmission frequency $f_0$ possesses side lobes, as indicated by the dashed line in FIG. 72B. This results in leakage into adjacent channels and causes interference between the adjacent channels.

A wide variety of analog techniques which compensate for the occurrence of distortion have been proposed. These include linear amplification by combination of C-class amplification (LINC), a feed-forward method, an analog Cartesian method, a polar loop method and a pre-distortion method using non-linear elements.

However, these methods result in increased band noise and difficulties in phase adjustment when feedback gain is raised to provide further improvement upon distortion.

With this as a background, a method of compensating for distortion using a digital signal processing technique has been realized to cope with the greatly increased processing speed of digital signal processors (DSP) that has been made possible by recent advances in LSI techniques. Many technical papers dealing with digital methods of compensating for non-linear distortion have been published and the theory thereof is known. For example, see "Adaptive Linearization Using Pre-distortion" (Michael Fsulkner and Mats Johanson), delivered at Victoria College (Australia), and "Adaptive Linearization Using Pre-distortion Experimental Results", IEEE Transaction on Vehicular Technology, Vol. No. 2, May, 1994. If these digital techniques are put into practical use, the aforementioned drawbacks of the analog methods are solved.

FIG. 73 is a block diagram of a transmission apparatus having a function which compensates for non-linear distortion digitally using a DSP. A digital data group (modulating signal) sent from the audio CODEC 1 is subjected to burst processing in the TDMA 2 and is entered into an arithmetic/control unit 8, which is constituted by a DSP, in an allocated time slot. As shown in FIG. 74, the arithmetic/control unit 8 includes a number of functional blocks, namely a distortion compensation coefficient memory 8a which stores distortion compensation coefficients h(Pi) (i=0~1023) conforming to levels 0~1023 of the modulating signal, a pre-distortion unit 8b which applies distortion compensation processing (pre-distortion) to the modulating signal using the distortion compensation coefficients h(Pi) conforming to the modulated signal levels, and a distortion compensation coefficient arithmetic unit 8c for comparing the modulating signal with a demodulated signal, obtained by demodulation using an orthogonal detector, described later, and for calculating and updating the distortion compensation coefficients h(Pi) in such a manner that the difference between the modulated and demodulated signals becomes zero.

The arithmetic/control unit 8 applies pre-distortion processing to the modulating signal using the distortion compensation coefficients h(Pi) conforming to the levels of the modulating signal, effects a conversion to I and Q signals and enters these signals into the DA converter 3. The DA converter 3 converts the I and Q signals to analog baseband signals and enters the baseband signals into the orthogonal modulator 4. The latter multiplies the input I and Q signals by a reference carrier wave and a signal phase-shifted from the reference carrier by 90°, respectively, adds the two products, thereby performing an orthogonal conversion, and outputs the result. The frequency converter 5 mixes the orthogonally modulated signal and a local oscillation signal to perform a frequency conversion, and the transmission power amplifier 6 amplifies the power of the carrier wave outputted by the frequency converter 5 and broadcasts the amplified signal into space from the antenna 7. Part of the transmission signal enters a frequency converter 10 via a directional coupler 9. The converter 10 performs a frequency conversion and enters the results into an orthogonal detector 11. The orthogonal detector 11 multiplies the input signal by the reference carrier wave and by the signal phase-shifted from the reference carrier by 90°, thereby performing orthogonal detection and reproducing the baseband I, Q signals from the transmitting side, and enters these signals into an AD converter 12. The latter converts the input I, Q signals to digital signals and enters the digital signals into the arithmetic/control unit 8. The latter compares the modulating signal and the demodulated signal, which is obtained by the orthogonal detector 11, by an adaptive algorithm using the LIMS method (the method of least mean squares), and calculates/updates the distortion compensation coefficients h(Pi) so as to null the difference between the compared signals. The modulated signal to be transmitted next is then subjected to pre-distortion processing using the updated distortion compensation coefficients h(Pi) and the processed signal is outputted. By thenceforth repeating this operation, non-linear distortion of the transmission power amplifier is suppressed t leakage of power to adjacent channels.

FIG. 75 is a diagram for describing distortion compensation processing based upon an adaptive algorithm. Shown in FIG. 75 is a multiplier 15a for multiplying a modulating signal (an input baseband signal) x(t) by a distortion compensation coefficient h(P), a transmission power amplifier 15b having a distortion function f(p), a feedback loop 15c for feeding back an output signal y(t) from the transmission power amplifier 15b, an arithmetic unit 15d for calculating power p $[=x(t)^2]$ of the modulating signal x(t), a distortion compensation coefficient memory 15e for storing distortion compensation coefficients conforming to each power of the modulating signal x(t) and for outputting distortion compensation coefficients conforming to power of a currently prevailing modulating signal x(t), a conjugate complex signal output unit 15f, a subtractor 15g for outputting a difference e(t) between the modulating signal x(t) and the feedback demodulated signal y(t), multipliers 15g, 15h, and a multiplier 15i for multiplying by a step size parameter ♥.

The arrangement described performs the following operations:

$$h_n(p) = h_{n-1}(p) + \heartsuit e(t)u^*(t)$$

$$e(t) = x(t) - y(t)$$

$$y(t) = h_{n-1}(p)x(t)f(p)$$

$$u(t) = x(t)f(p) = h^*_{n-1}(p)y(t)$$

$$P = |x(t)|^2$$

where x, y, f, h, u and e represent complex numbers and * represents a conjugate complex number.

By performing the processing shown above, h(p) is updated so as to minimize the difference e(t) between the modulating signal x(t) and the feedback demodulated signal y(t), whereby the distortion compensation coefficients eventually converge to the optimum distortion compensation coefficient values to compensate for distortion of the transmission power amplifier.

Thus, the principle of digitally compensating for non-linear distortion entails feeding back and detecting a carrier wave obtained by orthogonal modulation using a modulating signal, digitally converting the amplitudes of the modulating signal (the transmission baseband signal) and the feedback signal (feedback baseband signal) and comparing the same, and updating the distortion compensation coefficients in real time based upon the results of comparison. As a consequence, if an amplitude error develops owing to offsets of the orthogonal modulator and orthogonal detector, an error occurs in the arithmetic operations and appropriate compensation of distortion can no longer be performed. At the present time, the analog orthogonal modulator and orthogonal detector generally in use are constituted by Gilbert-cell differential amplifiers, as is well known. As a result, an offset develops owing to a variance in element performance and a change in ambient temperature. Moreover, the offset value is influenced by the offset fluctuation of a DC amplifier used after the burst signal is subjected to the digital-to-analog (D/A) conversion.

FIG. 76 illustrates a QPSK-modulated wave expressed in a complex plane. If offset is present in a case where the original amplitude is a, as shown in FIG. 76, the offset is superposed on the original amplitude, as a result of which the arithmetic/control unit erroneously identifies the amplitude as being b. Since the method of digitally compensating for non-linear distortion uses this amplitude component in the comparison operation, the erroneous recognition of the amplitude leads to the occurrence of an error in distortion compensation so that proper compensation of distortion can no longer be carried out. In other words, executing the processing for updating the distortion compensation coefficients before compensating for the offset is not only meaningless but rather has an adverse influence upon operation. Thus, a technique to compensate for the offset is required in a radio apparatus having a distortion compensating function.

Further, the feedback baseband signals develop a phase shift with respect to the transmission baseband signals owing to the length of the transmission line or the devices in the transmission loop or feedback loop. When such a phase shift occurs, the original compensation for distortion can no longer be carried out accurately. A method of eliminating this phase shift is to compensate for the amount of the phase shift by changing the length of the transmission line along the way. However, this method is not practical because the phase shift varies depending upon the circuit mounting position or frequency. Accordingly, a technique which corrects for phase difference is required in a communication apparatus having a distortion compensating function.

Further, in the method of digitally compensating for non-linear distortion, the arithmetic/control unit constituted by the DSP executes distortion compensation processing digitally, as set forth above. The distortion compensation processing therefore is limited by the operating speed of the DSP. This means that if a data transmission is performed at high speed, the distortion compensation processing cannot keep pace. More specifically, in a case where the data transmission rate is on the order of 8 Kbps, there is enough time for the DSP to perform calculations in real time. When the transmission is performed at a high rate of 32 Kbps, however, the-DSP cannot keep pace. This drawback becomes a fatal flaw in high-speed transmission, where the band becomes broader and the necessity for compensation of distortion becomes greater the higher the transmission rate. In other words, the conventional radio apparatus. shown in FIG. 73 is not applicable to high-speed transmission.

In a radio apparatus of the TDMA type adapted to solve this problem, it has been contemplated to have the apparatus accumulate data (modulated signal data) transmitted in its own allocated time slot and perform the operations for distortion compensation even in time slots other than its own time slot. With this method, however, the distortion compensation coefficients are updated every burst. This means that the distortion compensation coefficient of each level is updated once in one TDMA frame period at best. Consequently, it takes time for the distortion compensation coefficients to converge. In the meantime, distortion compensation cannot be performed accurately, the band widens, interference between adjacent channels occurs and satisfactory data communication cannot take place. It should be noted that the radio apparatus of FIG. 73 cannot be applied to high-speed data transmission but does update the distortion compensation coefficients in real time. If data of identical levels enter n times in one time slot, the distortion compensation coefficients can be updated n times and the distortion compensation coefficients converge to the optimum value in a short time.

Thus, there is demand for a radio apparatus with a distortion compensating function, which apparatus is applicable to high-speed data transmission and causes the distortion compensation coefficients to converge to the optimum value in a short time.

SUMMARY OF THE INVENTION

A first object of the present invention is to provide a radio apparatus in which offsets of an orthogonal modulator and an orthogonal detector are compensated for prior to distortion compensation processing, thereby making it possible to perform the distortion compensation processing accurately.

A second object of the present invention is to provide a radio apparatus in which a phase difference between a modulated signal and a demodulated signal is corrected prior to distortion compensation processing, thereby making it possible to perform the distortion compensation processing accurately.

A third object of the present invention is to provide a radio apparatus having a distortion compensating function, the apparatus being applicable to high-speed data transmission.

A fourth object of the present invention is to provide a radio apparatus in which distortion compensation coefficients are calculated and stored in memory in advance and the time required for the distortion compensation coefficients to converge is shortened by executing pre-distortion processing and distortion compensation coefficient updating processing using the distortion compensation coefficients, thereby suppressing broadening of the band and making possible excellent transmission of data.

A fifth object of the present invention is to provide a radio apparatus in which the time required for distortion compensation coefficients to converge is shortened by saving the latest distortion compensation coefficients and executing pre-distortion processing and distortion compensation coefficient updating processing based upon the saved distortion compensation coefficients the next time a transmission is made.

In accordance with the present invention, the first object is attained by providing a radio apparatus for subjecting a modulating signal to pre-distortion processing using distortion compensation coefficients which correct distortion of a transmission power amplifier, orthogonally modulating a reference carrier wave in an orthogonal modulator by the modulating signal that has been subjected to the pre-distortion processing, amplifying the orthogonally modulated carrier wave by the transmission power amplifier and transmitting the amplified carrier wave, comparing the modulating signal with a demodulated signal, which is obtained by branching and demodulating the transmitted carrier wave by a detector, and updating the distortion compensation coefficients, the apparatus comprising means for measuring offset values of the modulator and detector, and offset compensation means for applying offset compensation processing to the modulating signal based upon the offset value of the modulator and offset compensation processing to the demodulated-signal based upon the offset value of the detector.

In accordance with the present invention, the second object is attained by providing a radio apparatus for subjecting a modulating signal to pre-distortion processing using distortion compensation coefficients which correct distortion of a transmission power amplifier, amplifying, by the transmission:power amplifier, a carrier wave obtained by modulating a reference carrier by the modulating signal that has been subjected to the pre-distortion processing, transmitting the amplified carrier wave, comparing the modulating signal with a demodulated signal, which is obtained by branching and demodulating the transmitted carrier, and updating the distortion compensation coefficients, the apparatus comprising phase-difference measuring means for measuring a phase difference between a demodulated signal, which prevails when the phase and amplitude of the modulating signal are fixed at constant values, and the modulating signal, and phase-difference correcting means for executing phase-difference correction processing in such a manner that the phase difference becomes zero. According to the present invention, the third through fifth objects are attained by providing a radio apparatus comprising non-volatile memory means or memory means, backed up by a battery, in which distortion compensation coefficients for compensating for a distortion characteristic of an amplifier are stored in advance, and an arithmetic/control unit for applying. pre-distortion processing to a modulating signal using the distortion compensation coefficients that have been stored in the memory means and updating the distortion compensation coefficients using a demodulated signal obtained by branching and demodulating a transmitted carrier wave, wherein the content of the memory means is rewritten by the latest distortion compensation coefficients at end of communication.

Other features and advantages of the present invention will be apparent from the following description taken in conjunction with the accompanying drawings.

BRIEF DESCRIPTION OF THE DRAWINGS

FIG. 8 is a diagram showing the construction of a first embodiment of a radio apparatus having an offset compensating function;

FIGS. 51A, 51B and 51C are diagrams for describing distortion compensation coefficients;

FIG. 53 is a diagram for describing distortion compensation coefficients in the ninth embodiment;

FIG. 64 shows the content of a correction table;

DESCRIPTION OF THE PREFERRED EMBODIMENTS (A) Overview of the Invention (a) Offset Compensating Function FIG. 1 is a diagram for describing an overview of a radio apparatus, according to the present invention, having an offset compensating function. Shown in FIG. 1 are a CODEC 111 for converting an analog signal to a digital signal, a TDMA unit 112 for subjecting the entered data to burst processing at the timing of an allocated time slot, and an arithmetic/control unit 113 constituted by a DSP, by way of example. The arithmetic/control unit 113 (1) applies pre-distortion processing to a modulating signal (the input data) using distortion compensation coefficients h(Pi) conforming to the levels of the input data, converts the processed modulating signal to I and Q signals and outputs the signals, (2) compares the modulating signal with a demodulated signal obtained by demodulation performed by an orthogonal detector and updates the distortion compensation coefficients h(Pi) so as to null the difference between the compared signals, and (3) executes processing to compensate for an offset.

Figure 1:
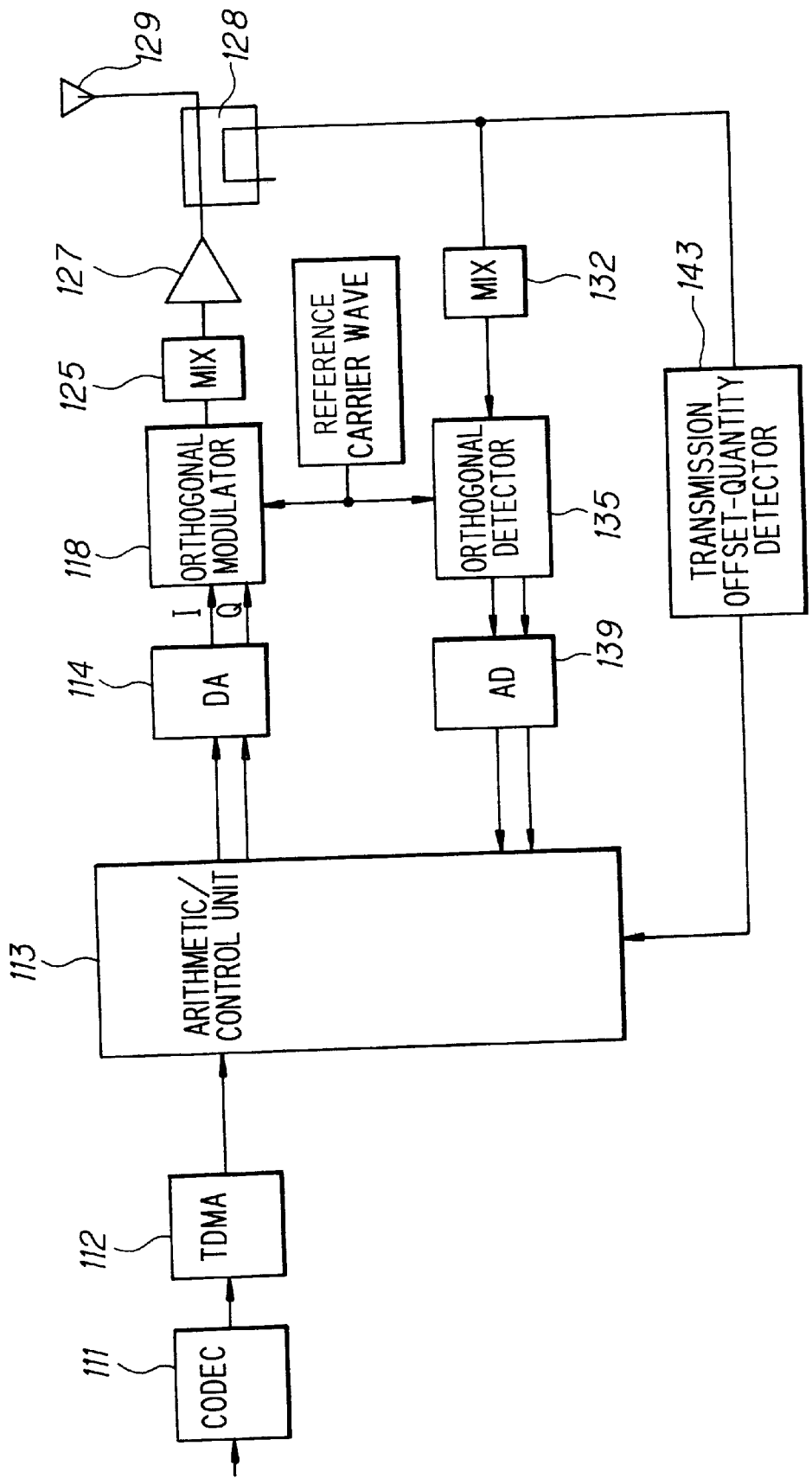
FIG. 1 is a diagram for describing an overview of a radio apparatus, according to the present invention, having an offset compensating function.

A DA converter 114 converts the I and Q signals, which have been subjected to distortion compensation processing and offset compensation processing, to analog baseband signals. An orthogonal modulator 118 multiplies the input I and Q signals by a reference carrier wave and a signal phase-shifted from the reference carrier by 90°, respectively, adds the two products, thereby performing an orthogonal conversion, and outputs the result. A frequency converter (transmission mixer) 125 mixes the orthogonally modulated signal and a local oscillation signal to perform an up-conversion, and a transmission power amplifier 127 amplifies the power of the carrier-wave signal outputted by the frequency converter 125 and broadcasts the amplified signal into space from an antenna 129. A hybrid circuit (a directional coupler) 128 extracts part of the transmission signal. A frequency converter (reception mixer) 132 mixes the carrier wave and the local oscillation signal to perform a down-conversion. An orthogonal detector 135 multiplies the input signal by the reference carrier wave and by the signal phase-shifted from the reference carrier by 90°, thereby performing orthogonal detection and reproducing the baseband I, Q signals from the transmitting side, and enters these signals into an AD converter 139. The latter converts the input I and Q signals that have entered from the orthogonal detector to digital signals. A transmission offset-quantity detector 143 detects the offset value of the orthogonal modulator.

Figure 2:
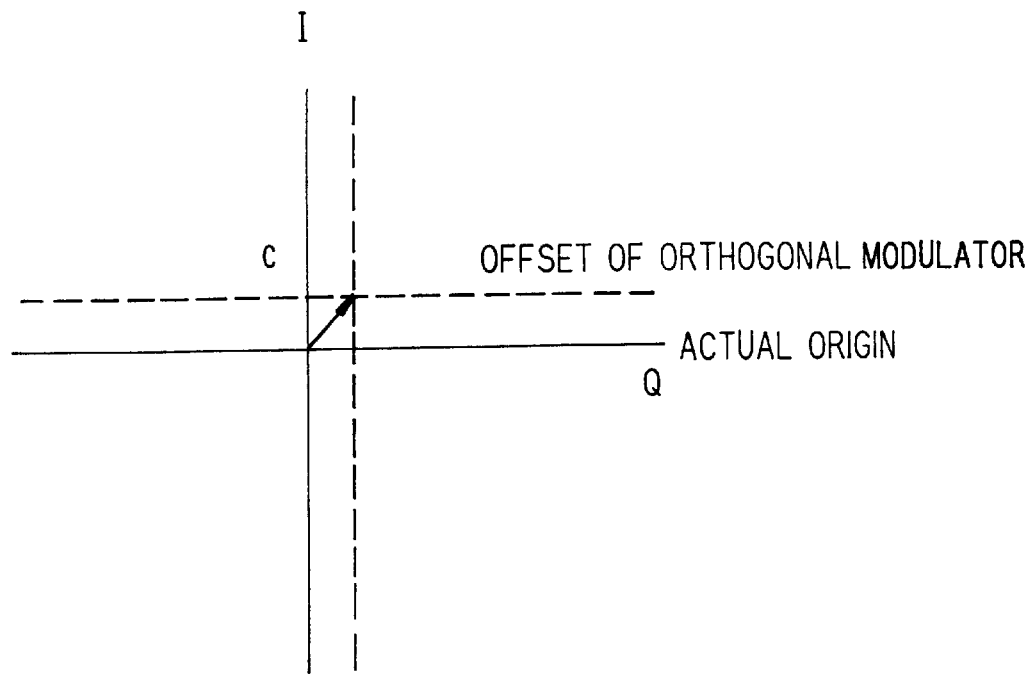
FIG. 2 is an explanatory view showing an output on a complex plane when modulation is not performed.

FIG. 2 shows the output of the orthogonal modulator 118 on a complex plane when modulation is not performed. When modulation is not being carried out, there should be no output from the modulator. However, if the orthogonal modulator 118 has an offset, a carrier proportional to the amount of offset appears as leakage, as indicated at c in FIG. 2. The leakage carrier is detected by the transmission offset-quantity detector 143 and the arithmetic/control unit 113 and regulates the offset on the transmitting side by finely adjusting the levels of the I and Q signals, which will enter the orthogonal modulator 118, in such a manner that the value of the leakage carrier is made zero.

The foregoing operation is transmission offset compensation.

Figure 3:
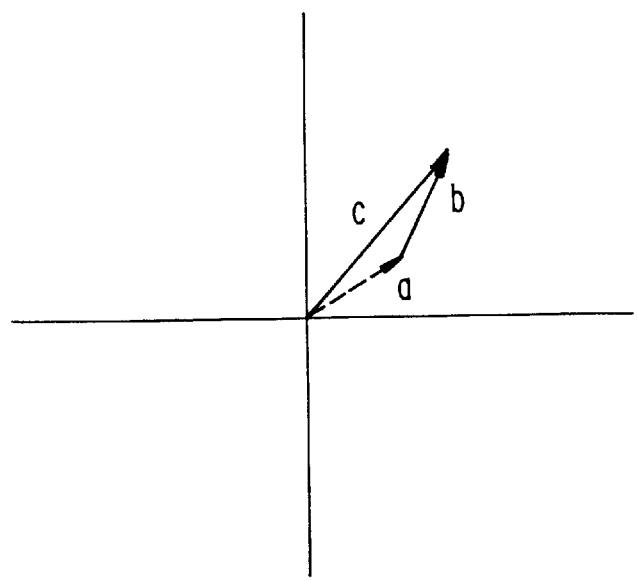
FIG. 3 is a diagram for describing offsets of an orthogonal detector and orthogonal modulator.
Figure 4:
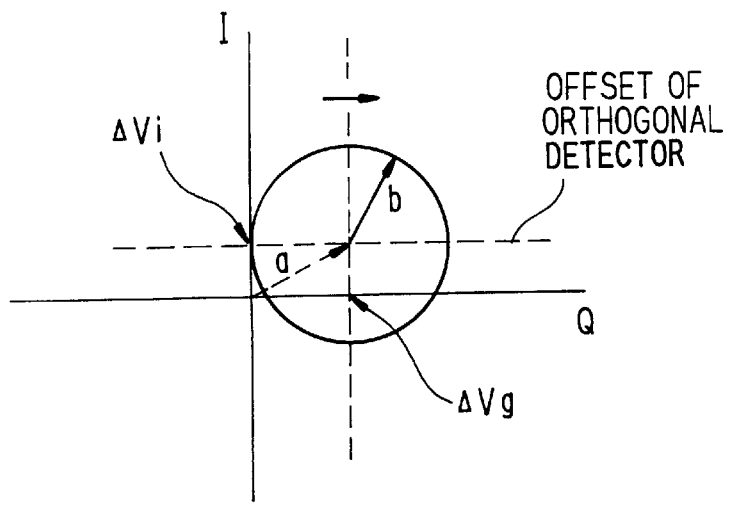
FIG. 4 is an explanatory view showing phase rotation of a baseband output in an orthogonal detector.

In a case where the inputs to the orthogonal modulator 118 are non-modulating, the baseband signals detected by the orthogonal detector 135 areas illustrated in FIG. 3 when they are expressed on a complex plane. Specifically, an offset component b of the orthogonal modulator 118 and an offset component a of the orthogonal detector 135 are superposed and an apparent offset c appears. This offset is measured as follows: When the phase of the reference carrier wave that enters the orthogonal modulator 118 is shifted 0~360°, the phase of the carrier is rotated by the offset b on the transmitting side. Consequently, of the baseband signal detected by the orthogonal detector 135, the offset component b of the orthogonal modulator 118 rotates as shown in FIG. 4.

If the detected output can thus be rotated from 0 to 360° in the I-Q plane, then the maximum values Vimax, Vqmax and minimum values Vimin, Vqmin of the currently prevailing I, Q signals, respectively, can be measured and the offsets $\Delta Vi$, $\Delta Vg$ can be obtained in accordance with the following equations using the maximum values Vimax, Vqmax and minimum values Vimin, Vqmin:

$$\Delta Vi = (Vimax + Vimin)/2 \quad (1)$$

$$\Delta Vq = (Vqmax + Vqmin)/2 \quad (2)$$

Figure 5:
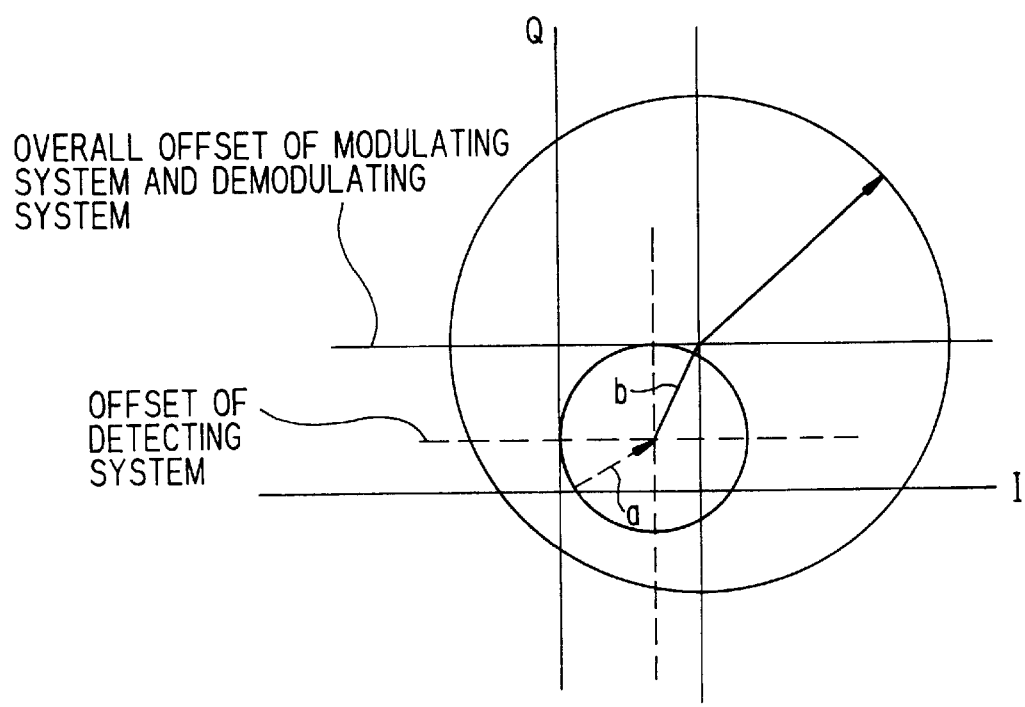
FIG. 5 is an diagram for describing overall offset of modulation and detection systems.

If these equations are evaluated, then the offset a of the orthogonal detector 135 indicated by the broken line in FIG. 4 can be identified. Next, with the amount of phase shift of the reference carrier wave kept at zero, the I and Q signals are applied to the orthogonal modulator 118 by the arithmetic/control unit 113 and it is so arranged that the I and Q signals of a unit circle (the large circle in FIG. 5) are detected and outputted by the orthogonal detector 135, as illustrated in FIG. 5. In other words, the arithmetic/control unit 113 controls the I and Q signals and applies them to the orthogonal modulator 118 in such a manner that the detected output will describe a unit circle based upon the I and Q components. If this expedient is adopted, the overall offset a of the modulation and detection systems can be obtained in accordance with Equations (1) and (2) If the already obtained offset a of the detector is subtracted from the overall offset c in complex fashion, the offset (transmission offset) b of the orthogonal modulator 118 will be obtained.

Accordingly, the arithmetic/control unit 113 exercises control in accordance with the above-described principle to obtain the reception offset a first, obtain the overall offset c next and then determine the transmission offset b by subtracting the reception offset a from the overall offset c. Offset compensation processing is executed based upon the transmission offset b to thereby adjust the levels of the I and Q signals transmitted. In addition, the levels of the modulating I and Q signals are finely adjusted based upon the reception offset a.

The foregoing is a description of compensation of reception offset and transmission offset.

Thus, since offset compensation is carried out prior to pre-distortion processing, it is possible to execute accurate distortion compensation processing.

Further, a non-volatile memory or a memory backed up by a battery is provided to store the offsets of the orthogonal modulator 118 and orthogonal detector 135 or offset compensation coefficients which compensate for these offsets, and the latest offsets or latest offset compensation coefficients are stored in the memory means at the end of communication. At the time of communication, the arithmetic/control unit 113 starts offset compensation processing adopting the offsets or offset compensation coefficients, which have been stored in the memory, as the initial values. If this arrangement is adopted, offset processing can be made to converge in a short time, so that pre-distortion processing and processing for updating distortion compensation coefficients can be started sooner.

Figure 6:
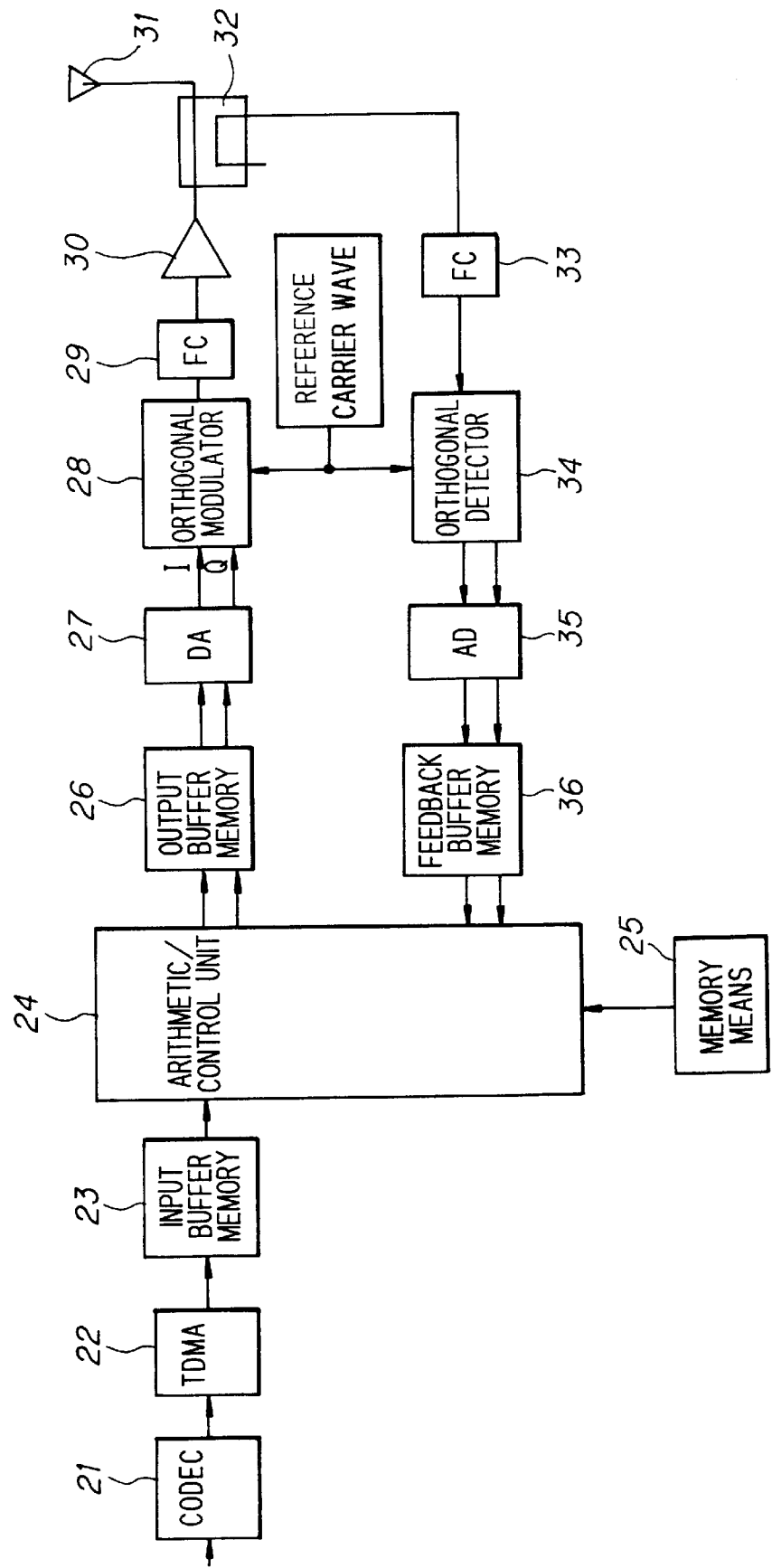
FIG. 6 is a block diagram of a radio apparatus having a distortion compensation processing function capable of accommodating high-speed data.

(b) Distortion Compensation Processing Function for Dealing With High-speed Data FIG. 6 is a block diagram of a radio apparatus having a distortion compensation processing function capable of accommodating high-speed data. Shown in FIG. 6 are a CODEC 21 for converting an analog signal to a digital signal, a TDMA unit 22 for subjecting the entered or input data to burst processing at a predetermined timing preceding an allocated time slot and outputting the burst data, an input buffer memory 23 for storing the burst data, and an arithmetic/control unit 24 constituted by a DSP, by way of example. The arithmetic/control unit 24 (1) applies pre-distortion processing to a modulating signal (the input data) using distortion compensation coefficients h(Pi) conforming to the levels of the input data, converts the processed modulating signal to I and Q signals and outputs the signals, and (2) compares the modulating signal with a demodulated signal obtained by demodulation performed by an orthogonal detector and updates the distortion compensation coefficients h(Pi) so as to null the difference between the compared signals.

Non-volatile memory or memory 25 backed up by a battery is for storing, in advance, the distortion compensation coefficients which compensate for the distortion characteristic of a transmission power amplifier, etc. An output buffer memory 26 stores the I and Q signals that have been subjected to distortion compensation processing. A DA converter 27 converts the I and Q signals, which have been stored in the output buffer memory 26, to analog baseband signals. An orthogonal modulator 28 multiplies the input I and Q signals by a reference carrier wave and a signal phase-shifted from the reference carrier by 90°, respectively, adds the two products, thereby performing an orthogonal conversion, and outputs the result. A frequency converter 29 mixes the orthogonally modulated signal and a local oscillation signal to perform an up-conversion, and a transmission power amplifier 30 amplifies the power of the carrier-wave signal outputted by the frequency converter 29 and broadcasts the amplified signal into space from an antenna 31. A hybrid circuit (a directional coupler) 32 extracts part of the transmitted signal. A frequency converter 33 mixes the carrier wave and the local oscillation signal to perform a down-conversion. An orthogonal detector 34 multiplies the input signal by the reference carrier wave and by the signal phase-shifted from the reference carrier by 90°, performs orthogonal detection, reproduces the baseband I and Q signals from the transmitting side, and enters these signals into an AD converter 35. The latter converts the input I and Q signals that have entered from the orthogonal detector to digital signals. A feedback buffer memory 36 stores the orthogonally detected demodulated data (feedback data).

The antenna 31 is removed beforehand, the output of the power transmission amplifier 30 is terminated by a dummy load having an input impedance the same as that of the antenna and random transmission data are entered into the arithmetic/control unit 24. The latter subjects these data (the modulating signal) to pre-distortion processing, outputs the processed data, compares these data with data (the modulated signal) obtained by feeding back and detecting the carrier wave and calculates and updates the distortion compensation coefficients. The above-described pre-distortion processing and processing for updating the distortion compensation coefficients is repeated and the distortion compensation coefficients that have converged are stored in the memory 25.

When the apparatus is actually put into service, the arithmetic/control unit 24 applies pre-distortion processing to the transmission data (the modulating signal) using the distortion compensation coefficients stored in the memory 25, calculates and updates distortion compensation coefficients using the transmitted modulated signal and the demodulated signal obtained by demodulating the carrier wave, rewrites the content of the memory 25 using the latest distortion compensation coefficients at the end of communication, and executes pre-distortion processing using the distortion compensation coefficients, which have been stored in the memory 25, the next time communication is carried out.

Thus, non-linear distortion of the transmission power amplifier is suppressed in advance and distortion compensation coefficients for preventing leakage between adjacent channels are obtained and stored in the memory beforehand. At the time of actual operation, the distortion compensation coefficients are updated for the first time based upon these stored distortion compensation coefficients. As a result, the distortion compensation coefficients converge to optimum values in a short period of time, so that correct pre-distortion processing conforming to the conditions prevailing during actual operation can be executed. This makes it possible to suppress spreading of the band and to reduce power leakage between adjacent channels. Further, at the end of communication, the latest distortion compensation coefficients are saved in the memory and are used the next time communication is performed. As a result, the distortion compensation coefficients can be made to converge to optimum values in a short time when the apparatus is working.

(c) Phase-difference Correction Function

Figure 7A:
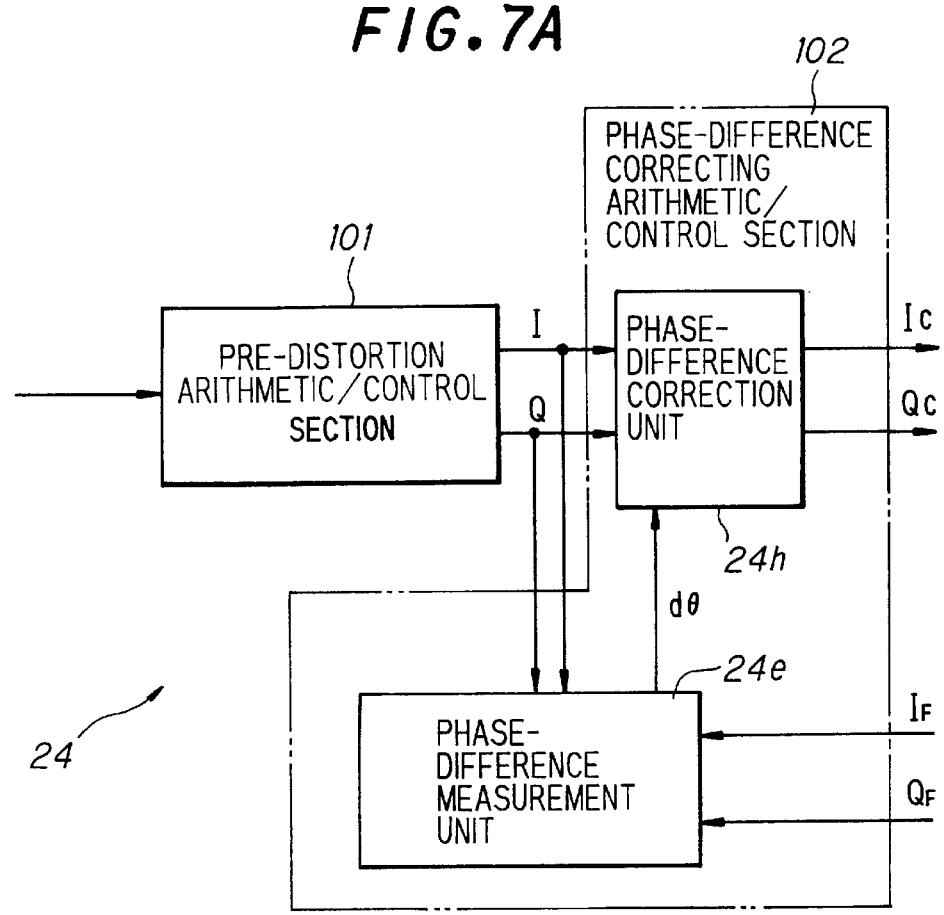
FIGS. 7A, 7B are block diagrams showing an arithmetic/control unit of a radio apparatus having a phase-difference correction function.
Figure 7B:
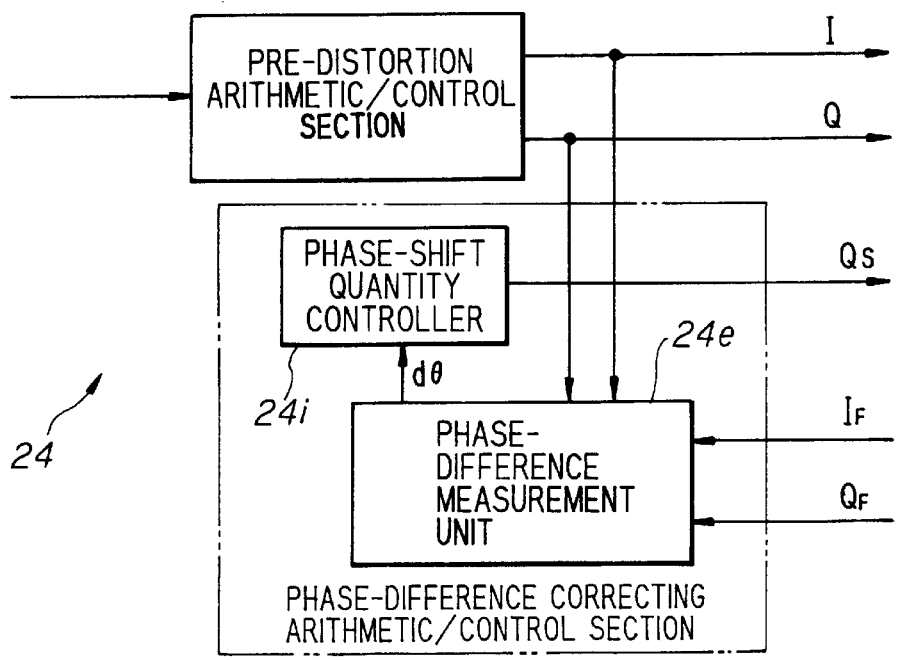

FIGS. 7A and 7B are block diagrams showing the arithmetic/control unit 24 of a radio apparatus having a phase-difference correction-function. Numeral 101 denotes a pre-distortion arithmetic/control section, and numeral 102 denotes a phase-difference correcting arithmetic/control section. The pre-distortion arithmetic/control section 101: (1) applies pre-distortion processing to the modulating signal using distortion compensation coefficients h(Pi) conforming to the levels of the modulating signal, converts the processed modulating signal to I and Q signals and outputs the signals; and (2) compares the modulating signal with the demodulated signal obtained by demodulation performed by an orthogonal detector and updates the distortion compensation coefficients h(Pi) so as to null the difference between the compared signals. The phase-difference correcting arithmetic/control section 102 measures the phase difference between the modulating signals (transmission baseband signals) and the demodulated signals (feedback baseband signals) and executes phase-difference correction processing so as to make the phase difference zero. The phase-difference correcting arithmetic/control section 102 includes a phase-difference measurement unit 24e for measuring the phase difference between the modulating signals and demodulated signals, a phase-difference correction unit 24h for applying phase-difference correction processing to the modulating signal so as to zero the phase difference, and a phase-shift quantity controller 24i for zeroing the phase difference by shifting the phase of the reference carrier wave of the orthogonal modulator or orthogonal detector.

In FIG. 7A, the phase-difference measurement unit 24e of the phase-difference correcting arithmetic/control section 102 measures a phase difference dθ between the modulating signals and demodulating signals before pre-distortion processing is executed, and the phase-difference correction unit 24h applies phase-difference correction processing to the modulating signals in such a manner that the phase difference becomes zero. More specifically, the phase-difference correction unit 24h obtains a phase-difference correction coefficient conforming to the phase difference dθ from a memory (not shown) and subjects the modulating signals to phase-difference correction processing using this phase-difference correction coefficient so as to zero the phase difference dθ. As a result, accurate distortion compensation processing can be performed upon eliminating the phase shift between the modulating and demodulated signals. Moreover, the phase difference can be eliminated irrespective of circuit mounting position and frequency. Further, the measured phase difference or the phase-difference correction coefficient conforming to the phase difference is stored in non-volatile memory (not shown) or in memory backed up by a battery, and the phase-difference correction unit 24h executes phase-difference correction processing using the phase-difference correction coefficient conforming to the stored phase difference. If this arrangement is adopted, distortion compensation processing can be started immediately and phase difference corrected without measuring the phase difference.

Further, the correspondence between phase angle and phase-difference correction coefficient is stored in memory for each amplitude of the modulating signals, the phase-difference measurement unit 24e measures the phase difference dθ for every amplitude level of the modulating signals, and the phase-difference correction unit 24h applies phase-difference correction processing to the modulating signals using the phase-difference correction coefficient that corresponds to the phase difference dθ conforming to the amplitude of the entered modulating signal. If this arrangement is adopted, processing for more accurate correction of phase difference is made possible.

In FIG. 7B, the phase-difference measurement unit 24e of the phase-difference correcting arithmetic/control section 102 measures the phase difference dθ between the modulating signals and demodulated signals before pre-distortion processing is executed, and the phase-shift quantity controller 24i shifts the phase of the reference carrier wave to be added to the orthogonal modulator 28 (see FIG. 6) or orthogonal detector 34 in such a manner that the phase difference dθ becomes zero. As a result, accurate distortion compensation processing can be performed upon eliminating the phase shift between the modulating and demodulated signals. Moreover, the phase difference can be eliminated irrespective of circuit mounting position and frequency. Further, the amount of shift that will make the phase difference zero is stored in non-volatile memory (not shown) or in memory backed up by a battery. The next time communication is performed, the phase-shift quantity controller 24i shifts the phase of the carrier wave, which is to be added to the orthogonal modulator or orthogonal detector, using the amount of shift that has been stored. If this arrangement is adopted, distortion compensation processing can be started immediately and phase difference corrected without measuring the phase difference.

(B) Embodiment of Offset Compensation
(a) First Embodiment

FIG. 8 is a diagram showing the construction of a first embodiment of a radio apparatus having an offset compensating function. This embodiment reduces the offset of the orthogonal modulator.

In FIG. 8, a group of digital data sent from the audio CODEC 111 is applied to the TDMA unit 112, where the data group is subjected to burst processing before being sent to the arithmetic/control unit 113. The latter separates the input data into the I and Q signals, which are converted to analog baseband signals via DA converters 114, 115, respectively. The analog baseband signals are amplified by amplifiers (AMP) 116, 117, respectively, before being entered into the orthogonal modulator 118.

The orthogonal modulator 118 has multipliers 119, 120 for respectively multiplying the inputs from the AMPs 116 and 117 by the reference carrier wave and a signal which is the result of shifting the phase of the carrier 90° by a phase shifter 121, and adds the two products, thereby to perform orthogonal modulation. The reference carrier wave is supplied from a first PLL frequency synthesizer (hereinafter referred to simply as a "PLL") 122 via a hybrid circuit 123. The modulated output of the orthogonal modulator 118 is amplified by an amplifier (AMP) 124 and the amplified signal is applied to the transmission mixer (frequency converter) 125. The latter performs an up-conversion by the local oscillation signal from a second PLL frequency synthesizer (hereinafter referred to simply as a "PLL") 126. The output of the PLL 126 is amplified to a prescribed power by the transmission power amplifier 127 and the amplified signal is coupled to the antenna 129 via the directional coupler 128. The amplified signal is transmitted from the antenna 129.

The transmitted signal, which has been branched off via the directional coupler 128, enters an amplifier (AMP) 131 via a hybrid 130. Upon being amplified by the amplifier 131, the signal is down-converted in the reception mixer 132 by the local oscillation signal from the second PLL 126 and the resulting signal is amplified by an amplifier (AMP) 133 and bandwidth-limited by a band-pass filter (BPF) 134 before entering the orthogonal detector 135.

The orthogonal detector 135 has multipliers 136, 137 for multiplying the input from the BPF 134 by the reference carrier wave from the first PLL 122 and the signal which is the result of shifting the phase of the carrier 90° by a phase shifter 138, thereby performing orthogonal detection and reproducing the baseband signals from the transmitting side. The baseband signals are converted to digital signals by AD converters 139, 140, and the digital signals enter the arithmetic/control unit 113.

The arithmetic/control unit 113 compares the amplitude of the feedback baseband signal (the demodulated signal) and the amplitude of the transmission baseband signal (the modulating signal) and subjects the transmission baseband signal to pre-distortion processing until the two compared signals become the same. The end result is that it is possible to compensate for distortion caused by non-linearity of the orthogonal modulator 118 and power amplifier 127.

The radio apparatus having the offset compensating function of the present invention performs a transmitting operation in the unloaded state and compensates for offset of the orthogonal modulator 118 before the above-described distortion compensating processing is executed. More specifically, leakage of the carrier which is the result of the offset of orthogonal modulator 118 is extracted via the hybrid circuit 130 and bandpass-limited via a band-pass filter 141, after which the signal is amplified by the amplifier 142, detected by the detector 143 and converted to a DC signal that is proportional to the offset of the orthogonal modulator 118. The DC signal is converted to a digital signal by an analog-digital converter 144 and the digital signal enters a controller (CPU) 145.

When the offset voltage enters, the CPU 145 generates two types of control signals C1 and C2. DA converters 146 and 147 convert the analog signals C1 and C2, respectively, to analog signals and apply the analog signals to the amplifiers 116 and 117, respectively, to adjust the operating reference point (offset). As a result, the I and Q input levels of the orthogonal modulator 118 are finely adjusted to minimize the value of the leakage carrier of the orthogonal modulator 118. It should be noted that the PLL 126 has its local oscillation frequency switched over by the CPU 145 in dependence upon the channel in use.

Thus, in accordance with the first embodiment, distortion compensation from which the effects of offset of the orthogonal modulator 118 on the transmitting side are excluded can be realized by providing the device or means 130, 141~144 for detecting the energy of the offset carrier of orthogonal modulator 118 and for converting the energy to a DC component, and the control device or means 145 which functions to control the offset voltage of the orthogonal modulator 118 based upon the detection signal.

Figure 9:
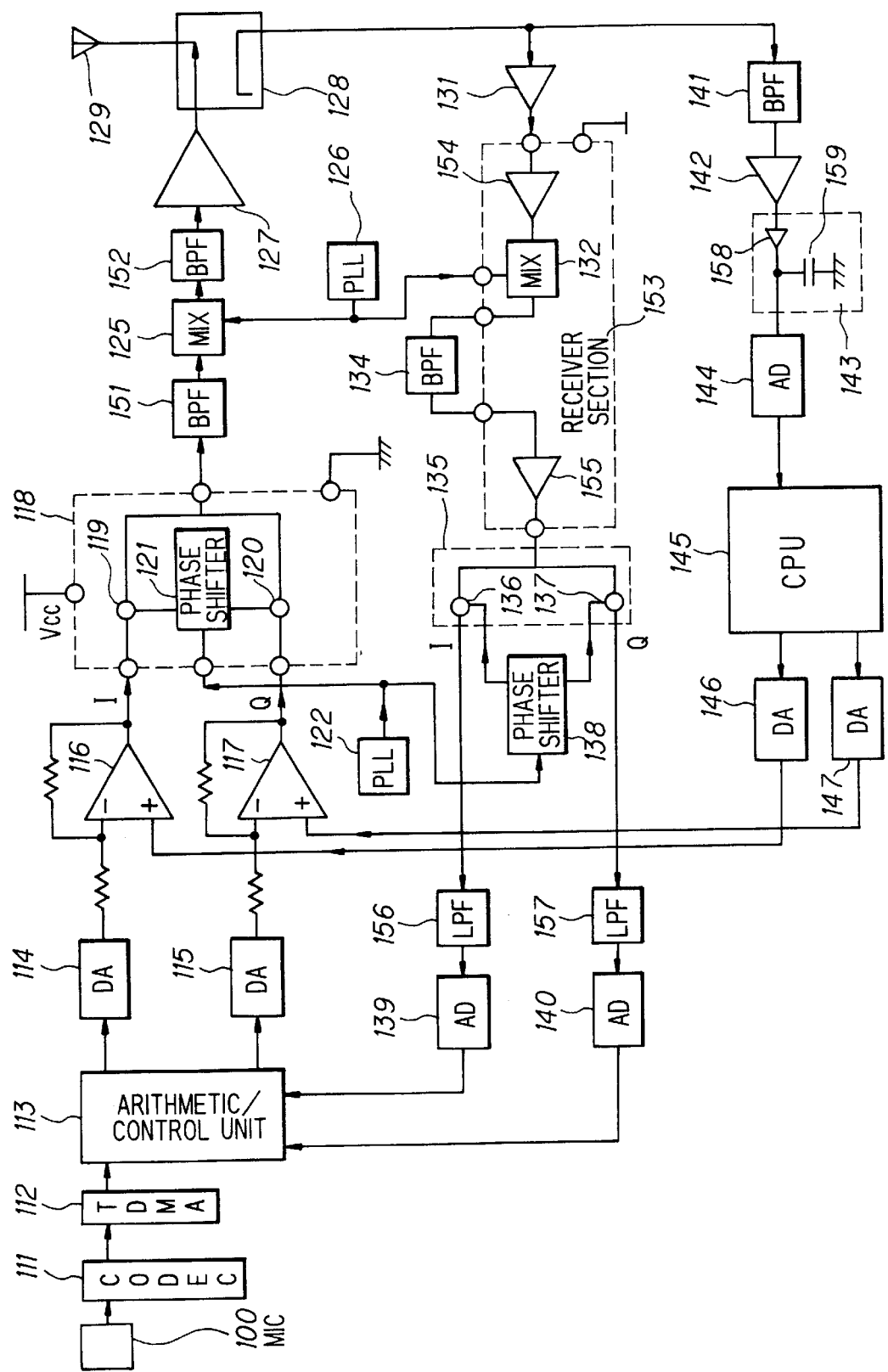
FIG. 9 is a diagram showing a concrete example of circuitry according to the first embodiment.

FIG. 9 is a diagram showing a concrete example of circuitry according to the first embodiment illustrated in FIG. 8. Elements identical with those shown in FIG. 8 are designated by like reference characters. In FIG. 9, numeral 100 denotes a microphone (MIC) to which an audio signal is applied. Numeral 118 denotes the IC constructing the orthogonal modulator, which comprises the multipliers 119 and 120 and the phase shifter 121, which shifts the reference carrier wave by $\pi/2$. Band-pass filters (BPF) 151 and 152 limit the bandwidth of the transmitted signal.

An IC 153 constructs a receiving section having amplifiers (AMP) 154 and 155 and the reception mixer 132. Numeral 135 denotes the IC constructing the orthogonal detector, which includes the multipliers 136 and 137. The phase shifter 138 which shifts the reference carrier wave by $\pi/2$ is attached externally. Low-pass filters (LPF) 156, 157 limit the bandwidth of the detection signals. A diode 158 and a smoothing capacitor 159 construct the detector 143 which detects the leakage carrier.

In FIG. 9, the arithmetic/control unit 113 is constituted by a digital signal processor (DSP) and functions to generate baseband waveforms and to execute pre-distortion processing. The amplifiers 116 and 117 comprise differential amplifiers. The DA converters 114 and 115 are respectively connected to the amplifiers 116 and 117 at one terminal thereof, and the DA converters 146 and 147 are respectively connected to the amplifiers 116 and 117 at the other terminal thereof. The amplifiers 116 and 117 apply offsets to their respective output levels using the output signals of the DA converters 146 and 147, respectively, thereby finely adjusting the I and Q input levels in the orthogonal modulator 118.

(b) Second Embodiment

Figure 10:
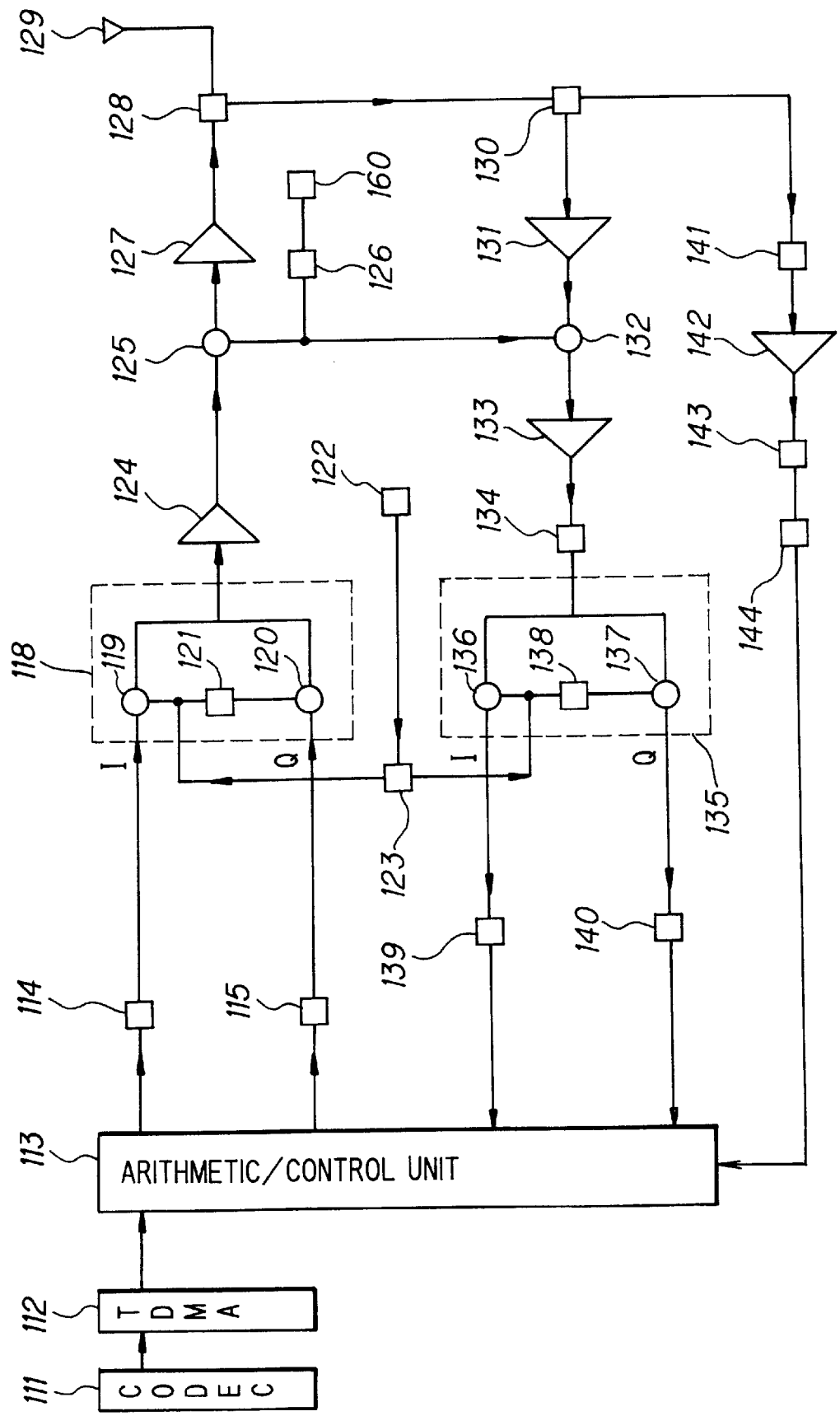
FIG. 10 is a diagram showing the construction of a second embodiment of a radio apparatus having an offset compensating function.

FIG. 10 is a diagram showing the construction of a second embodiment of a radio apparatus having an offset compensating function. This embodiment reduces the offset of the orthogonal modulator. Elements identical with those shown in FIG. 8 are designated by like reference characters.

Numeral 160 denotes a controller (CPU) which controls the PLL 126 to switch over the local oscillation frequency in dependence upon the channel used. In this embodiment, the arithmetic/control unit 113 is constituted by a DSP.

In FIG. 10, the leakage of carrier which is the result of the offset of orthogonal modulator 118 is extracted via the hybrid circuit 130 and bandwidth-limited via a band-pass filter 141, after which the signal is amplified by the amplifier 142, detected by the detector 143 and converted to a DC signal that is proportional to the offset of the orthogonal modulator 118. The DC signal is converted to a digital signal by an analog-digital converter 144 and the digital signal enters the arithmetic/control unit 113.

When the offset voltage enters, the arithmetic/control unit 113 finely adjusts the levels of the I and Q signals, which are the baseband signals, and the DA converters 114 and 115 convert the finely adjusted I and Q signals to analog signals. The latter enter the orthogonal modulator 118 so that the amount of leakage carrier from the orthogonal modulator 118 is minimized.

Thus, in accordance with the second embodiment, the arithmetic/control unit 113 which executes distortion compensating processing is made to implement an offset compensating function as well, thereby making it possible to realize distortion compensation from which the effects of offset of the orthogonal modulator 118 on the transmitting side are excluded. Moreover, since a controller (CPU) for eliminating offset is not required, the apparatus can be reduced in size and lowered in cost.

Figure 11:
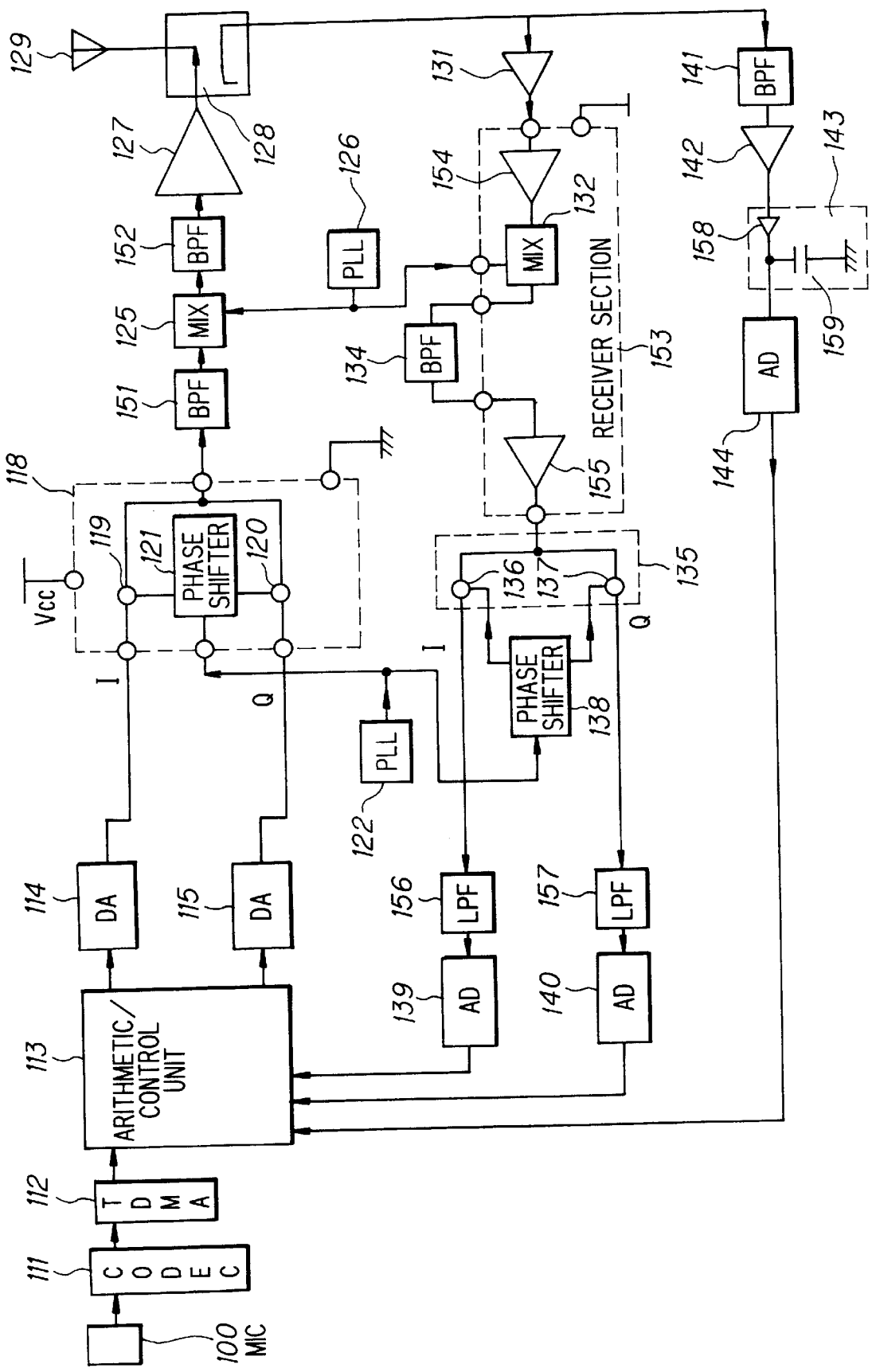
FIG. 11 is a diagram showing a concrete example of circuitry according to the second embodiment.

FIG. 11 is a diagram showing a concrete example of circuitry according to the second embodiment. Elements identical with those shown in FIGS. 9 and 10 are designated by like reference characters. In FIG. 11, the arithmetic/control unit 113 is constituted by a DSP, functions to generate baseband waveforms and to execute pre-distortion processing and also has a function which compensates for offset of the orthogonal modulator 118.

(c) Third Embodiment

Figure 12:
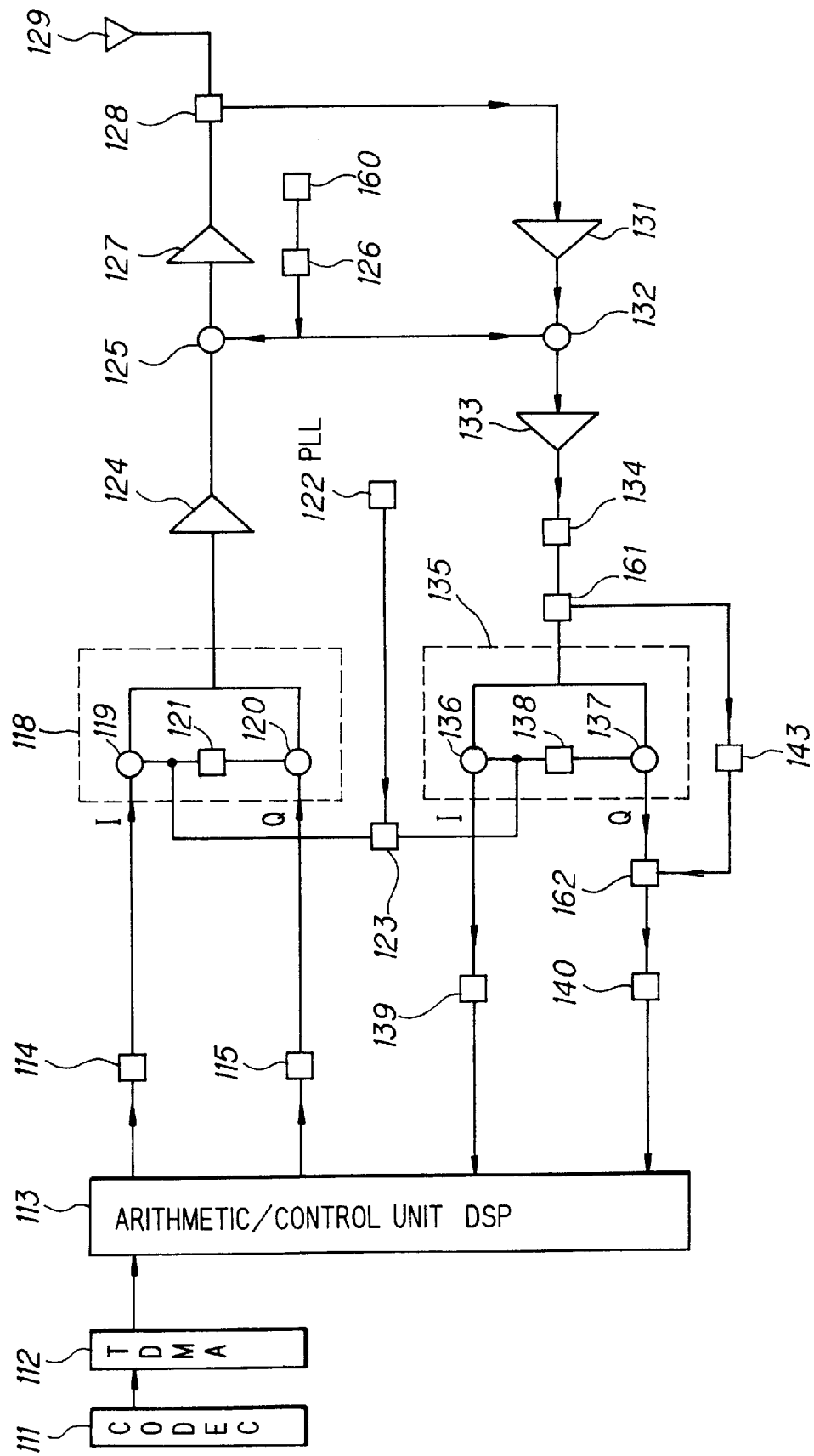
FIG. 12 is a diagram showing the construction of a third embodiment of a radio apparatus having an offset compensating function.

FIG. 12 is a diagram showing the construction of a third embodiment of a radio apparatus having an offset compensating function. This embodiment reduces the offset of the orthogonal modulator. Elements identical with those shown in FIG. 10 are designated by like reference characters. Numeral 161 denotes a hybrid and 162 a switch.

In the third embodiment of FIG. 12, means for detecting the energy of a leakage carrier that arises from offset of the orthogonal modulator 118 is used jointly as means for feeding back a transmitted signal for the purpose of distortion compensation.

The transmitted signal, which has been branched off via the directional coupler 128, is amplified by the amplifier 131, the amplified signal is down-converted in the reception mixer 132 by the local oscillation signal from the second PLL 126 and the resulting signal is amplified by the amplifier (AMP) 133 and bandwidth-limited by a band-pass filter (BPF) 134 before entering the orthogonal detector 135, where the baseband signals from the transmitting side are reproduced.

When the operation which compensates for the offset of the orthogonal modulator 118 is performed, the output of the BPF 134 is branched by the hybrid circuit 161 and detected by the detector 143 so as to be converted to a DC signal that conforms to the offset value of the orthogonal modulator 118. The switch 162 selects the offset value, which is the output of the detector 143, and the AD converter 140 converts the offset voltage to a digital signal and inputs the digital signal into the arithmetic/control unit 113. When the offset value enters or is input, the arithmetic/control unit 113 finely adjusts the levels of the I and Q signals, which are the transmission baseband signals, in dependence upon the offset value. The DA converters 114 and 115 convert the finely adjusted I and Q signal to analog signal and enters these signals into the orthogonal modulator 118, whereby the amount of leakage of carrier from the orthogonal modulator 118 is minimized.

Thus, in accordance with the third embodiment, distortion compensation from which the effects of offset of the orthogonal modulator 118 on the transmitting side are excluded can be realized by providing the device or means 161 for branching off, in front of the orthogonal detector 135, the energy component that is due to the leakage carrier caused by offset of the orthogonal modulator 118, and the means 162 for switching over the energy component and entering the component into the arithmetic/control unit 113. A controller (CPU) for eliminating offset is not required, and the means which detects the energy of the leakage carrier caused by the offset of the orthogonal modulator 118 is in part used jointly as means for feeding back an output for the purpose of distortion compensation. As a result, a further reduction in the size and cost of the apparatus is possible.

(d) Fourth Embodiment

Figure 13:
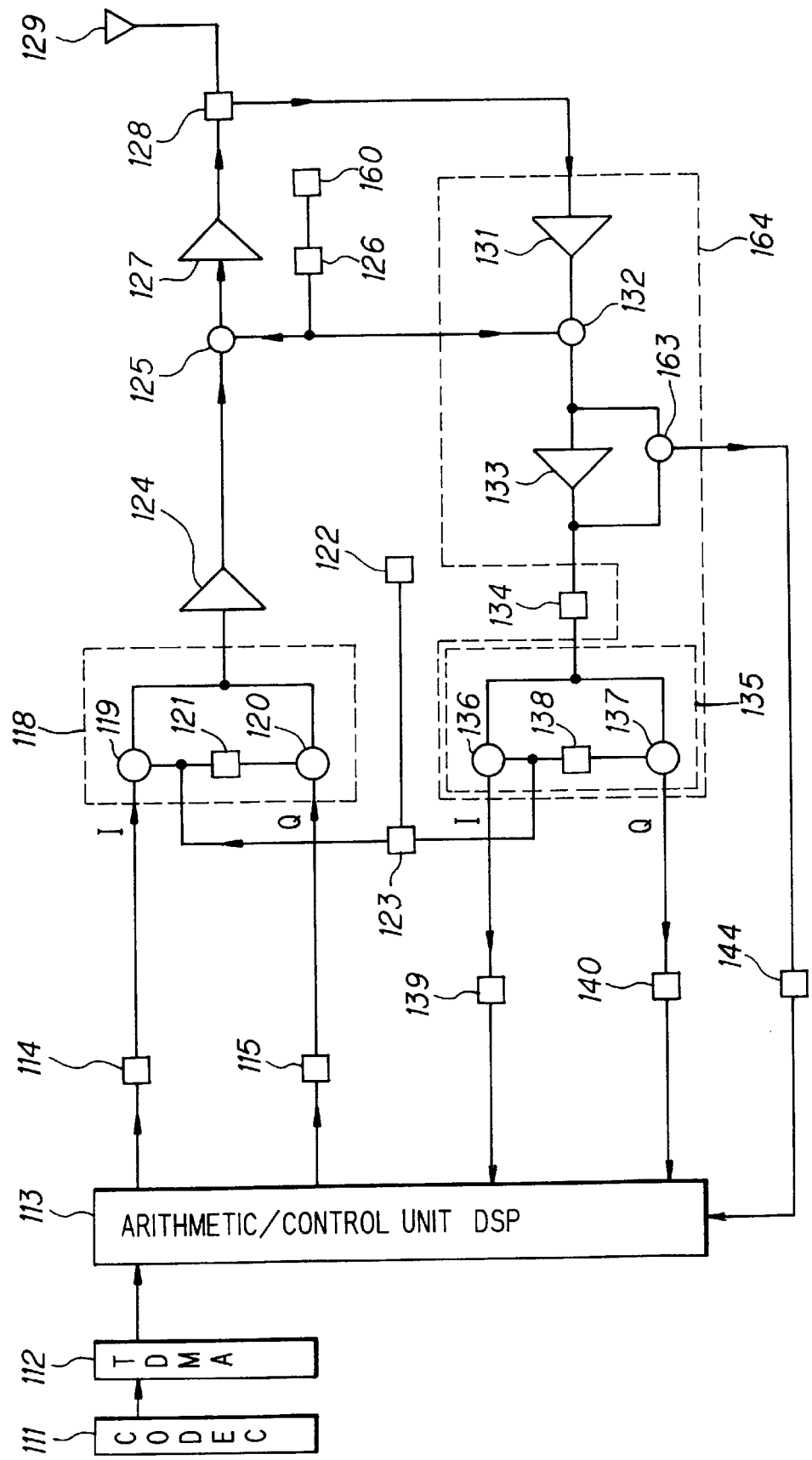
FIG. 13 is a diagram showing the construction of a fourth embodiment of a radio apparatus having an offset compensating function.

FIG. 13 is a diagram showing the construction of a fourth embodiment of a radio apparatus having an offset compensating function. This embodiment reduces the offset of the orthogonal modulator. Elements identical with those shown in FIG. 10 are designated by like reference characters. Numeral 163 denotes an RSSI (radio signal-strength indicator) and 164 a reception IC which includes an orthogonal detector.

In the fourth embodiment of FIG. 13, the output of the RSSI 163, which is provided in the feedback path that feeds back the transmitted signal in order to perform the distortion compensation, is utilized in detecting the energy of the leakage carrier caused by the offset of the orthogonal modulator 118.

The transmitted signal branched off by the directional coupler 128 is amplified by the amplifier 131, the amplified signal is down-converted in the reception mixer 132 by the local oscillation signal from the second PLL 126 and the resulting signal is amplified by the amplifier (AMP) 133 and bandwidth-limited by the band-pass filter (BPF) 134 before entering the orthogonal detector 135, where the baseband signals from the transmitting side are fed back and detected. The resulting signals enter the arithmetic/control unit 113.

When the operation which compensates for the offset of the orthogonal modulator 118 is performed, the RSSI 163 detects the signal strength and enters the signal strength into the AD converter 144 as the offset value of the orthogonal modulator 118. The AD converter 144 converts the input signal (offset voltage) to a digital signal and enters the digital signal into the arithmetic/control unit 113. When the offset value enters, the arithmetic/control unit 113 finely adjusts the levels of the I and Q signals, which are the transmission baseband signals, based upon the offset value. The DA converters 114, 115 convert the finely adjusted I and Q signals to analog signal and enter these signals into the orthogonal modulator 118, whereby the amount of leakage carrier from the orthogonal modulator 118 is controlled so as to be minimized.

Thus, in accordance with the fourth embodiment, distortion compensation from which the effects of offset of the orthogonal modulator 118 on the transmitting side are excluded can be realized by providing the RSSI 163 and the AD converter 144, which converts the output of the RSSI to a digital signal. A controller (CPU) for eliminating offset is not required. In addition, since the RSSI output function possessed by the reception IC is utilized as means for detecting the energy of the leakage carrier caused by the offset of the orthogonal modulator 118, separate energy detecting means is unnecessary. As a result, a further reduction in the size and cost of the apparatus is possible.

Since the RSSI function enables accurate detection of energy and has a detection level exhibiting a wide dynamic range, compensation accuracy for eliminating the offset of the orthogonal modulator 118 can be improved.

Figure 14:
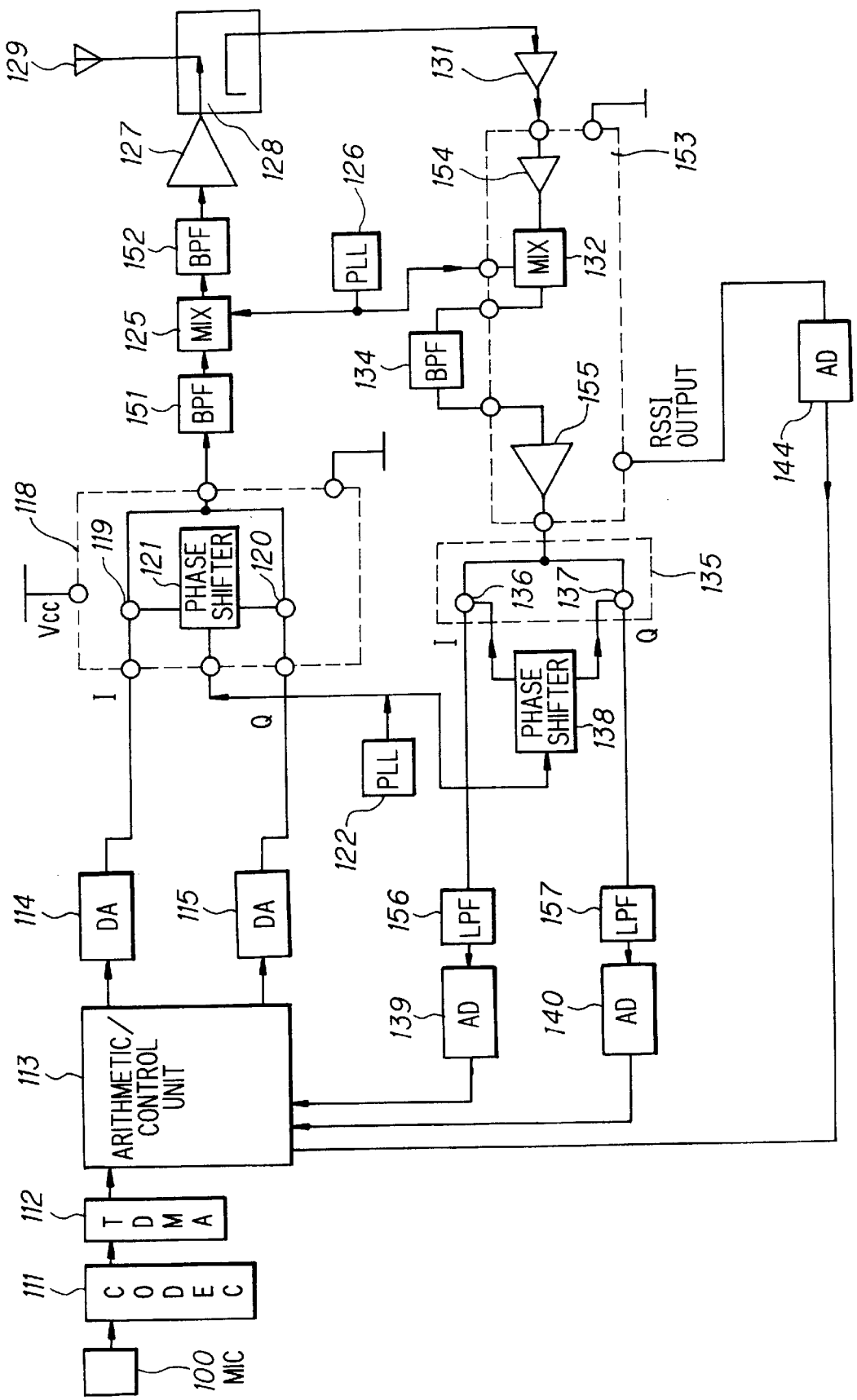
FIG. 14 is a diagram showing a concrete example of circuitry according to the fourth embodiment.

FIG. 14 is a diagram showing a concrete example of circuitry according to the fourth embodiment. Elements identical with those shown in FIGS. 9 and 13 are designated by like reference characters. In FIG. 14, the output of the RSSI possessed by the reception IC 153 is used to detect the energy of the leakage carrier that arises from the offset of the orthogonal modulator 118.

It should be noted that the offset adjustment in each of the foregoing embodiments may be performed at the time of the preamble to the transmission burst or at the time of the apparatus' own allocated time slot in case of time-division multiplexing.

(e) Fifth Embodiment

In an arrangement identical with that of the first embodiment of FIG. 8 and the second embodiment of FIG. 10, the BPF 141 used to extract the carrier component has its band narrowed to make possible the separation of the carrier component and modulated component based upon the offset.

In accordance with the fifth embodiment, a narrow-band filter is provided so that the offset of the orthogonal modulator 118 can be compensated for at all times, even during modulation. In the case of the first and second embodiments, the BPF 141 does not have a particularly narrow band and therefore is incapable of separating the carrier component and modulated component based upon the offset. This means that the offset of the orthogonal modulator 118 can be compensated for only when modulation is not being carried out.

(f) Sixth Embodiment

Figure 15:
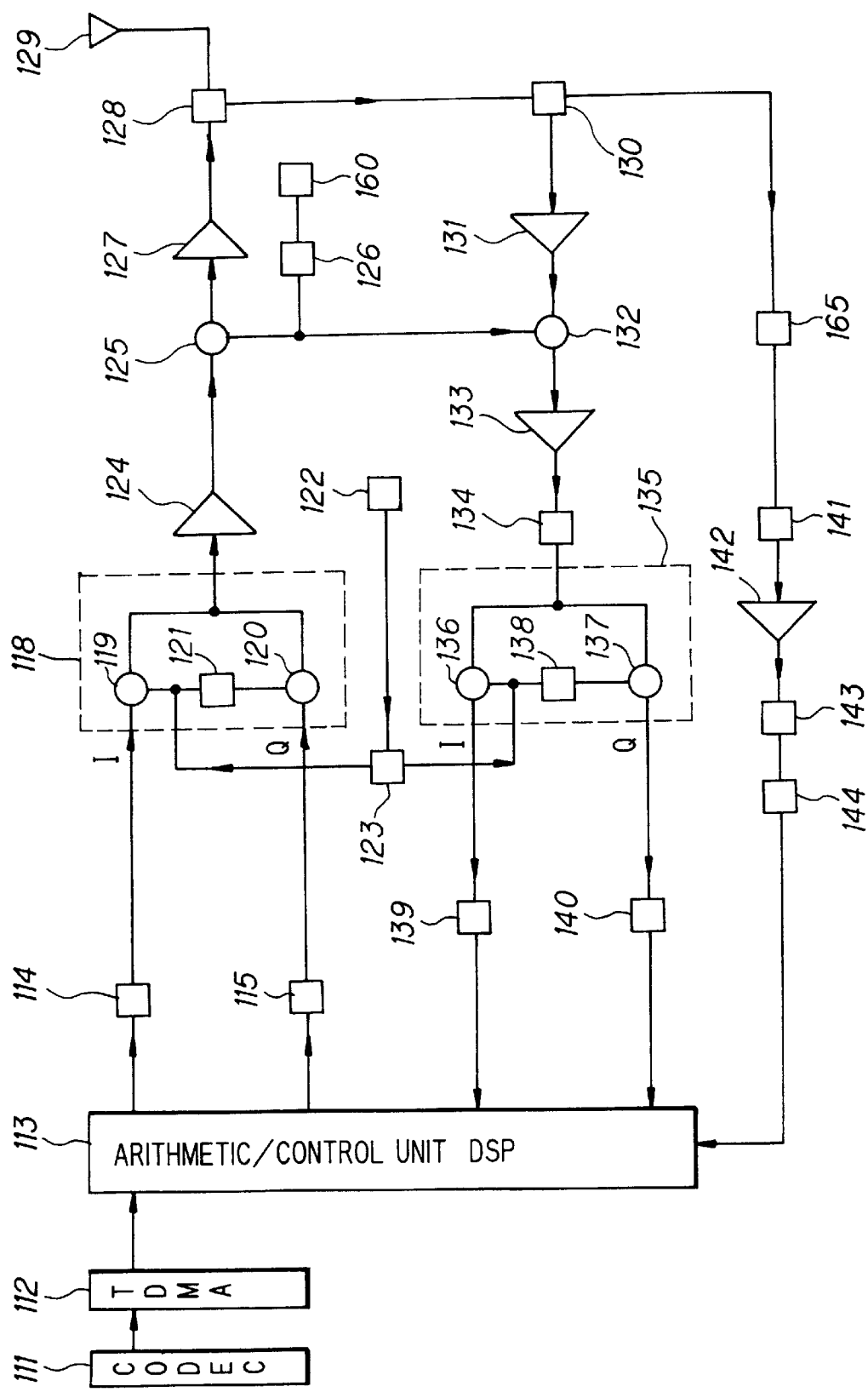
FIG. 15 is a diagram showing the construction of a sixth embodiment of a radio apparatus having an offset compensating function.

FIG. 15 is a diagram showing the construction of a sixth embodiment of a radio apparatus having an offset compensating function. This embodiment reduces the offset of the orthogonal modulator. Elements identical with those shown in FIG. 10 are designated by like reference characters. Numeral 165 denotes a frequency multiplier.

In FIG. 15, the leakage carrier due to offset of the orthogonal modulator 118 is extracted by the hybrid circuit 130 and the frequency thereof is multiplied eight-fold, for example, by a frequency multiplier 165. The BPF limits the bandwidth of the multiplier output, the bandwidth-limited signal is amplified by the amplifier 142 and the amplified signal enters the detector 143. The latter detects the input signal and converts it to a DC signal conforming to the offset voltage of the orthogonal modulator 118, and the DC signal is converted to a digital signal by the AD converter 144. The digital signal enters the arithmetic/control unit 113. When the signal enters, the arithmetic/control unit 113 finely adjusts the I and Q input levels of the orthogonal modulator 118 based upon the offset value and minimizes the amount of leakage carrier.

Figure 16:
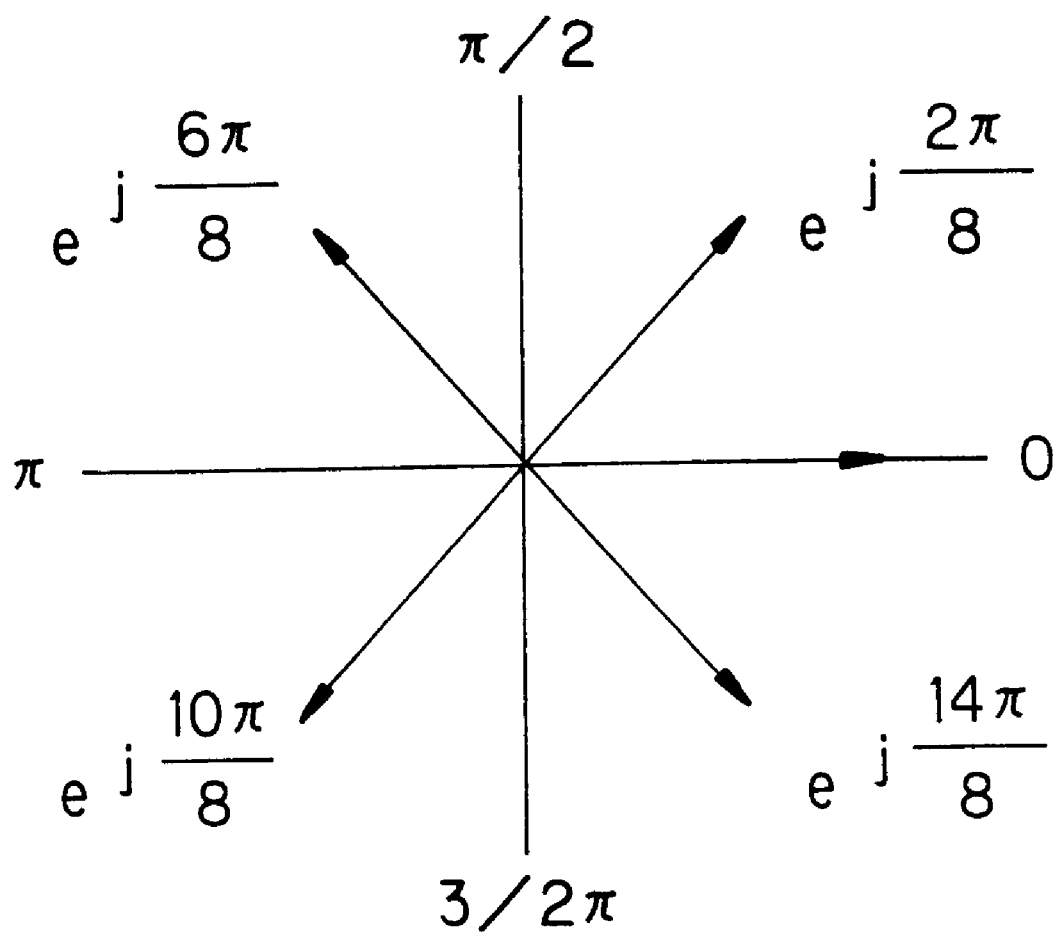
FIG. 16 is a diagram for describing degeneration to an identical phase by frequency multiplication.

FIG. 16 is for describing degeneration to an identical phase by frequency multiplication. If the signal of each phase shown in FIG. 16 is frequency-multiplied eight-fold, then all of the phase components degenerate to the same phase in the following manner, by way of example:

$e^{j(2\pi/8) \times 8} = e^{j2\pi}$ $e^{j(2\pi/8) \times 8} = e^{j4\pi}$

Accordingly, all modulated components of the QPSK signal and the carrier based upon the offset become identical in phase. Therefore, by exercising control under these conditions in such a manner that the magnitude of the carrier is minimized, the offset carrier is reduced to compensate for the offset of the orthogonal modulator 118.

In accordance with the sixth embodiment, distortion compensation from which the effects of offset of the orthogonal modulator 118 on the transmitting side are excluded can be realized by providing the frequency multiplying device or means 165. Moreover, the offset of the orthogonal modulator 118 can be compensated for at all times, even during modulation. In comparison with the fifth embodiment, there is no need for an expensive, technically troublesome narrow-band filter. This has advantages in terms of cost.

(g) Seventh Embodiment

Figure 17:
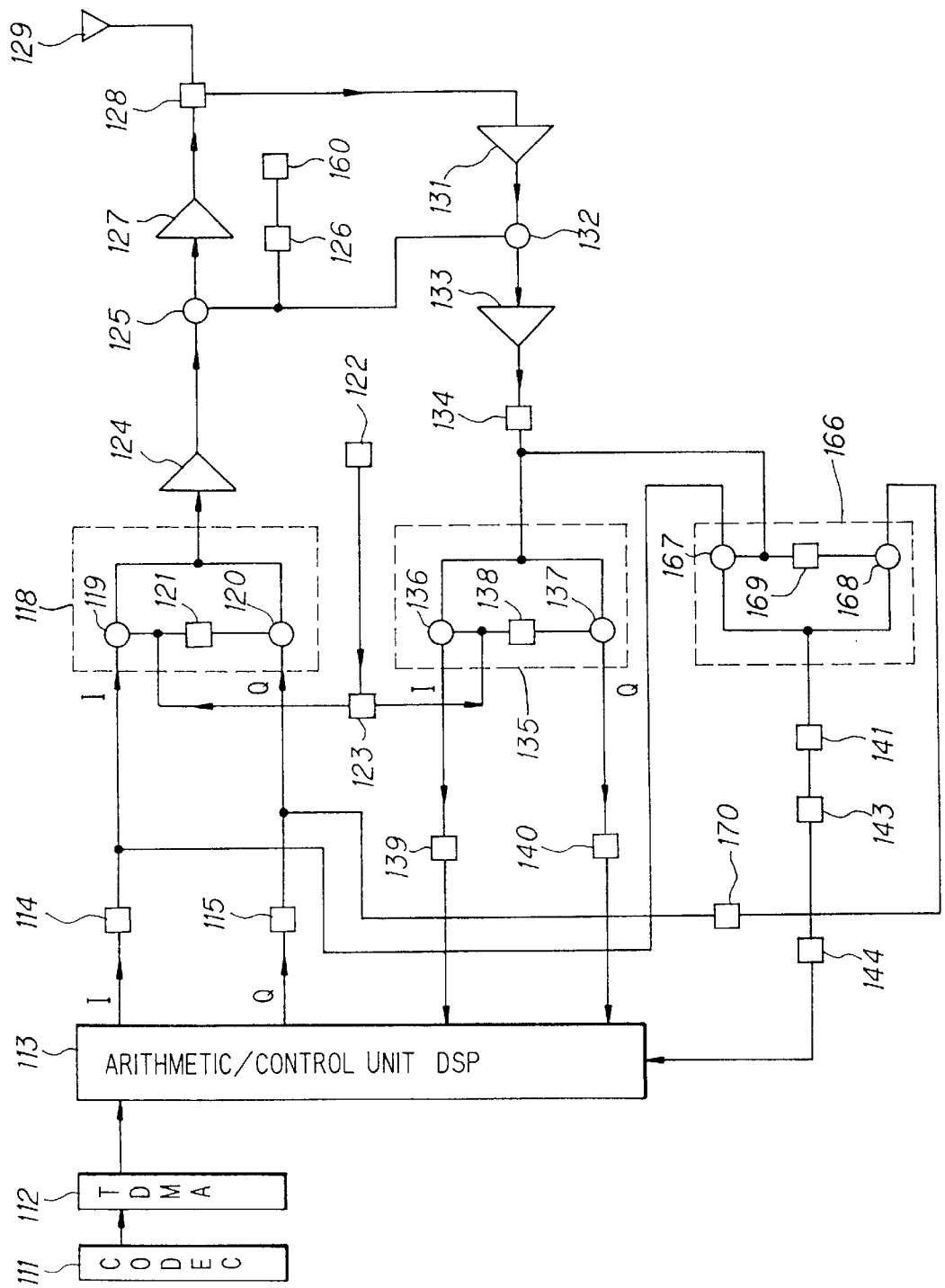
FIG. 17 is a diagram showing the construction of a seventh embodiment of a radio apparatus having an offset compensating function.

FIG. 17 is a diagram showing the construction of a seventh embodiment of a radio apparatus having an offset compensating function. This embodiment reduces the offset of the orthogonal modulator. Elements identical with those shown in FIG. 10 are designated by like reference characters. Numeral 166 denotes an orthogonal modulator comprising multipliers 167, 168 and a 90° phase shifter 169. Numeral 170 denotes a polarity inverter.

In FIG. 17, the carrier extracted by the BPF 134 and based upon the offset of the orthogonal modulator 118 is applied to the multiplier 167 of the orthogonal modulator 166, and the carrier is also applied to the other multiplier 168 upon being shifted in phase 90° by the phase shifter 169. Further, the I component of the transmission signal is applied to the multiplier 167, and the Q component of the transmission signal is applied to the multiplier 168 upon being inverted by the polarity inverter 170. By adopting this arrangement, the carrier based upon the offset of the orthogonal modulator 118 is reverse-modulated by the transmitted signal and the modulated components are eliminated.

The carrier component from which the modulated components have been excluded is bandwidth-limited by the BPF 141, after which the signal is detected and converted to a DC signal conforming to the offset value of the orthogonal modulator 118 by the detector 143. The DC signal is converted to a digital signal by the AD converter 144 and the digital signal enters the arithmetic/control unit 113. When the signal enters, the arithmetic/control unit 113 finely adjusts the I and Q input levels of the orthogonal modulator 118 based upon the offset value and outputs the results. The DA converters 114 and 115 convert the finely adjusted I and Q signals to analog signals and enter the analog signals into the orthogonal modulator 118 so that control is performed to minimize the carrier leakage from the orthogonal modulator 118.

In accordance with the sixth embodiment, distortion compensation from which the effects of offset of the orthogonal modulator 118 on the transmitting side are excluded can be realized by providing the reverse modulating means 166. Moreover, offset compensation can be performed at all times, even during modulation. In comparison with the fifth embodiment, there is no need for an expensive, technically troublesome narrow-band filter. This has advantages in terms of cost.

(h) Eighth Embodiment

Figure 18:
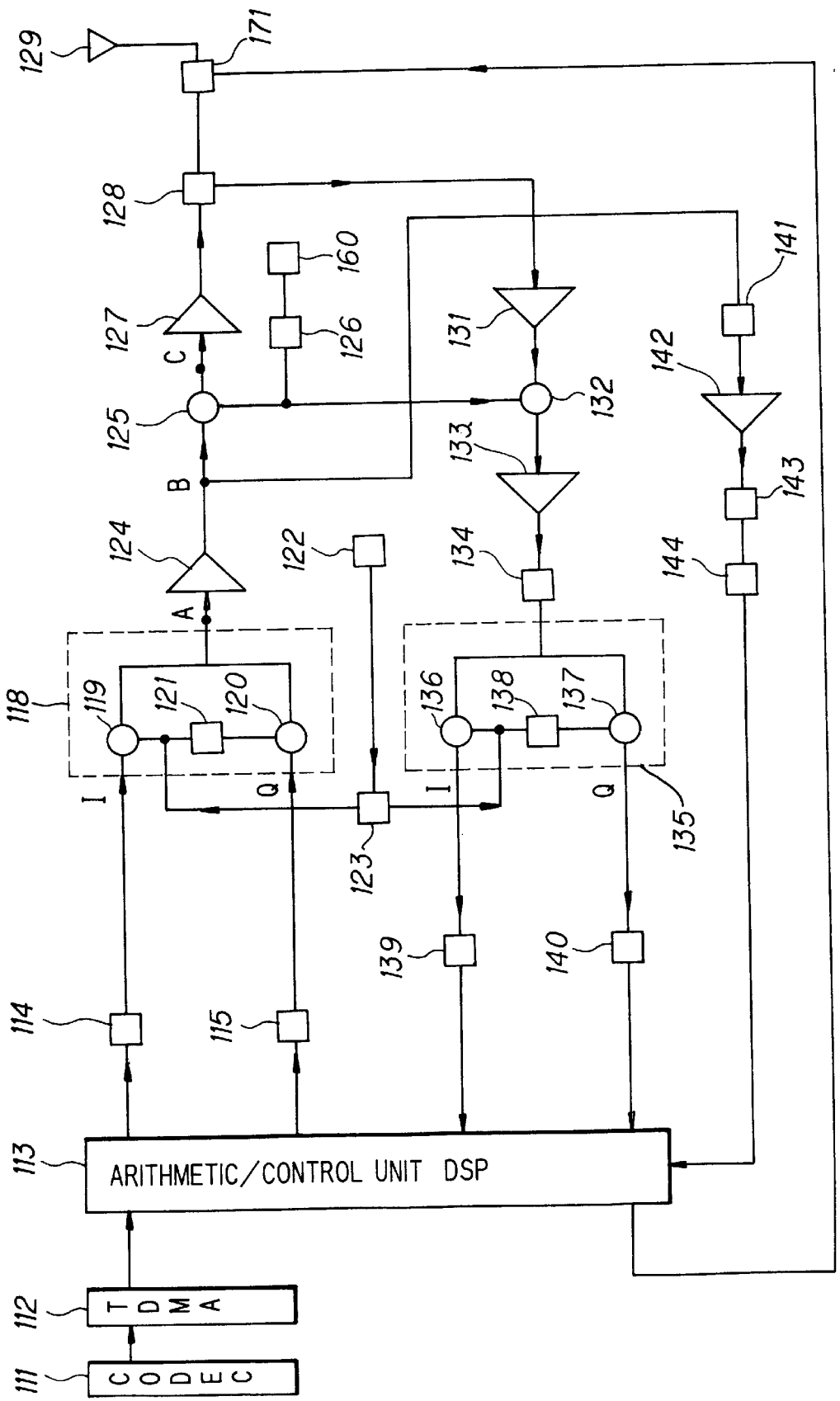
FIG. 18 is a diagram showing the construction of a eighth embodiment of a radio apparatus having an offset compensating function.

FIG. 18 is a diagram showing the construction of an eighth embodiment of a radio apparatus having an offset compensating function. This embodiment reduces the offset of the orthogonal modulator. Elements identical with those shown in FIG. 10 are designated by like reference characters. Numeral 171 denotes a switch for disconnecting the antenna 129.

In FIG. 18, the carrier based upon the offset of the orthogonal modulator 118 is branched off from a point A on the output side of the orthogonal modulator 118, a point B on the input side of the transmission mixer 125 or a point C on the input side of the power amplifier 127, the carrier is bandwidth-limited by the BPF 141 and the resulting signal is amplified by the amplifier 142 and then applied to the detector 143, where the signal is detected and converted to a DC signal conforming to the offset value of the orthogonal modulator 118. The DC signal is converted to a digital signal (offset value) by the AD converter 144 and the digital signal enters the arithmetic/control unit 113.

When the offset value enters, the arithmetic/control unit 113 finely adjusts the I and Q input levels of the orthogonal modulator 118 based upon the offset value and outputs the results. The DA it converters 114 and 115 convert the finely adjusted I and Q signals to analog signals and enter the analog signals into the orthogonal modulator 118 so that control is performed to minimize the leakage carrier from the orthogonal modulator 118.

In a case where the unmodulated carrier is branched off from the point A, the offset compensating operation is performed upon establishing a state in which transmission is turned off by cutting off power to the amplifier 124 or to the transmission power amplifier 127 or by cutting off the feed of current to the antenna. In a case where the unmodulated carrier is branched off from the point B or C, the offset compensating operation is performed upon establishing a transmission cut-off state by cutting off power to the transmission power amplifier 127 or by cutting off the feed of current to the antenna. It should be noted that the operation which compensates for leakage carrier can also be carried out at a time (in idle time slots) other than the apparatus' own time slot in time-division multiplexed communication without cutting off each of the power supplies.

Thus, in accordance with the eighth embodiment, offset of the orthogonal modulator can be compensated for in a state in which transmission is turned off or in idle time slots in time-division multiplexed transmission. This makes it possible to shorten the time necessary for offset compensation.

(i) Ninth Embodiment

In the first through eighth embodiments, control for compensating for the offset of the orthogonal modulator 118 can be carried out in accordance with well-known perturbation theory. In this case, a width of perturbation can be gradually reduced with a decline in the amount of offset carrier using a perturbation algorithm.

Figure 19:
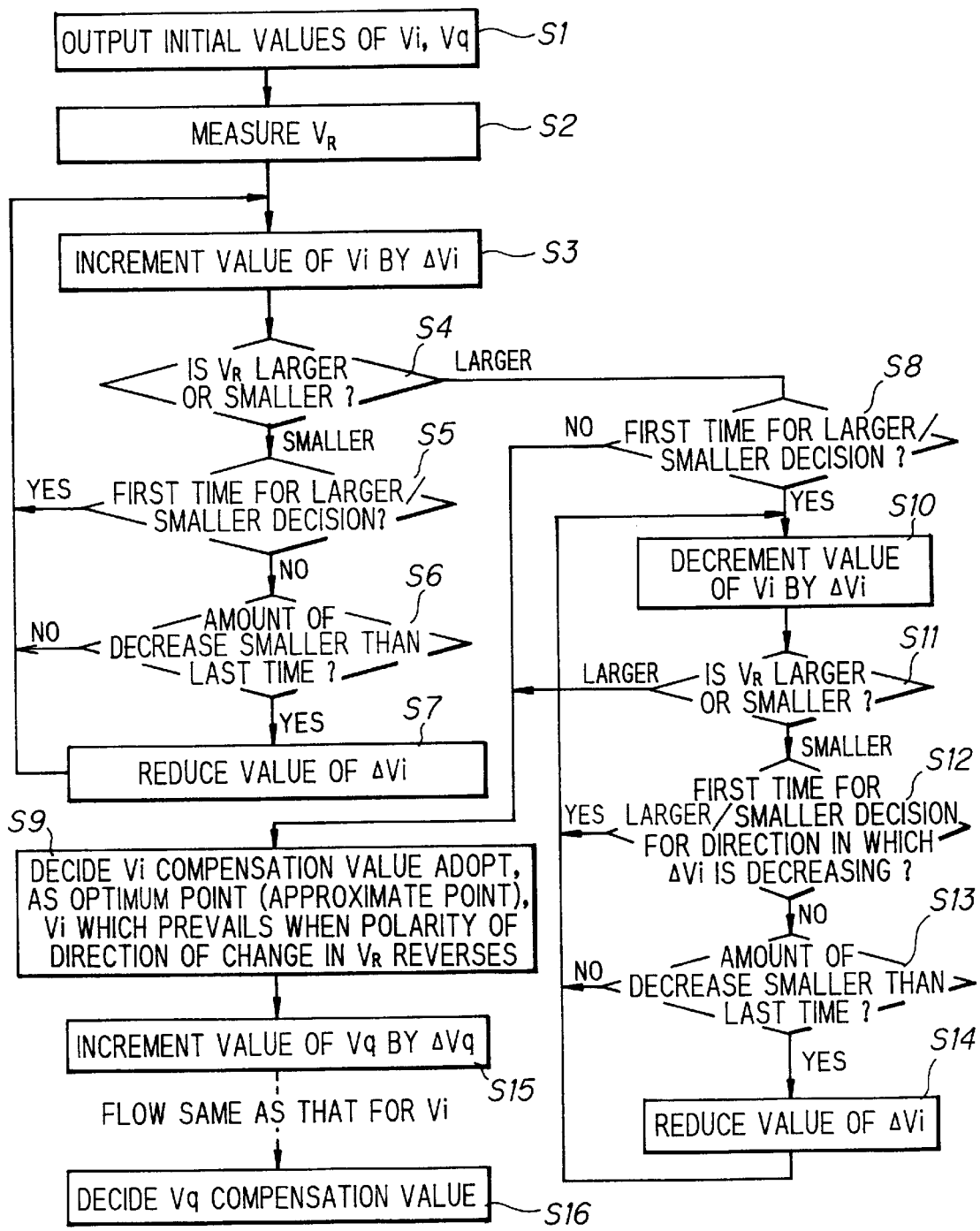
FIG. 19 is a flowchart of offset compensation by a perturbation algorithm.
Figure 20A:
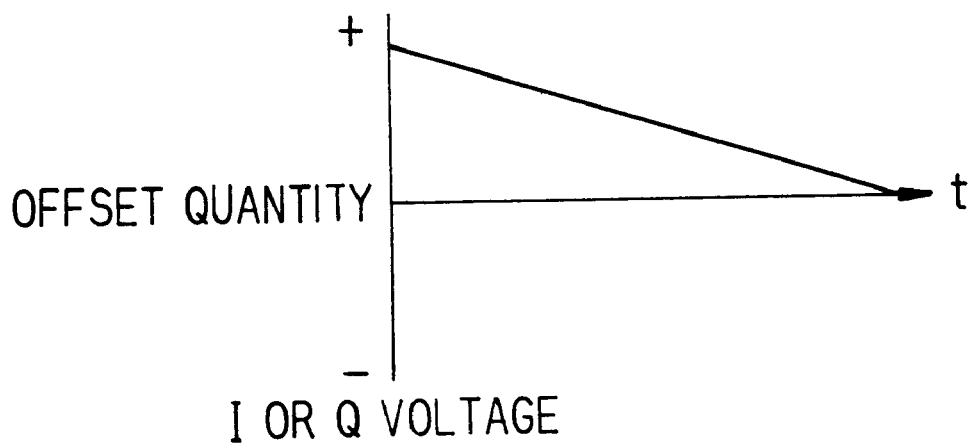
FIGS. 20A and 20B are diagrams for describing a change in amount of perturbation.
Figure 20B:
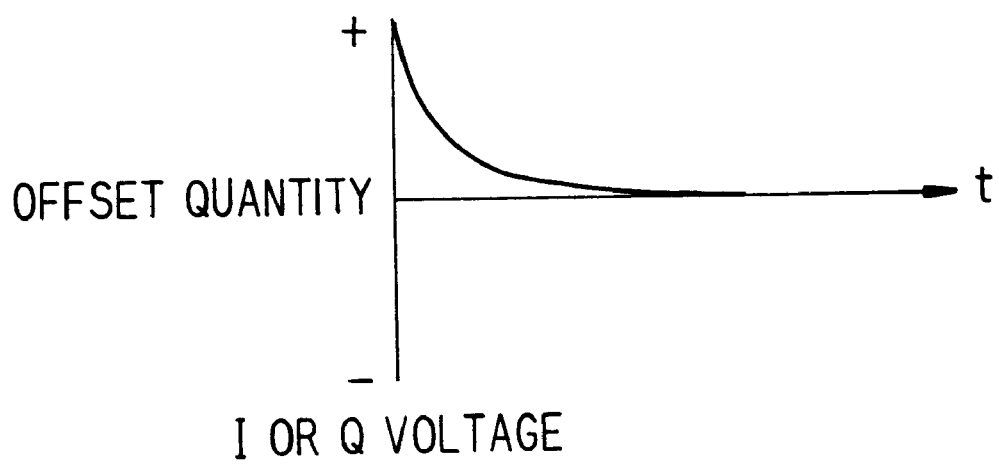

FIG. 19 is a flowchart of processing for offset compensation by a perturbation algorithm. In FIG. 19, $V_i$ and $V_q$ represent the initial input voltages of the I and Q components in the orthogonal modulator 118, and $V_R$ represents the energy detection voltage of the carrier based upon the offset of the orthogonal modulator 118. Further, FIGS. 20A and 20B are for describing the setting of the amount of perturbation, in which FIG. 20A illustrates a case in which the amount of perturbation is constant and FIG. 20B a case in which the amount of perturbation is inversely proportional to the offset carrier.

In the perturbation algorithm of FIG. 19 for offset compensation, the arithmetic/control unit 113 outputs $V_i$ and $V_q$ to the orthogonal modulator 118 as the initial values of the I and Q components (step S1) and measures the offset voltage $V_R$ (step S2). Next, the arithmetic/control unit 113 increments $V_i$ by $\Delta V_i$ (step S3) and compares the currently measured offset voltage $V_R$ with the preceding offset voltage (step S4). If the currently prevailing offset value $V_R$ is smaller, the arithmetic/control unit 113 determines whether the decision of step S4 was rendered the first time (step S5). If the answer is "YES", then the program returns to step S3. If the answer is "NO", it is determined whether the amount of decrease in the offset voltage $V_R$ is smaller than the previous time (step S6). If the amount of decrease is larger than the previous time, then the program returns to step S3 and the processing from step S3 onward is repeated. If the amount of decrease is smaller than the previous time, then the value of $\Delta V_i$ is reduced a prescribed amount (step S7), the program returns to step S3 and the processing from step S3 onward is repeated. As a result of this operation, the change $\Delta V_i$ in $V_i$ is made smaller with a decline in the amount of change of the decrease in the offset.

Thereafter, the amount of decrease in the offset voltage $V_R$ becomes small as $V_i$ becomes larger, and the offset $V_R$ eventually reverses and starts increasing instead of decreasing (step S4). When the offset undergoes the reversal from the decreasing tendency to the increasing tendency, the arithmetic/control unit 113 judges whether this is the first time for this determination (the decision of step S4) to be made (step S8). If the answer is "NO", then the $V_i$ which prevailed when $V_R$ made the reversal from the decreasing tendency to the increasing tendency is stored as the optimum value for the purpose of offset compensation (step S9).

On the other hand, in a case where the offset voltage $V_R$ is found to be increasing the first time the decision of step S4 is rendered, whether this is the first time for the decision is checked (step S8). Since it is the first time, $V_i$ is decremented by $\Delta V_i$ (step S10). Next, the arithmetic/control unit 113 compares the currently measured offset voltage $V_R$ with the preceding offset voltage (step S11). Since the present offset value Vr is reduced by the decrementing of $V_i$, the arithmetic/control unit 113 determines whether the decision of step S11 was rendered the first time (step S12). If the answer is "YES", then the program returns to step S10. If the answer is "NO", it is determined whether the amount of decrease in the offset voltage $V_R$ is smaller than the previous time (step S13). If the amount of decrease is larger than the previous time, then the program returns to step S10 and the processing from step S10 onward is repeated. If the amount of decrease is smaller than the previous time, then the value of $\Delta V_i$ is reduced a prescribed amount (step S14), the program returns to step S10 and the processing from step S10 onward is repeated. As a result of this operation, the change $\Delta V_i$ in $V_i$ is made smaller with a decline in the amount of change of the decrease in the offset.

Thereafter, the amount of decrease in the offset voltage $V_R$ becomes small as $V_i$ becomes smaller, and the offset $V_R$ eventually reverses and starts increasing instead of decreasing (step Sll). When the offset undergoes the reversal from the decreasing tendency to the increasing tendency, the $V_i$ which prevailed when $V_R$ made the reversal from the decreasing tendency to the increasing tendency is stored as the optimum value for the purpose of offset compensation (step S9).

Thenceforth, processing is performed in similar fashion with regard to $V_q$ and the optimum. value for the purpose of offset compensation is stored (steps S15, S16).

In accordance with the ninth embodiment, offset compensation is carried out by a perturbation algorithm and offset can be compensated for accurately and at high speed.

(j) Tenth Embodiment

Offset of the orthogonal modulator 118 is estimated using carrier leakage power (amount of offset) in absence of modulation and a measured value of power in a case where modulated baseband signals (I and Q signals) have been entered or input as a unit circle in the first through third embodiments (FIGS. 8~12). By using a computation algorithm for such estimation of the offset, it can be so arranged that offset computation is made possible more rapidly than with the perturbation algorithm of the ninth embodiment. Such a computation algorithm will now be described.

If we let $v_x$ and $v_y$ represent DC offsets and assume that a unit circle of amplitude r has been outputted, the power p detected will be represented by $$p = x^2 + y^2$$

$$(x-v_x)^2 + (y-v_y)^2 = r^2$$

Power p is represented by the rotational angle $\theta$ of r, and the maximum and minimum values thereof are obtained. When power p is obtained by making the substitutions $$x - v_x = r\cos\theta$$

$$y - vy = r\sin\theta$$

we have $$p = (r\cos\theta + v_x)^2 + (r\sin\theta + v_y)^2 \quad (3)$$
$$= r^2 + v_x^2 + v_y^2 + 2rv_x\cos\theta + 2rv_y\sin\theta$$
$$= r^2 + p_L + 2r(v_x\cos\theta + v_y\sin\theta)$$

Here $P_L = v_x^2 + v_y^2$ is the measured value of power (offset) in the absence of modulation. Since the following holds true $$dp/d\theta = -2rv_x \sin\theta + 2rv_y \cos\theta = 0$$

we have $$v_y/v_x = \sin\theta_0/\cos\theta_0 \quad (4)$$

where $\theta_0$ represents the $\theta$ at which the derivative becomes zero. If $v_x$ and $v_y$ are obtained from Equations (3) and (4), we have $$v_x = (½r \cos\theta_0)(p_0 - p_L - r^2)$$

$$v_y = (½r \sin\theta_0)(p_0 - p_L - r^2)$$

where $p_0$ is the value of power p which prevails when $dp/d\theta = 0$ holds.

In other words, if the power $p_L$ in the absence of modulation, the minimum value $p_0$ of power which prevails when the unit circle of amplitude 4 is outputted and the $\theta$ which gives this can be measured, the DC offsets $v_x$ and $v_y$ can be calculated. The offset angle $(p_0, \theta_0)$ of the maximum value is the same as the offset angle $(p_0, \theta_0)$ of the minimum value.

In accordance with the tenth embodiment, high-speed offset compensation is possible and the offset compensation can be performed quicker than with the perturbation algorithm of the ninth embodiment. The arithmetic means which executes the computation algorithm is the controller 145 in the case of FIG. 8 and the arithmetic/control unit 113 in the case of FIGS. 10 and 12.

(k) 11th Embodiment

In the first through third embodiments (FIGS. 8~12), the offset quantity and the offset angle are measured from the measured value of carrier leakage power in absence of modulation and the measured value of power in a case where modulating baseband signals (I and Q signals) have been entered as a unit circle, and the offset point is estimated from the measured values of offset quantity and offset angle, thereby compensating for the offset.

Figure 21A:
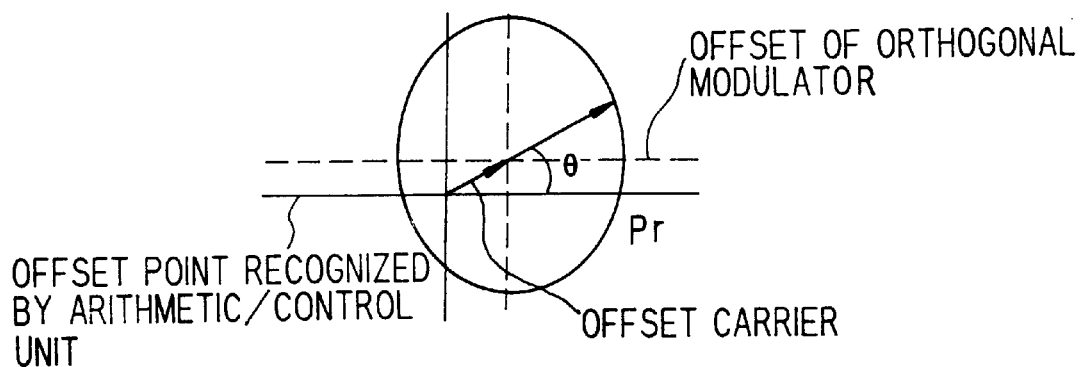
FIGS. 21A, 21B and 21C are diagrams for describing estimation of an offset point.
Figure 21B:
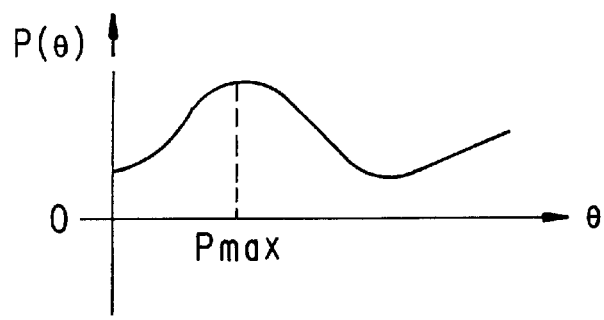
Figure 21C:
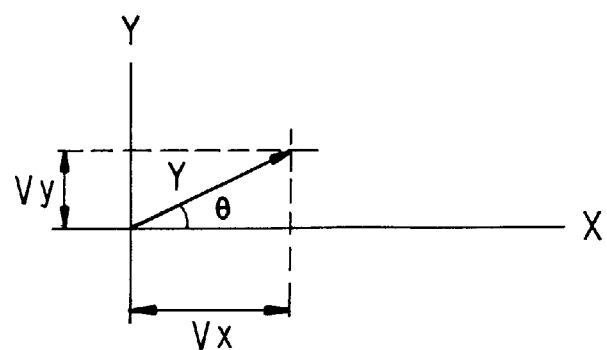

FIGS. 21A~21C are for describing the estimation of offset point. FIG. 21A is a diagram showing the relationship between an offset point recognized by the arithmetic/control unit 113 and the offset of the orthogonal modulator 118, FIG. 21B is a diagram for describing a change in the measured value of power in a state where a unit circle is entered, and FIG. 21C is a diagram for describing estimation of an offset point. In the 11th embodiment, the amount of offset is obtained in accordance with the following steps:

Step 1: The arithmetic/control unit 113 (see FIG. 10) outputs a zero point which it itself recognizes.

Step 2: The power P of the offset carrier based upon the offset of the orthogonal modulator 118 at this time is measured by the detector 143. Though the power is known at this time, the direction of the offset is unknown.

Step 3: The arithmetic/control unit 113 outputs a unit circle (FIG. 21A) as modulated baseband signals (the I and Q signals). Owing to the existence of offset, there is a power difference in the direction of the signals, the direction at the time of Pmax (FIG. 21B) is the offset direction, and the angle at this time is θ. Since the arithmetic/control unit 113 is itself outputting the unit circle, it recognizes θ.

Step 4: From θ and the offset power P, which has been found at Step 2, we have $$r^2 = P = v_x^2 + v_y^2$$

where r=p½, $v_x$=r sin θ, $v_y$=r cos θ. Accordingly, if θ and r are known, the offset quantities $v_x$ and $v_y$ can be derived by simple computation.

In accordance with the 11th embodiment, the offset of the orthogonal modulator can be performed at high speed by the carrier leakage detecting means and arithmetic means. The compensation for offset can be carried out faster than with the perturbation algorithm of the ninth embodiment. Further, since the amount of computation is less than in the case of the tenth embodiment, offset can be compensated for even more rapidly. The arithmetic means of the 11th embodiment is the controller 145 in FIG. 8 and the arithmetic/control unit 113 in FIGS. 10 and 12.

(l) 12th Embodiment

Compensation for the offset of the orthogonal modulator 118 can be carried out using the offset point obtained in the 10th or 11th embodiment as the starting point of the perturbation operation of the ninth embodiment.

In accordance with the 12th embodiment, the offset of the orthogonal modulator can be performed highly precisely and at high speed by the carrier leakage detecting means, arithmetic means and perturbation operation. The reason for this is that the offset quantity can be obtained accurately by the perturbation operation after the offset quantity is first found roughly by the arithmetic method.

(m) 13th Embodiment

Figure 22:
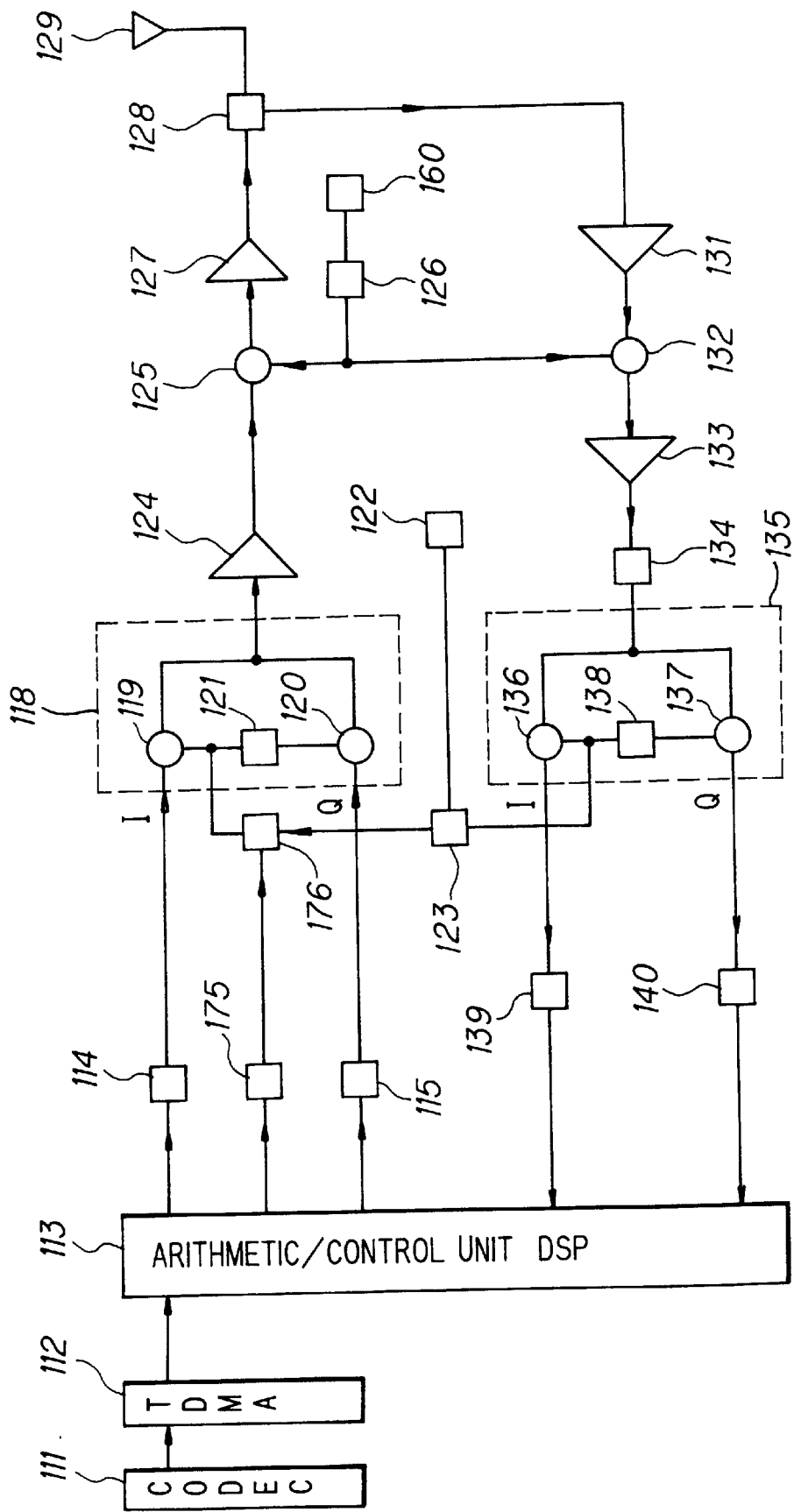
FIG. 22 is a diagram showing the construction of a 13th embodiment of a radio apparatus having an offset compensating function.

FIG. 22 is a diagram showing the construction of a 13th embodiment of a radio apparatus having an offset compensating function. The offsets of the orthogonal modulator and orthogonal detector are computed separately and compensation is made for each offset. Elements in FIG. 22 identical with those shown in FIG. 10 are designated by like reference characters. Numeral 175 denotes a DA converter and 176 a phase shifter.

In FIG. 22, the orthogonal detector 135 feeds back and detects the transmitted signal and enters the baseband signals (I and Q signals) obtained by detection into the arithmetic/control unit 113. The arithmetic/control unit 113 compares the amplitudes of the baseband signals fed back and the amplitudes of the transmitted baseband signals, updates the distortion compensation coefficients in such a manner that the compared signals become the same and applies pre-distortion processing to the transmission baseband signals using the distortion compensation coefficients.

A state in which modulation is not performed is established prior to this pre-distortion processing and, in this state, the DA converter 175 converts the output signal (phase shift signal) from the arithmetic/control unit 113 to an analog signal and outputs the analog signal. On the basis of the phase shift signal, the phase shifter 176 varies, by 0~360°, the phase of the reference carrier wave provided by the PLL 122.

The phase of the leakage carrier ascribable to the offset of the orthogonal modulator 118 in the modulation-free state is rotated by the change in the phase of the reference carrier wave, as a result of which the baseband outputs of the orthogonal detector 135 are rotated in terms of phase to describe a unit circle (see FIG. 4) on a complex plane. The arithmetic/control unit 113 measures the unit circle and obtains the offset of the orthogonal detector 135 by performing the operations of Equations (1) and (2).

Next, with the change in the phase of the reference carrier wave being kept at zero, the arithmetic/control unit 113 enters the unit circle (see FIG. 5) into the orthogonal modulator 118 as the modulation baseband signals (I and Q signals). The transmitted signal outputted by the transmission power amplifier 127 is branched off and fed into the orthogonal detector 135. The latter orthogonally detects the transmitted signal, generates the feedback baseband signals (I and Q signals) and enters these signals into the arithmetic/control unit 113 via the AD converters 139 and 140, respectively. The arithmetic/control unit 113 obtains the overall offset of the modulation and feedback systems by performing operations similar to those of Equations (1), (2). Next, the arithmetic/control unit 113 obtains the offset of the orthogonal modulator 118 by a complex operation based upon the overall offset and the offset of the orthogonal detector 135. The arithmetic/control unit 113 then stores the offsets of the orthogonal detector 135 and orthogonal modulator 118 in memory and, on the basis of these offsets, compensates for the offsets with regard to the modulating input and demodulated output, thereby compensating for the offsets of the orthogonal detector 135 and orthogonal modulator 118.

In the foregoing, a case is described in which offset measurement is performed in a modulation-free state with transmission turned off. However, the offset measurement can be performed during the preamble or in idle time slots, namely in time slots other than the apparatus' own allocated time slot, in time-division multiplexed communication.

In accordance with the 13th embodiment, the offset compensation can be performed by measuring the offsets of the orthogonal modulator 118 and orthogonal detector 135 through use of the phase shifting device or means 176 for the orthogonal modulator 118. Moreover, means for detecting the offset carrier of the orthogonal modulator 118 is unnecessary, as in the case of the 1st through 12th embodiments.

In the 13th embodiment, processing for offset compensation may be performed in the controller 145 separately of the arithmetic/control unit 113 comprising the DSP which generates the baseband waveforms, as illustrated in the first embodiment.

(n) 14th Embodiment

A device or means is provided for forcibly applying an offset to the orthogonal modulator 118 during the computation for obtaining the offset of the orthogonal detector 135 in the 13th embodiment (FIG. 22). By forcibly applying the offset, the carrier ascribed to offset of the orthogonal modulator 118 increases and the unit circle described on the complex plane is enlarged owing to rotation of the phase of the baseband outputs of the orthogonal detector 135 based upon the phase rotation of the carrier. As a result, the arithmetic/control unit 113 measures this unit circle and performs the operations of Equations (1) and (2) to improve the accuracy with which the offset of the orthogonal detector 135 is calculated.

In accordance with the 14th embodiment, the offset of the orthogonal detector 135 can be calculated more accurately by providing the shifting device or means and the offset applying device or means for the orthogonal modulator 118.

(o) 15th Embodiment

Means in the form of a variable-capacity diode constructed on a branch-line hybrid or means constituted by a limitless shifter (four-phase shifting modulator) is used as the phase shifter 176 for changing, by 0~360°, the phase of the reference carrier wave to the orthogonal modulator 118 in the 13th embodiment (FIG. 22).

(p) 16th Embodiment

The phase shifter 176 of the 13th embodiment (FIG. 22) is used also when a phase shift of the modulating signals (modulation baseband signals) and demodulated signals (feedback baseband signals) is corrected. In accordance with the 16th embodiment, accurate distortion compensating processing becomes possible by eliminating the phase difference between the modulating and demodulated signals by providing phase adjusting means (not shown) in addition to the phase shifting means 176. Further, the phase adjusting means can be used also for offset computation. This contributes to a reduction in size and cost.

(q) 17th Embodiment

Figure 23:
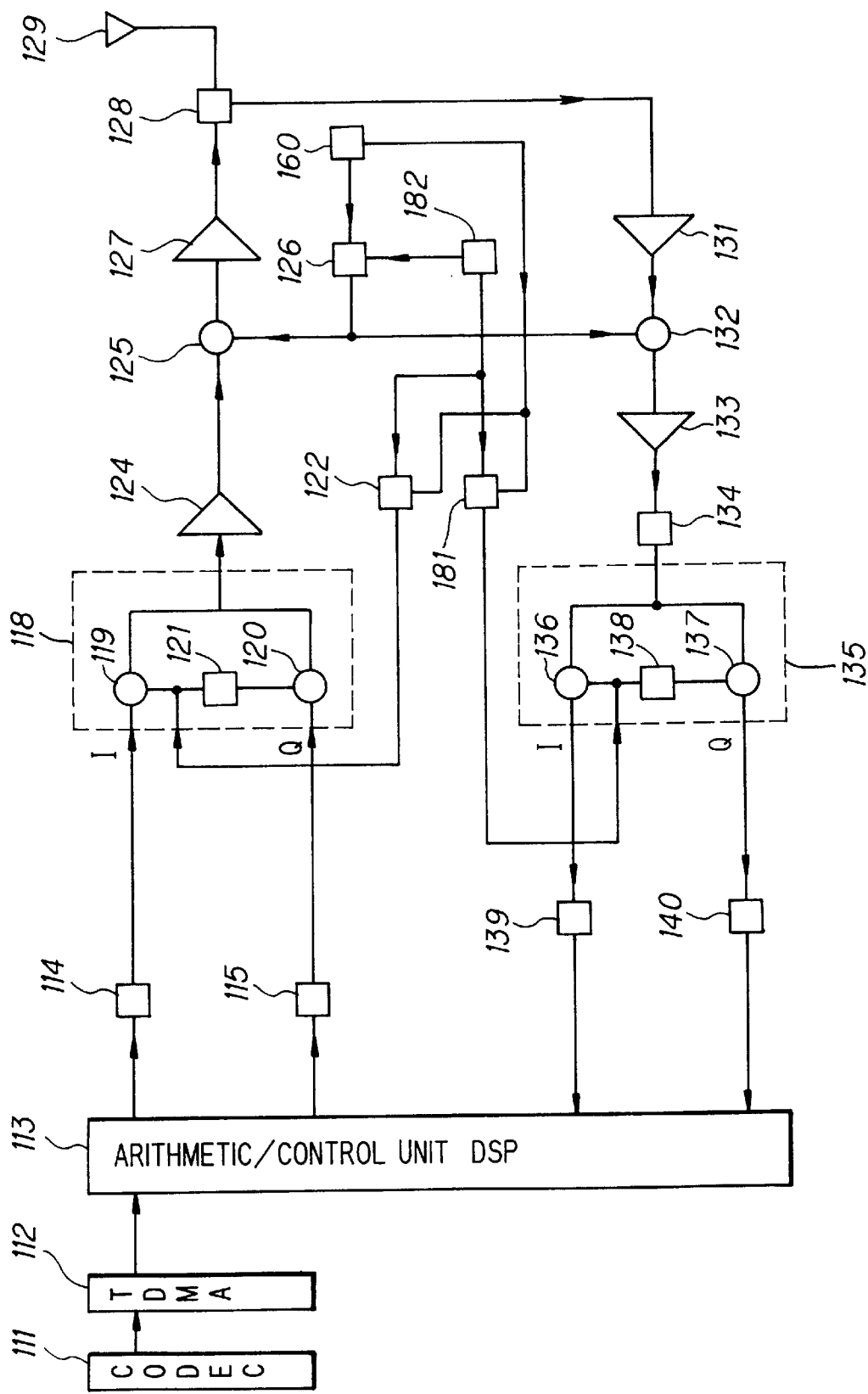
FIG. 23 is a diagram showing the construction of a 17th embodiment of a radio apparatus having an offset compensating function.

FIG. 23 is a diagram showing the construction of a 17th embodiment of a radio apparatus having an offset compensating function. Here, the offsets of the orthogonal modulator and orthogonal detector are calculated separately and compensation is made for each offset. Elements in FIG. 23 identical with those shown in FIG. 22 are designated by like reference characters. Numeral 181 denotes a third PLL frequency synthesizer (hereinafter referred to as a "PLL"), and 182 represents a reference frequency oscillator.

In FIG. 23, a shifting device or means for varying, by 0~360°, the phase of the reference carrier wave to the orthogonal modulator 118 is constructed using a plurality of PLL frequency synthesizers. As shown in FIG. 23, the reference carrier wave to the orthogonal modulator 118 is supplied by the PLL 122, the local oscillation signal to the transmission mixer 125 and reception mixer 132 is supplied by the PLL 126, the reference carrier to the orthogonal detector 135 is supplied by the PLL 181, and a reference frequency signal applied to the PLLs 122, 126 and 181 is supplied by the reference frequency oscillator 182.

When offset is measured, the output frequency of either PLL 122 or 181 is shifted N channels (i.e., by N·Δf, where Δf represents the frequency between channels) or it is so arranged that the output frequency becomes a frequency displaced by a frequency capable of being set by the PLL. As a result, the baseband outputs of the orthogonal detector 135 can be rotated in terms of phase by the frequency between the two PLLS. Accordingly, the arithmetic/control unit 113 measures the unit circle described on the complex plane and obtains the offset of the orthogonal detector 135 by performing the operations of Equations (1) and (2). Further, as described in the 13th embodiment (FIG. 22), the arithmetic/control unit 113 obtains the overall offset of the modulation and feedback systems, obtains the offset of the orthogonal modulator 118 by computation and compensates for the offsets of the orthogonal detector 135 and orthogonal modulator 118.

In accordance with the 17th embodiment, the unit circle is described at an accurate rotational speed and the amount of offset can be calculated in highly precise fashion by providing the plurality of PLLs 122, 126, 181 and the PLL control means 160. This embodiment is advantageous in that it can be applied to an apparatus using a plurality of PLLs and can be realized without enlarging the scale of the circuitry, as in a case where the transmitter and receiver are remote from each other.

(r) 18th Embodiment

Figure 24:
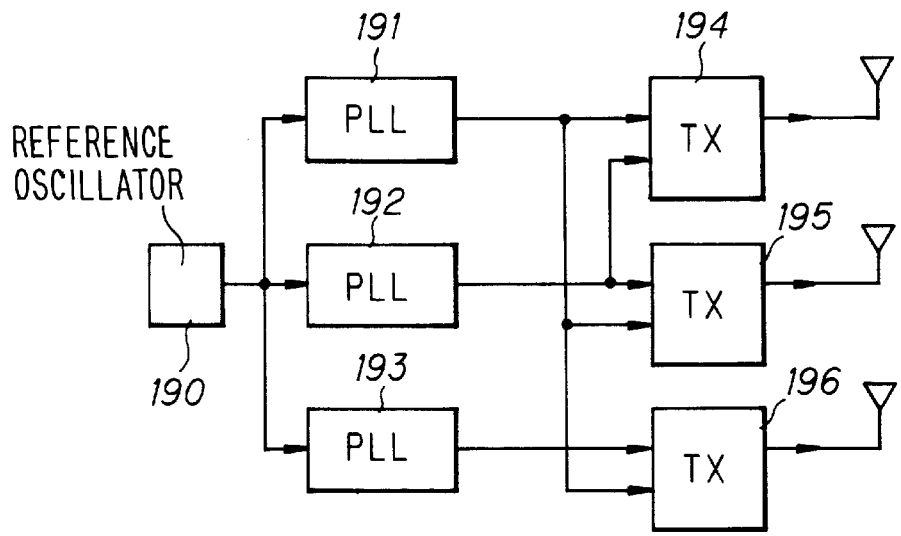
FIG. 24 is a diagram showing the construction of an 18th embodiment of the present invention.

FIG. 24 is a diagram showing the construction of an 18th embodiment of a radio apparatus having an offset compensating function. Here the offsets of the orthogonal modulator and orthogonal detector are calculated separately and compensation is made for each offset. Shown in FIG. 24 are a reference oscillator 190, PLLs 191~193 and transmitters (TX) 194~196.

The 18th embodiment is applied to an apparatus, such as a base station radio apparatus, in which a plurality of transmitters are placed in close proximity to one another and the reference frequency signal is supplied from the reference oscillator shared by the PLLs. In this embodiment, a plurality of reference carrier waves are entered into respective ones of the transmitters 194~196 and the reference carrier waves can be used selectively.

When the offset is calculated, the reference carrier wave frequencies of the orthogonal modulator and orthogonal detector are made to differ by an amount equivalent to N (an integer) channels by using frequency switching means to change over the reference carrier frequency of the orthogonal modulator or orthogonal detector within the transmitter. As a result, the baseband outputs of the orthogonal detector 135 are rotated in terms of phase by the difference frequency between two reference carrier frequencies, thereby making it possible to obtain the offset of the orthogonal detector. This is similar to the 17th embodiment.

Furthermore, the arithmetic/control unit 113 obtains the overall offset of the modulation and feedback systems, obtains the offset of the orthogonal modulator 118 by computation and compensates for the offsets of the orthogonal detector and orthogonal modulator.

In accordance with the 18th embodiment, each transmitter is provided with a reference carrier input device or means and a reference carrier changeover means. As a result, the reference carrier frequencies of the orthogonal modulator and orthogonal detector can be made to differ, thereby describing a unit circle at an accurate rotational speed and making it possible to execute highly accurate offset calculation. Further, the 18th embodiment is advantageous in that it is unnecessary to provide PLLs anew in a case where there are a plurality of transmitters and the PLLs of adjacent apparatus are capable of being utilized in mutual fashion.

(s) 19th Embodiment

Figure 25:
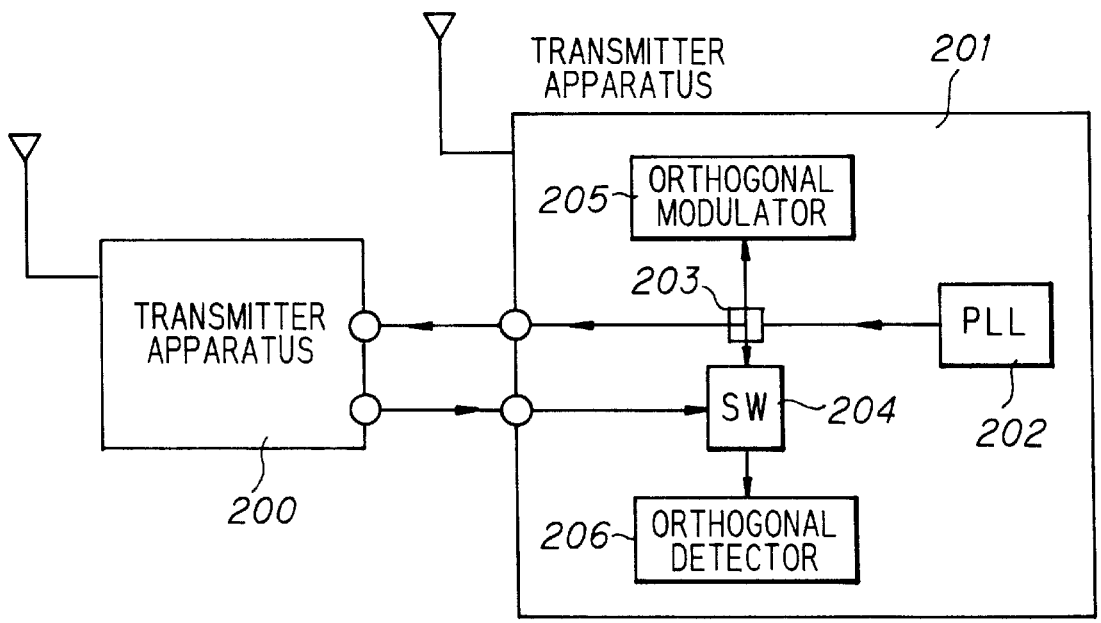
FIG. 25 is a diagram showing the construction of an 19th embodiment of the present invention.

FIG. 25 is a diagram showing the construction of a 19th embodiment of a radio apparatus having an offset compensating function. Here the offsets of the orthogonal modulator and orthogonal detector are calculated separately and compensation is made for each offset. Numerals 200 and 201 denote identically constructed transmitter apparatuses. Each transmitter apparatus includes a PLL 202, a distributor 203, a switch 204, an orthogonal modulator 205 and an orthogonal detector 205.

The 19th embodiment is applicable to a case where a plurality of transmitters are placed in close proximity to one another, as in a base station radio apparatus. In each transmitter apparatus 200 and 201, the reference carrier signal from the PLL 202 is supplied to the orthogonal modulator 205 and to the adjacent transmitter apparatus via the distributor 203, and the reference carrier wave of the apparatus' own PLL or the reference carrier wave of the PLL of the adjacent apparatus is supplied to the orthogonal detector 206 through the changeover operation of the switch 204. The switch 204 ordinarily selects the apparatus' own PLL 202.

When offset is calculated, the reference carrier wave frequency of the PLL of the adjacent apparatus is selected and supplied to the orthogonal detector 206 by the switch 204, as a result of which the reference carrier wave frequencies of the orthogonal modulator 205 and orthogonal detector 206 are made to differ by an amount equivalent to N (an integer) channels. By thus making the reference carrier frequencies differ by N channels, and owing to the fact that operation is asynchronous even though frequencies are identical, the baseband outputs of the orthogonal detector 206 are rotated in terms of phase by the difference frequency between two reference carrier frequencies, thereby making it possible to obtain the offset of the orthogonal detector. This is similar to the 17th embodiment.

Furthermore, the arithmetic/control unit 113 obtains the overall offset of the modulation and feedback systems, obtains the offset of the orthogonal modulator 205 by computation and compensates for the offsets of the orthogonal detector and orthogonal modulator.

In accordance with the 19th embodiment, each transmitter apparatus 200 and 201 is provided with reference carrier input/output device or means and reference carrier changeover device or means. As a result, the reference carrier frequencies of the orthogonal modulator and orthogonal detector can be made to differ, thereby describing a unit circle at an accurate rotational speed and making it possible to execute highly accurate offset calculation. Further, the 19th embodiment is advantageous in that it is unnecessary to provide PLLs anew in a case where there are a plurality of transmitters and the PLLs of adjacent apparatus are capable of being utilized in mutual fashion.

(t) 20th Embodiment

Figure 26:
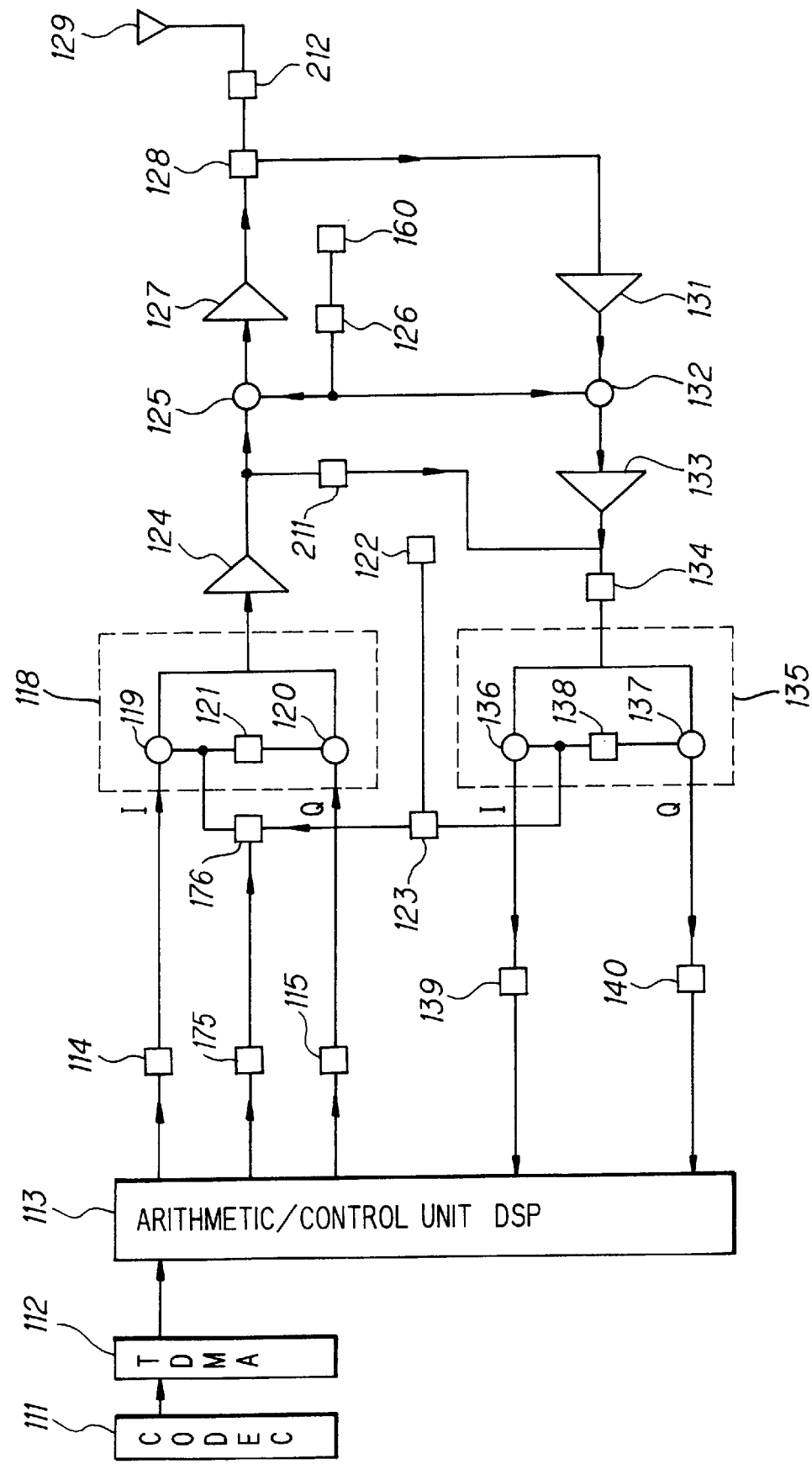
FIG. 26 is a diagram showing the construction of a 20th embodiment of a radio apparatus having an offset compensating function.

FIG. 26 is a diagram showing the construction of a 20th embodiment of a radio apparatus having an offset compensating function. Here the offsets of the orthogonal modulator and orthogonal detector are calculated separately and compensation is made for each offset. Elements in FIG. 26 identical with those shown in FIG. 22 are designated by like reference characters. Numerals 211 and 212 denote switches.

In the 20th embodiment, the modulated signal is branched off from any portion between the output of the orthogonal modulator 118 and the antenna 129, and the modulated signal is fed back to any portion between the input to the orthogonal detector 135 and the input to the antenna. The switch 211 is provided to connect the output of the amplifier 124 and the input of the BPF 134. Furthermore, the switch 212 is provided to disconnect the output of the antenna when offset is calculated.

It should be noted that the power supplied to the transmission power amplifier 127 may be cut off rather than disconnecting the antenna 129 by the switch 212.

In accordance with the 20th embodiment, turning the switch 211 on and turning the switch 212 off makes it possible to perform the offset compensation operation by calculating offset when transmission is not being carried out and at a time (in idle time slots) other than the apparatus' own time slot in time-division multiplexing.

In accordance with the 20th embodiment, offset compensation is possible, even in a state in which transmission is turned off, by providing the antenna output disconnecting means. In time-division multiplexing, the offset compensation can be carried out in idle time slots. Accordingly, the time required for offset compensation can be shortened.

(u) 21st Embodiment

In a case where the offset compensating operation of each of the foregoing embodiments is carried out, offset values or offset compensation coefficients for all or some of the conditions of carrier frequency, transmission power and apparatus temperature in a transmitter apparatus at the time of the offset compensating operation are stored in the form of a table by providing means for detecting the carrier frequency, transmission power and temperature of the transmitter apparatus. Offset values or offset compensation coefficients conforming to the conditions prevailing at the time of transmission are obtained from the offset table and offset computation is started from these offset values or offset compensation coefficients. If an offset generated when offset compensation is performed using the preceding offset value or offset coefficient is small, the operation which compensates for distortion can be started immediately.

In accordance with the 21st embodiment, the data which prevailed at the preceding compensation operation is adopted as the starting point of calculation for offset compensation by providing means for compiling offset values or offset coefficients in the form of a table and means for storing these values. This makes it possible to shorten the time necessary for computation. Further, in the case of a perturbation operation, high-speed convergence becomes possible by starting perturbation from the preceding offset point. Furthermore, if an offset generated when offset compensation is performed using the preceding offset value or offset coefficient is small, the operation which compensates for distortion can be started immediately.

(v) 22nd Embodiment

The offset compensation operation in each of the foregoing embodiments is performed in the preamble period placed ahead of the apparatus' own allocated slot in time-division multiplexing.

Further, the offset compensation operation in each of the foregoing embodiments is performed in the preamble period placed ahead of the apparatus' own allocated slot in time-division multiplexing, and convergence is made to take place in a plurality of preamble periods.

Furthermore, when compensation for distortion of the transmitter apparatus is performed, adjustment or measurement of an offset due to the leakage carrier of the orthogonal modulator 118 is performed first, measurement of offset of the orthogonal detector 135 is performed second and parameters for offset compensation are set is performed third in the preamble period placed ahead of the apparatus' own allocated slot or in a plurality of the preamble periods.

In accordance with the radio apparatus having the offset compensating function of the present invention, as described above, the energy of carrier leakage due to the offset of an orthogonal modulator is detected and the input level of the orthogonal modulator is adjusted to minimize this energy. As a result, offset of the orthogonal modulator is eliminated and processing distortion compensation can be performed accurately.

Furthermore, in accordance with a radio apparatus having the offset compensating function of the present invention, a frequency difference or a phase difference is impressed upon the reference carrier waves of the orthogonal modulator and orthogonal detector, a unit circle is described by the output of the orthogonal detector and the offset of the orthogonal detector is obtained. Further, the input of the orthogonal modulator is adjusted and a unit circle is described by the output of the orthogonal detector. The overall offset of the orthogonal modulator and orthogonal detector is obtained, the offset of the orthogonal modulator is obtained by calculation using this overall offset and the offset of the orthogonal detector, and the input to the orthogonal modulator and the output of the orthogonal detector have their offsets compensated for based upon these offsets. As a result, the effects of the offsets of the orthogonal modulator and orthogonal detector are eliminated so that distortion compensating processing can be performed accurately.

Figure 27:
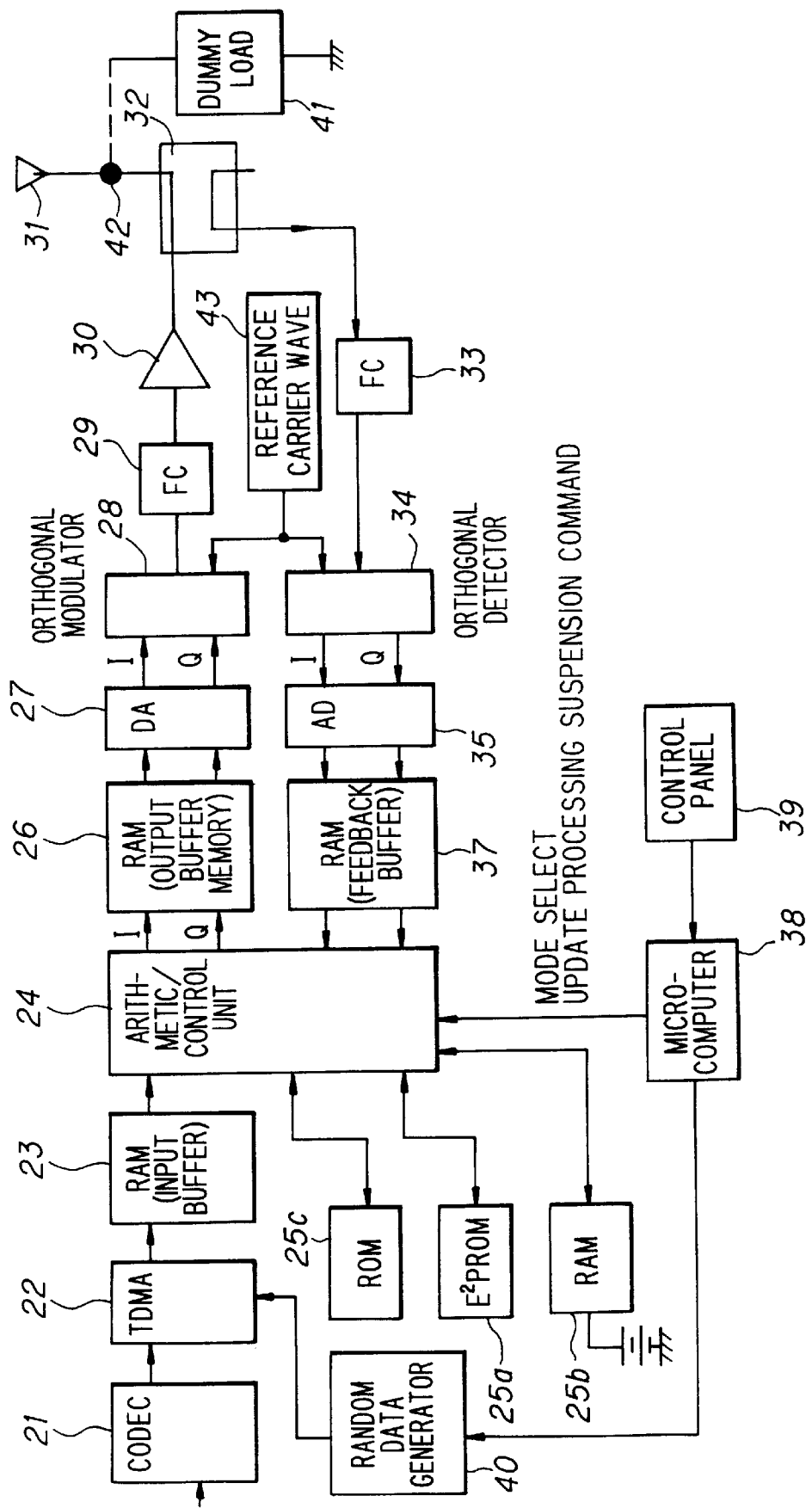
FIG. 27 is a diagram showing the construction of a first embodiment of a radio apparatus having a distortion compensating function for dealing with highspeed data.

(C) Embodiment of Distortion Compensating Processing (a) First Embodiment (a-1) Overall Construction FIG. 27 is a diagram showing the construction of a first embodiment of a radio apparatus according to this aspect of the present invention. Shown in FIG. 27 are the CODEC 21 for converting an audio analog signal to digital data, the TDMA unit 22 for outputting burst data at a predetermined timing preceding an allocated time slot, the input buffer memory (RAM) 23 for storing the burst data, and the arithmetic/control unit 24 constituted by a DSP or the like. The arithmetic/control unit 24:(1) applies pre-distortion processing to the input data (modulating signal) using distortion compensation coefficients h(Pi) conforming to the levels of the input data and outputs the results of processing; and (2) compares the modulating signal with a demodulated signal obtained by demodulation performed by an orthogonal detector and computes/updates the distortion compensation coefficients h(Pi) so as to null the difference between the compared signals.

A non-volatile memory 25a such as an EEPROM is used to store, in advance, distortion compensation coefficients which compensate for the distortion characteristic of a transmission power amplifier, etc. Numeral 25b denotes a RAM backed up by a battery and 25c a ROM for storing various parameters. An output buffer memory (RAM) 26 stores I and Q signals that have been subjected to pre-distortion compensation processing. The DA converter 27 converts the I and Q signals, which have been stored in the output buffer memory 26, to analog baseband signals. The orthogonal modulator 28 multiplies the input I and Q signals by a reference carrier wave and by a signal phase-shifted from the reference carrier by 90°, respectively, adds the two products, thereby performing an orthogonal conversion, and outputs the result. The frequency converter 29 mixes the orthogonally modulated signal and a local oscillation signal to perform an up-conversion, and the transmission power amplifier 30 power-amplifies the carrier-wave signal outputted by the frequency converter 29 and broadcasts the amplified signal-into space from the antenna 31. The directional coupler 32 extracts part of the transmitted signal. The frequency converter 33 mixes the carrier wave and the local oscillation signal to perform a down-conversion. The orthogonal detector 34 multiplies the input signal by the reference carrier wave and by the signal phase-shifted from the reference carrier by 90°, performs orthogonal detection, reproduces the baseband I and Q signals from the transmitting side and enters these signals into an AD converter 35. The latter converts the input I and Q signals that have entered from the orthogonal detector to digital signals. A feedback buffer memory 37 stores the orthogonally detected demodulated data (feedback data).

Numeral 38 denotes a microcomputer, 39 a control panel, 40 a random data generator for generating random data in a maintenance mode, 41 a dummy load having an input impedance (=50Ω) identical with that of the antenna, 42 a connection terminal to which the antenna or dummy load is connected, and 43 a PLL circuit for generating a reference carrier wave.

(a-2) Construction of Orthogonal Modulator and Orthogonal Detector

Figure 28:
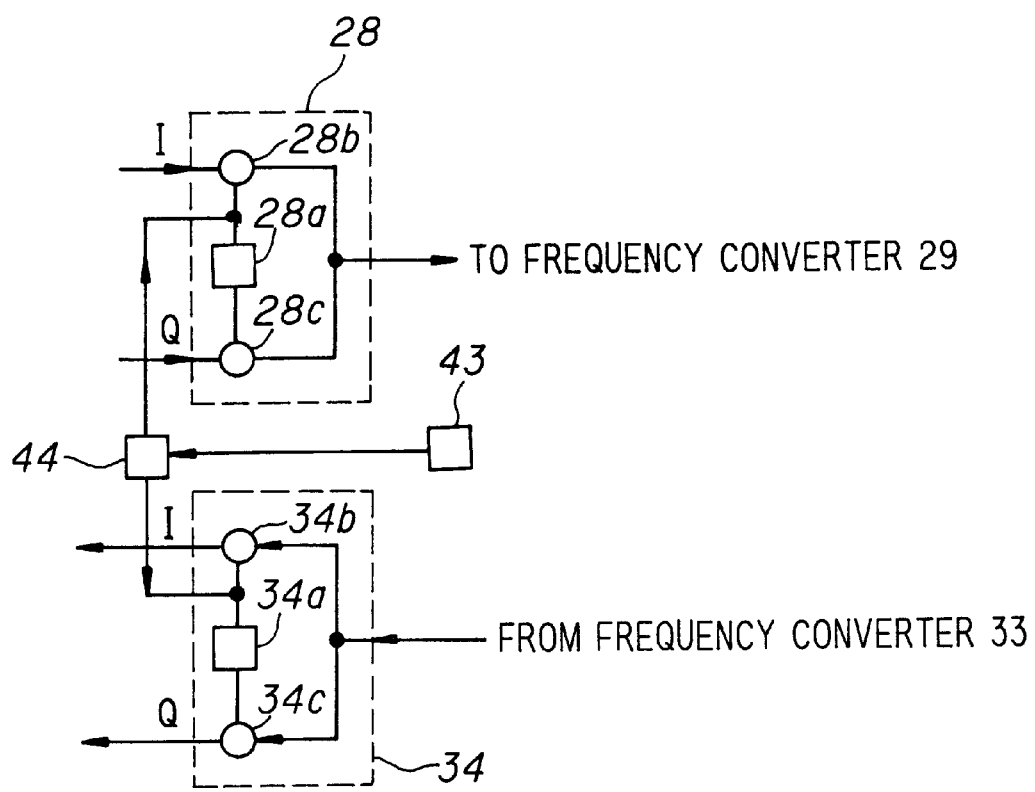
FIG. 28 is a diagram showing the construction of an orthogonal modulator and the construction of an orthogonal detector.

FIG. 28 is a diagram showing the construction of the orthogonal modulator 28 and the construction of the orthogonal detector 34. Numeral 43 denotes the PLL circuit for generating the reference carrier wave. A hybrid circuit 44 branches the reference carrier wave to the orthogonal modulator 28 and orthogonal detector 34. The orthogonal modulator 28 includes a phase shifter 28a for shifting the phase of the reference carrier wave by 90°, a multiplier 28b for multiplying the I signal by the reference carrier wave, and a multiplier 28c for multiplying the Q signal by the reference carrier wave that has been shifted in phase by 90°. The products from the multipliers 28b and 28c are combined and outputted. The orthogonal detector 34 includes a phase shifter 34a for shifting the phase of the reference carrier wave by 90°, a multiplier 34b for multiplying the input signal by the reference carrier wave to produce and output the I signal, and a multiplier 34c for multiplying the input signal by the reference carrier wave that has been shifted in phase by 90°, thereby producing and outputting the Q signal.

(a-3) Control by Arithmetic/Control Unit

Figure 29:
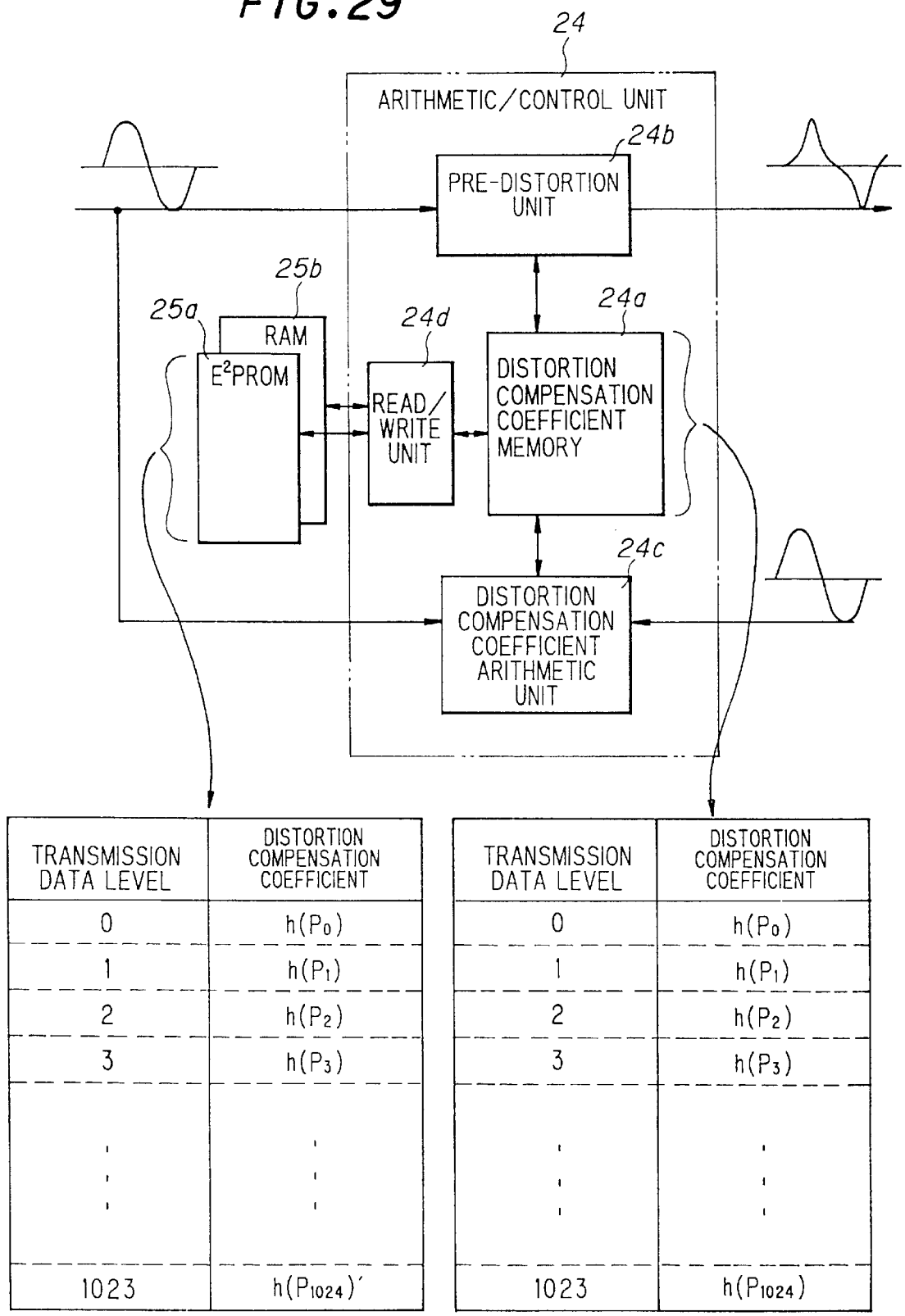
FIG. 29 is a functional block diagram of an arithmetic/control unit.

FIG. 29 is a functional block diagram of the arithmetic/control unit 24. The arithmetic/control unit 24, which is connected to the non-volatile memory 25a such as an EEPROM and to the RAM 25b backed up by a battery, includes a distortion compensation coefficient memory 24a which stores distortion compensation coefficients, a pre-distortion unit 24b which applies pre-distortion processing to transmission data using the distortion compensation coefficients h(Pi) conforming to the transmission data levels (modulating signal levels), a distortion compensation coefficient arithmetic unit 24c for comparing the transmission data (modulating signal) with demodulated data (a demodulated signal) obtained by demodulation using the orthogonal detector 34, updating the distortion compensation coefficients h(Pi) in such a manner that the difference between the compared data becomes zero and storing the updated coefficients in the distortion compensation coefficient memory 24a, and a distortion coefficient read/write unit 24d. Distortion compensation coefficients h(Pi) (i=0~1023) conforming to the input levels 0~1023 of the transmission data are stored in the non-volatile memory 25a in advance.

At the time of initial communication, the distortion coefficient read/write unit 24d sets the distortion compensation coefficients, which have been stored in the non-volatile memory 25a, in the distortion compensation coefficient memory 24a, after which the pre-distortion unit 24b obtains the distortion compensation coefficient h(Pi), which conforms to the level of the transmission data, from the distortion compensation coefficient memory 24a and applies pre-distortion processing to the transmission data in dependence upon this distortion compensation coefficient. For example, the pre-distortion unit 24b multiplies the transmission data by the distortion compensation coefficient and outputs the product. The distortion compensation coefficient arithmetic unit 24c compares the transmission data with the demodulated data obtained by demodulation using the orthogonal detector 34, updates the distortion compensation coefficient h(Pi) in such a manner that the difference between the compared data becomes zero and rewrites the content of the distortion compensation coefficient memory 24a.

Thereafter, the pre-distortion unit 24b performs pre-distortion processing using the updated distortion compensation coefficients and the compensation coefficient arithmetic unit 24c executes processing to update the distortion compensation coefficients. If communication is finished, the distortion coefficient read/write unit 24d stores the content of the distortion compensation coefficient memory 24a in the non-volatile memory 25a or battery backed-up RAM 25b or in both of these memories.

The next time communication is performed, the distortion coefficient read/write unit 24d reads the distortion compensation coefficients out of the RAM 25b and sets them in the distortion compensation coefficient memory 24a. In a case where the data that have been stored in the RAM 25b have been lost because the radio apparatus has not been used for an extended period of time, the distortion compensation coefficients are read out of the non-volatile memory 25a and set in the distortion compensation coefficient memory 24a. Then, when communication ends, the distortion coefficient read/write unit 24d stores the content of the distortion compensation coefficient memory 24a in the non-volatile memory 25a or battery backed-up RAM 25b or in both of these memories.

(a-4) Processing Timing

Figure 30:
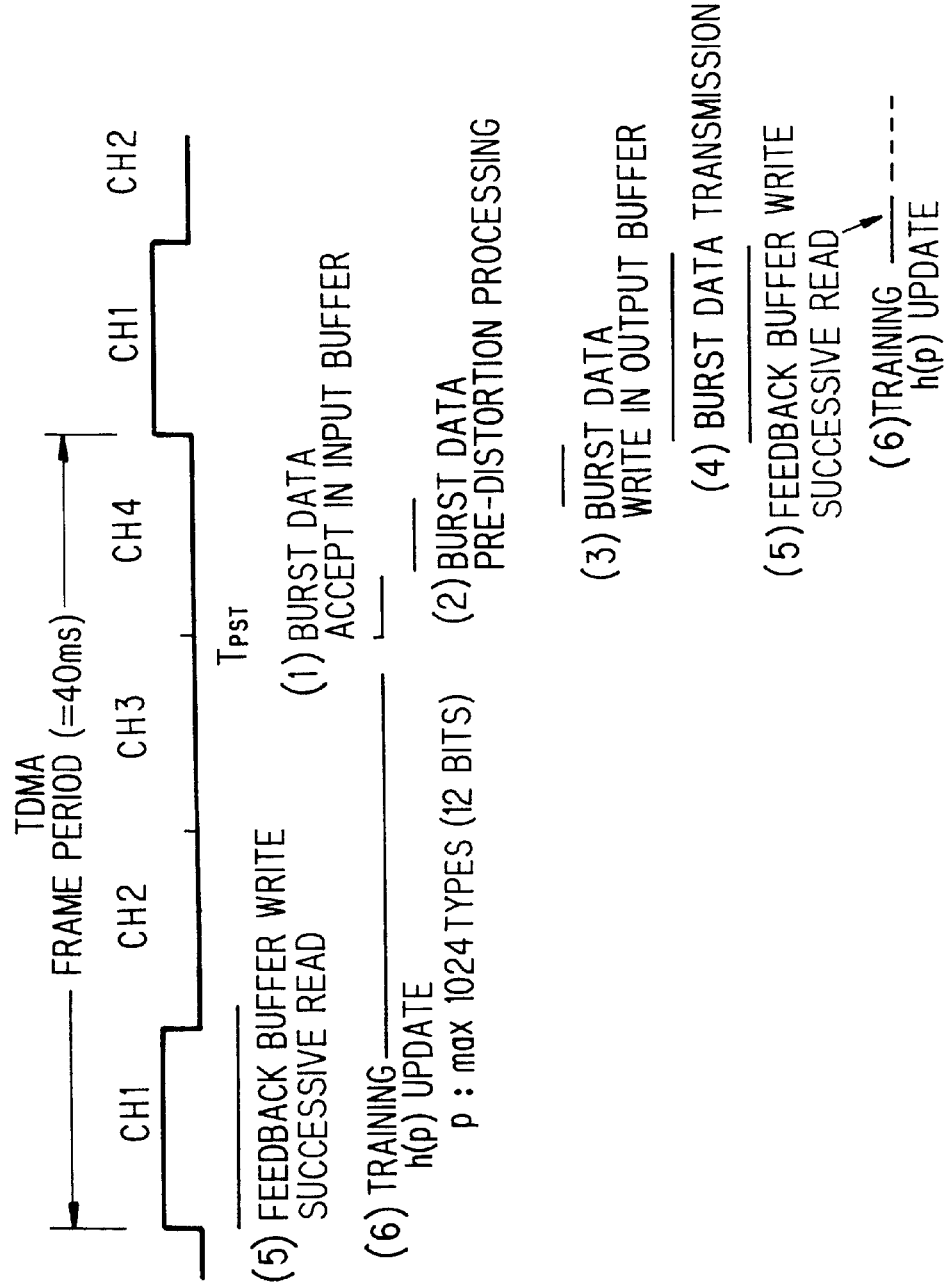
FIG. 30 is a time chart showing processing timing.

FIG. 30 is a time chart showing processing timing according to the first embodiment of this aspect of the invention. One frame of the TDMA is composed of four time slots (channels) CH1~CH4. The first time slot is allocated to the radio apparatus.

(1) The TDMA unit 22 outputs transmission burst data and writes these data in the input buffer 23. The arithmetic/control unit 24 successively accepts the transmission data from the input buffer 23 and (2) converts the data to the I, Q signals prior to the allocated first time slot. (3) The arithmetic/control unit 24 performs pre-distortion processing using the distortion compensation coefficients conforming to the levels of the transmission data and writes the processed data in the output buffer 26.

(4) In the allocated first time slot, the AD converter 27 reads the I and Q signals out of the output buffer 26, converts them to digital signals and enters the digital signals into the orthogonal modulator 28. The orthogonal modulator 28 multiplies the input I and Q signals by the reference carrier wave and by the signal phase-shifted from the reference carrier by 90°, respectively, adds the two products, thereby performing an orthogonal conversion, and outputs the result. The transmission power amplifier 30 power-amplifies the carrier-wave signal frequency-converted by the frequency converter 29 and broadcasts the amplified signal into space from the antenna 31. (5) Part of the carrier wave is branched off by the directional coupler 32, frequency-converted by the frequency converter 33 and entered into the orthogonal detector 34. The orthogonal detector 34 multiplies the input signal by the reference carrier wave and by the signal phase-shifted from the reference carrier by 90° to demodulate the I and Q signals, and the AD converter 35 converts the I and Q signals to digital signals, which are then stored in the feedback buffer 37. The foregoing processing is applied to all of the transmission burst data, and demodulated data obtained by demodulating all of the transmission data are stored in the feedback buffer 37.

(6) In the first time slot and in idle time slots (the second through fourth channels), the arithmetic/control unit 24 reads out and compares, one sample at a time, the transmission-data that have been stored in the input buffer 23 and the demodulated data that have been stored in the feedback buffer 37, executes processing to calculate distortion compensation coefficients in such a manner that the difference between the compared data becomes zero and updates the presently prevailed distortion compensation coefficients by the distortion compensation coefficients just calculated. This is referred to as "training" of distortion compensation coefficients. This processing for updating distortion compensation coefficients is executed for all transmission data and demodulated data.

The distortion compensation coefficients are made to converge to a constant value by subsequently repeating the foregoing operation.

Further, the microcomputer 38 monitors the timing $T_{PST}$ at which the arithmetic/control unit 24 accepts the transmission burst data from the input buffer 23 and starts pre-distortion processing. When the timing $T_{PST}$ arrives, the microcomputer 38 instructs the arithmetic/control unit 24 to suspend the processing (pre-distortion) that updates the distortion compensation coefficients and to start the next operation. In response, the arithmetic/control unit 24 terminates the processing for updating the distortion compensation coefficients and starts pre-distortion processing for the ensuing transmission burst data.

(a-5) Operation

Initial Setting of Distortion Compensation Coefficients in Non-volatile Memory

When the apparatus is tested at the factory, the antenna 31 (FIG. 27) is removed, the dummy load 41 whose impedance is the same as that of the antenna is connected to the terminal 42 and the output of the transmission power amplifier 30 is terminated by the dummy load 41. Under these conditions, the maintenance mode is selected at the control panel 39. When the maintenance mode is established, the microcomputer 38 starts the random data generator 40. In response, the random data generator 40 generates random data, enters the data into the TDMA unit 22 and the latter subjects the data to burst processing and writes the processed data in the input buffer 23. The arithmetic/control unit 24 reads the data from the input buffer 23, uses the distortion compensation coefficients h(Pi) conforming to the data levels to subject the data to pre-distortion processing, outputs the processed data, compares the transmission data and the demodulated data, which has been obtained by feeding back and detecting the modulated signal, in the apparatus's own time slot and in the idle time slots, and updates the distortion compensation coefficients h(Pi). The arithmetic/control unit 24 subsequently repeats the foregoing operation in such a manner that the distortion compensation coefficients h(Pi) converge to constant values. If convergence to the constant values is achieved, the arithmetic/control unit 24 writes the distortion compensation coefficients h(Pi) into the EEPROM 25a or RAM 25b, which is backed up by a battery.

By applying the foregoing operation for setting the distortion compensation coefficients to each radio apparatus, the distortion compensation coefficients conforming to the distortion characteristic of each individual can be obtained and can be initially set in the non-volatile memory or backed-up RAM.

It should be noted that the random data generator 40 can be eliminated and that random data can be entered into the CODEC 21 externally.

Operation when Apparatus is Put into Service

Figure 31:
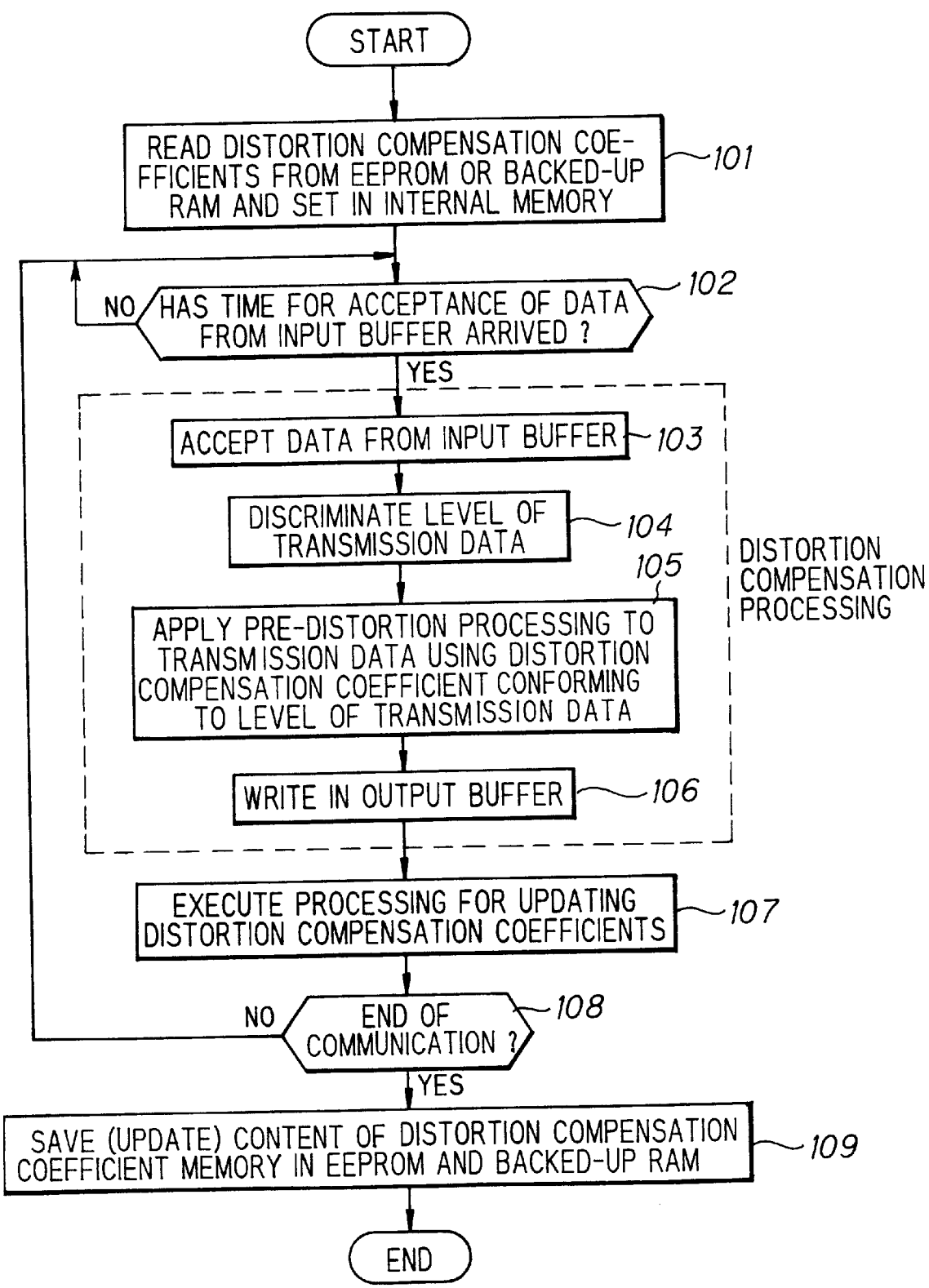
FIG. 31 is a flowchart of processing executed by the arithmetic/control unit.

FIG. 31 is a flowchart of processing executed by the arithmetic/control unit 24 when the apparatus is put into service.

When start of communication is commanded by the microcomputer 38, the arithmetic/control unit 24 reads the distortion compensation coefficients from the EEPROM 25a or backed-up RAM 25b and writes the coefficients in the distortion compensation coefficient memory 24a (FIG. 29) (step 101).

The microcomputer 38 monitors the timing $T_{PST}$ at which pre-distortion processing is started (step 102). When the timing $T_{PST}$ arrives, the microcomputer 38 instructs the arithmetic/control unit 24 to accept the transmission data from the input buffer 23. In response, the arithmetic/control unit 24 reads the transmission data out of the input buffer one sample at a time (step 103), discriminates the level of the transmission data and obtains the distortion compensation coefficient conforming to the level from the distortion compensation coefficient memory 24a (step 104). Next, the arithmetic/control unit 24 converts the transmission data to the I and Q signals, uses the distortion compensation coefficients to apply pre-distortion to the I and Q signals and writes the result in the output buffer 26 (steps 105, 106). Thereafter, the data that has been written in the output buffer is orthogonally modulated and transmitted in the allocated time slot. Further, the transmitted signal is orthogonally detected and stored in the feedback buffer 37.

In parallel with the transmission of burst data in the allocated time slot, the arithmetic/control unit 24, in the first time slot and in idle time slots, reads out and compares, one sample at a time, the transmission data that have been stored in the input buffer 23 and the demodulated data that have been stored in the feedback buffer 37, executes processing to calculate distortion compensation coefficients in such a manner that the difference between the compared data becomes zero and updates the presently prevailed distortion compensation coefficients by the distortion compensation coefficients just calculated. This processing for updating distortion compensation coefficients is executed for each sample in the apparatus' own time slot and in the idle time slots (step 107).

Next, the arithmetic/control unit 24 determines whether communication has ended (step 108) and executes the processing from step 102 onward if communication has not ended. If communicated has ended, the arithmetic/control unit 24 stores the content of the distortion compensation coefficient memory 24a in the non-volatile memory 25a and backed-up RAM 25b (step 109). The next time communication is performed, the arithmetic/control unit 24 reads the distortion compensation coefficients out of the RAM 25b, sets them in the distortion compensation coefficient memory 24a and executes the foregoing operation.

Thus, when the apparatus is tested at the factory, the dummy load is connected and the computations for distortion compensation are performed. The resulting distortion compensation coefficients h(Pi) are stored in the non-volatile memory. When the apparatus is put into service, training for distortion compensation is started using the distortion compensation coefficients h(Pi). As a result, the initial transmission can be started using distortion compensation coefficients that conform to the transmission characteristic of each apparatus. It is possible to prevent the emission of radio waves having a widened band and the time required for convergence to the optimum distortion compensation coefficients can be shortened.

(a-6) Modifications

First Modification

Figures 32, 34:
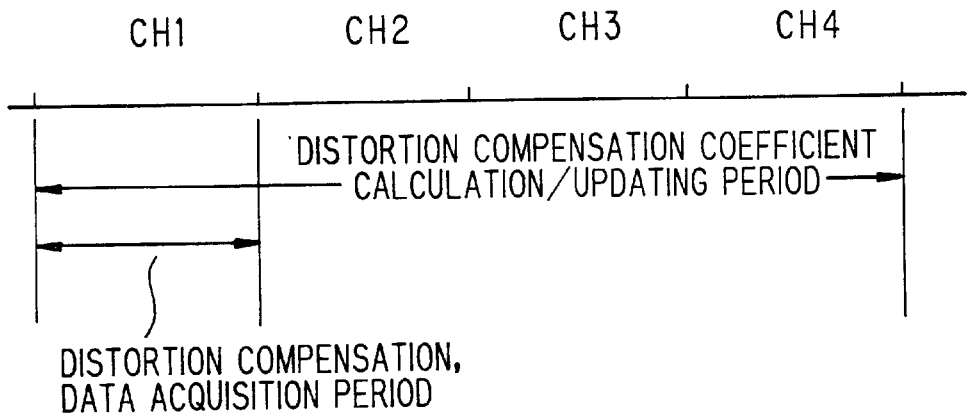
FIG. 32 is a diagram for describing a case in which data are transmitted in a plurality of time slots.
FIG. 34 is a diagram for describing the stored contents of a memory, which stores distortion compensation coefficients, when processing for updating the distortion compensation coefficients is omitted in a case where levels are identical.

In the foregoing, a case is described in which the radio apparatus is capable of transmitting burst data in one allocated time slot. However, the invention is also applicable to a case where data are transmitted in a plurality of time slots, as in the manner of the base station apparatus of a mobile radio system. More specifically, (1) in a prescribed time slot (e.g., the first time slot CH1), the transmission data are subjected to pre-distortion processing and then transmitted, and the transmitted data and demodulated data are stored in memory, as shown in FIG. 32. (2) In the first time slot and other time slots, the transmission data are subjected to pre-distortion processing, the processed data are outputted, and the distortion compensation coefficients are calculated and updated using the transmission data and demodulated data of the first time slot.

Figure 33:
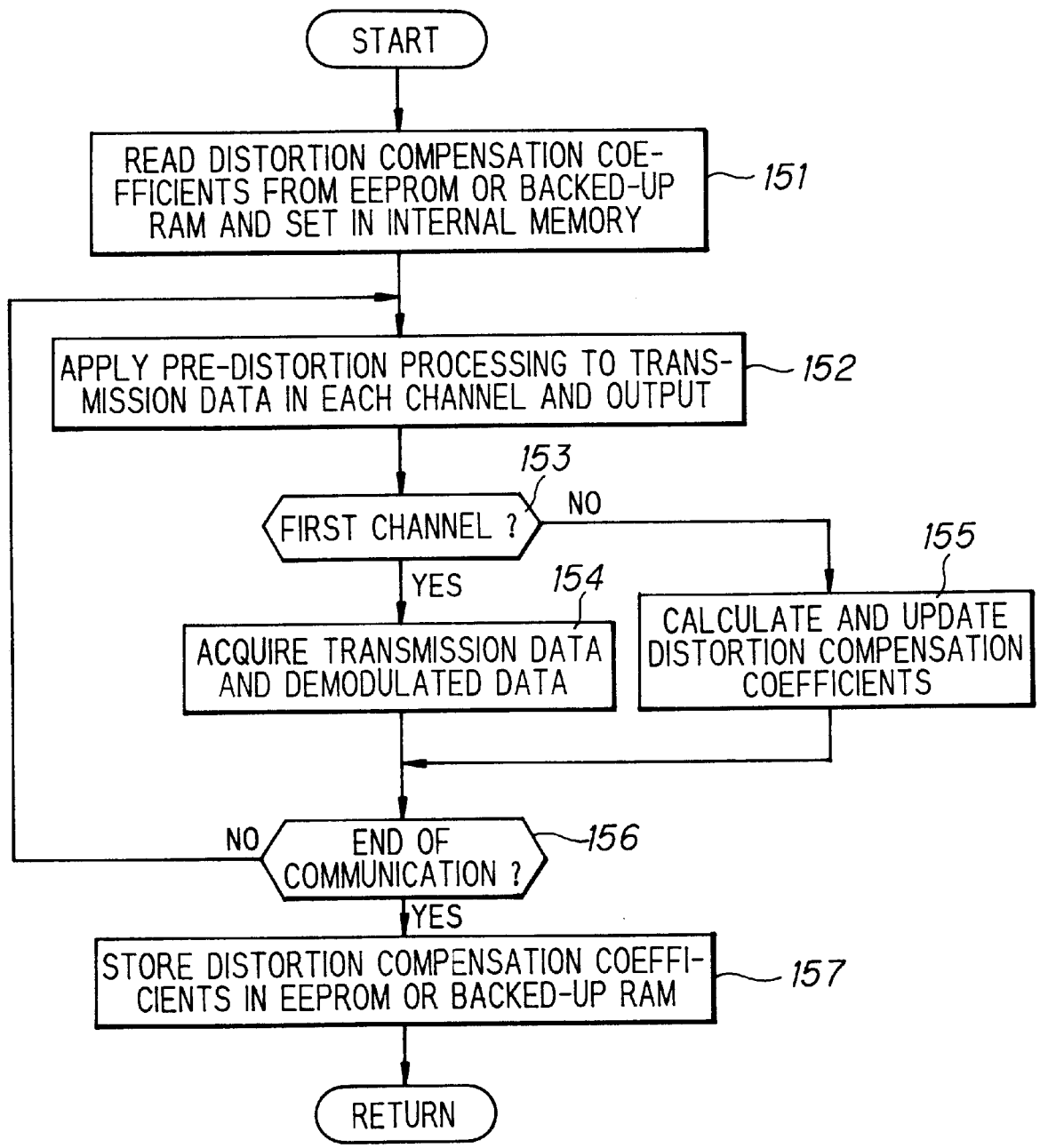
FIG. 33 is a flowchart of processing executed by the arithmetic/control unit in a radio apparatus which transmits data in a plurality of time slots.

FIG. 33 is a flowchart of processing executed by the arithmetic/control unit 24 in the case described above.

When the start of communication is instructed, the arithmetic/control unit 24 reads the distortion compensation coefficients out of the EEPROM 25a or RAM 25b backed up by the battery and writes these coefficients in the internally provided distortion compensation coefficient memory 24a (step 151).

Next, the arithmetic/control unit 24 converts the transmission data to the I and Q signals. Then, prior to each time slot (channel), the arithmetic/control unit 24 discriminates the level of the transmission data, obtains the distortion compensation coefficient corresponding to this level from the distortion compensation coefficient memory 24a, applies pre-distortion processing to the transmission data using this distortion compensation coefficient and outputs the processed data (step 152). The arithmetic/control unit 24 determines whether the time slot is the first time slot (the first channel) (step 153) and, if it is, gathers the transmission data and demodulated data in memory (step 154). If the time slot is not the first time slot, the arithmetic/control unit 24 subjects the data to be sent in this time slot to pre-distortion processing based upon the above-mentioned distortion compensation coefficient prior to the time slot and then sends the processed data to the output buffer memory. The arithmetic/control unit 24 thenceforth executes processing for calculating and updating distortion compensation coefficients using the saved transmission data and demodulated data of the first time slot (step 155). The arithmetic/control unit 24 checks to see whether communication has ended (step 156) and, if it has not, repeats the processing from step 152 onward. If communication has ended, the arithmetic/control unit 24 stores the content of the distortion compensation coefficient memory 24a in the non-volatile memory 25a and backed-up RAM 25b (step 157). The next time communication is performed, the distortion compensation coefficients are read out of the RAM 25b and set in the distortion compensation coefficient memory 24a, whereupon the above-described operation is executed.

Thus, even if the radio apparatus is one which transmits data in a plurality of time slots, the initial transmission can be started using the distortion compensation coefficients that conform to the transmission characteristic of the apparatus. It is possible to prevent the emission of radio waves having a widened band and the time required for convergence to the optimum distortion compensation coefficients can be shortened.

Second Modification

In the processing for updating the distortion compensation coefficients as described above, the arithmetic/control unit 24 calculates distortion compensation coefficients with regard to all transmission data and updates the old distortion compensation coefficients using the distortion compensation coefficients obtained by calculation. However, if transmission data have the same levels, the updating processing in such case would be needless since the same distortion compensation coefficients would be calculated. In such case, therefore, the arithmetic/control unit 24 executes the coefficient updating processing for every level of the transmission data. Then, if there are transmission data of a level for which updating has already been performed in one TDMA frame, the arithmetic/control unit 24 eliminates the calculation of distortion compensation coefficients with regard to these transmission in this TDMA frame. Adopting this expedient makes it possible to reduce the calculation of distortion compensation coefficients as well as the number of times updating is performed. In a case where the transmission speed is high or even if the duration of idle time slots is short, the updating of the distortion compensation coefficients can be performed satisfactorily and the apparatus can cope with high-speed transmission.

FIG. 34 is a diagram for describing the data stored in the distortion compensation coefficient memory 24a in the case mentioned above. Flags are provided to indicate whether distortion compensation coefficients have been updated or not.

Figure 35:
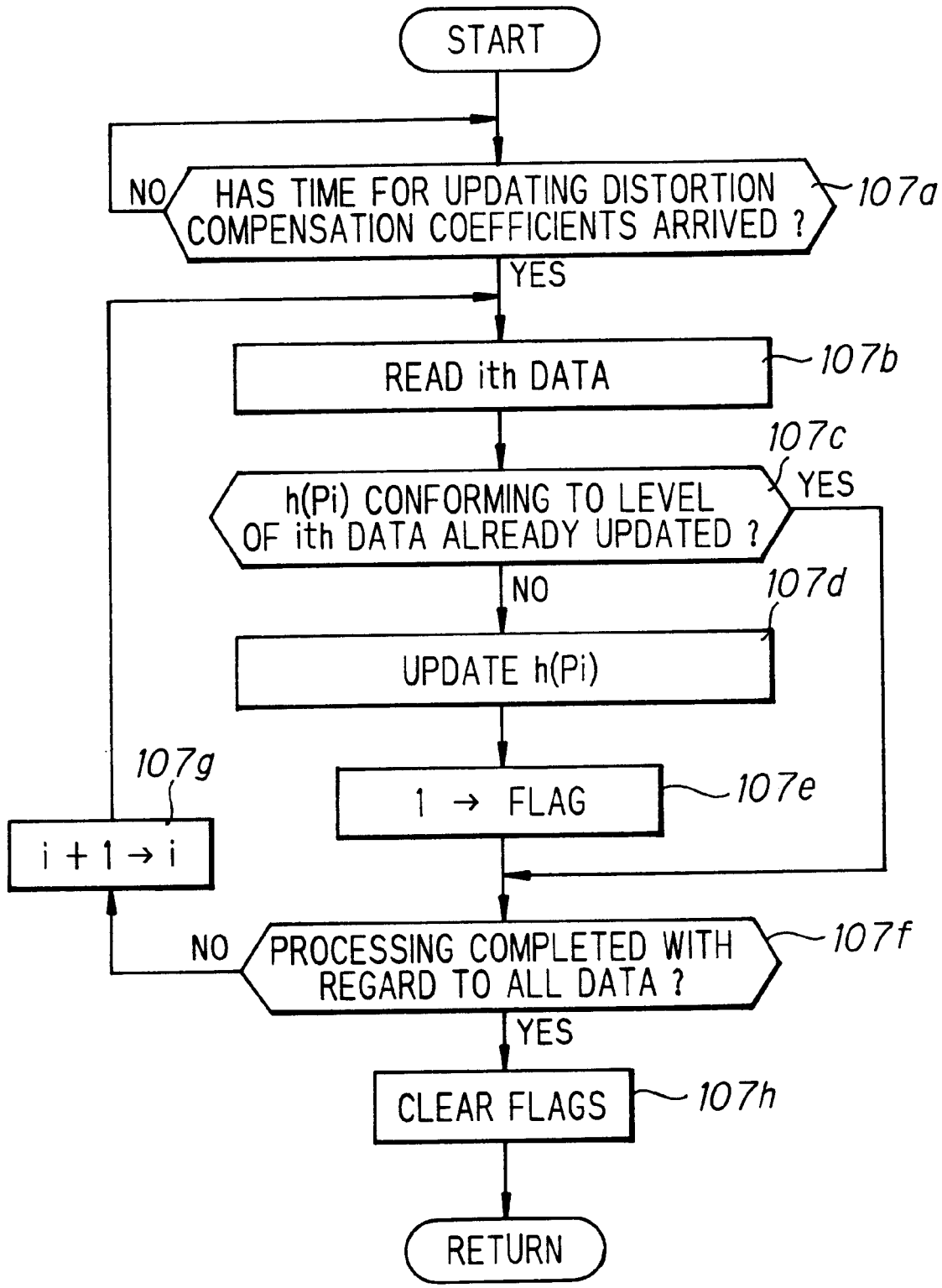
FIG. 35 is a flowchart of processing for updating distortion compensation coefficients.

FIG. 35 is a flowchart of processing for updating distortion compensation coefficients in a case where processing for updating distortion compensation coefficients is omitted when levels are identical. It should be noted that all of the flags in the distortion compensation coefficient memory 24a are initially cleared to "0".

The arithmetic/control unit 24 determines whether the timing for updating the distortion compensation coefficients has arrived (step 107a). If the decision rendered is "YES", then the arithmetic/control unit 24 reads the ith (the initial value of i is 1) transmission data and demodulated data from the input buffer 23 and feedback buffer 37 (step 107b). Next, the arithmetic/control unit 24 examines the level of the ith transmission data to determine whether the flag conforming to this level is "1", i.e., whether the distortion compensation coefficient of this level has already been updated (step 107c). If the flag is "0", the distortion compensation coefficient h(Pi) is calculated using the transmission data and demodulated data and updates the old distortion compensation coefficient of the level by the calculated distortion compensation coefficient h(Pi) (step 107d). Next, the arithmetic/control unit 24 sets the flag conforming to this level to "1" (step 107e) and checks to see whether processing has been completed with regard to all transmission data (step 107f). If the answer is "NO", then the arithmetic/control unit 24 increments i (step 107g) and repeats the processing from step 107b onward.

On the other hand, if it is found at step 107c that the flag is "1", this means that the distortion compensation coefficient has already been updated. Accordingly, the arithmetic/control unit 24 executes the decision step 107f without executing processing for calculating and updating the distortion compensation coefficient.

If processing regarding all of the transmission data in one time slot is finished, the arithmetic/control unit 24 clears all of the flags in the distortion compensation coefficient memory 24a to "0" (step 107h) and waits for the arrival of the next time at which coefficient updating processing is to be executed.

(b) Second Embodiment

In the first embodiment, transmission data are subjected to pre-distortion processing, the processed data are transmitted and the transmitted data and demodulated data are stored, this being performed in the allocated time slot. Processing for updating distortion compensation coefficients is executed using these data in the apparatus' own time slot and in idle time slots. With this method, however, a distortion compensation coefficient is updated only one time for each level over the duration of one TDMA frame. In other words, even if identical levels appear n times, the distortion compensation coefficients are updated only one time with regard to these levels. Consequently, it takes time for the distortion compensation coefficients to converge.

Figure 36:
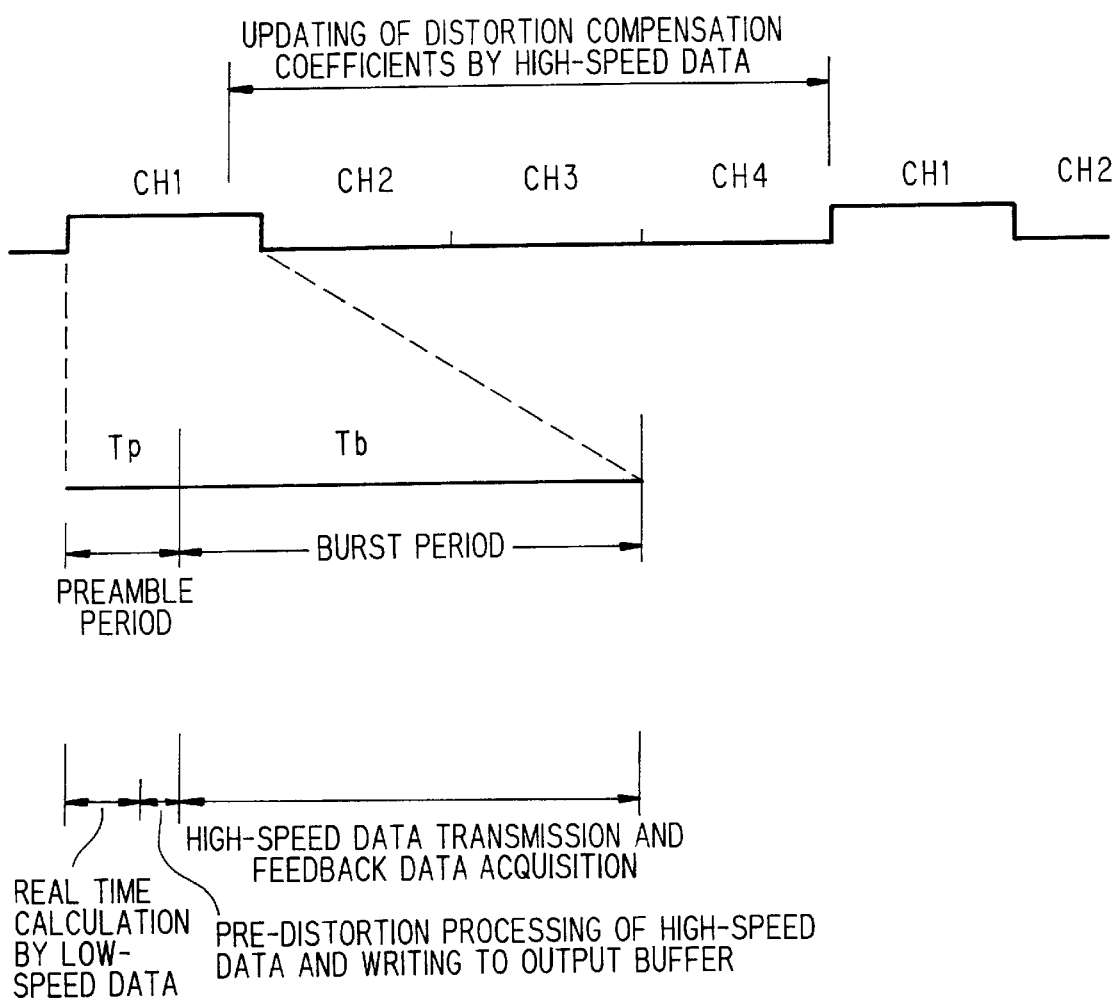
FIG. 36 is a diagram for describing a second embodiment of a radio apparatus having a distortion compensating function for dealing with high-speed data.

In the second embodiment, therefore, if a time slot has a burst period Tb during which data are transmitted and a preamble period Tp placed ahead of the burst period, as shown in FIG. 36, then, in the preamble period Tp, the arithmetic/control unit 24 enters the low-speed data into the arithmetic/control unit 24, calculates and updates distortion compensation coefficients in real time using the low-speed data, subjects the data that are to be sent in the burst period to pre-distortion processing using the updated distortion compensation coefficients and stores the processed data in the output buffer. The arithmetic/control unit 24 transmits the data in the burst period. At this time, the high-speed data transmitted in the burst period and the demodulated data fed back are saved. The distortion compensation coefficients are calculated and updated in the apparatus's own time slot and in idle time slots. Since the distortion compensation coefficients are thus updated in real time using low-speed data, the updating in one time slot is performed a plurality of times and, as a result, the distortion compensation coefficients can be made to converge in a short period of time.

Figure 37:
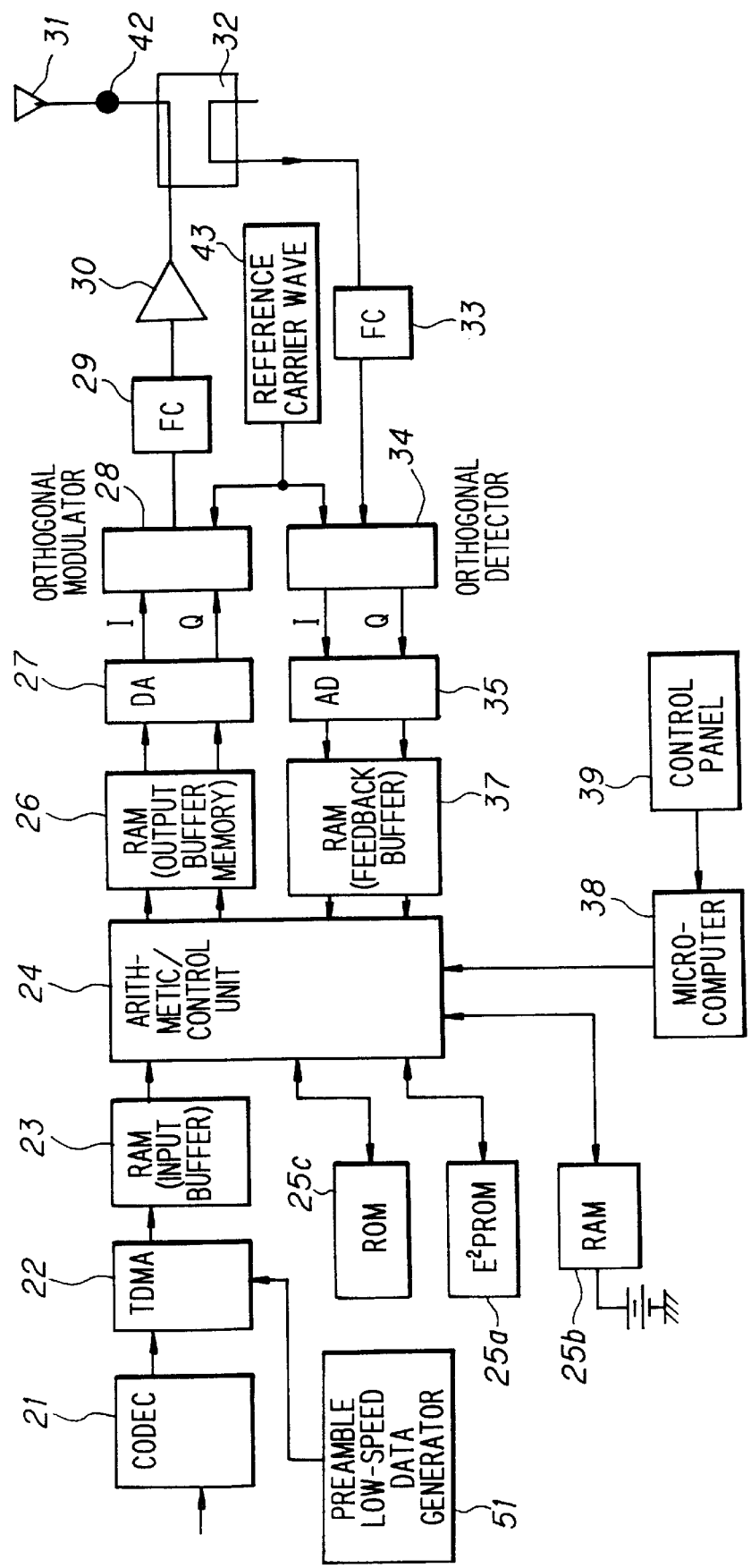
FIG. 37 is a diagram showing the construction of the second embodiment of the radio apparatus having a distortion compensating function for dealing with high-speed data.

FIG. 37 is a diagram showing the construction of a radio apparatus according to a second embodiment of this aspect of the invention. Elements in FIG. 37 identical with those of the first embodiment in FIG. 27 are designated by like reference characters. This embodiment differs from the first embodiment in that (1) a data generator 51 is provided to generate low-speed (e.g., 8 kbps) data in the preamble period Tp, and (2) the random data generator 40 and dummy load 41 of the first embodiment are deleted from the drawing.

When the start of communication is instructed by the microcomputer 38, the arithmetic/control unit 24 reads the distortion compensation coefficients out of the EEPROM 25a or RAM 25b backed up by the battery and writes these coefficients in the internally provided distortion compensation coefficient memory 24a.

The TDMA 22 writes low-speed data, which enter from the data generator 51, into the input buffer 23 in the preamble period Tp of the time slot allocated to the apparatus itself. Whenever the low-speed data are written in the input buffer 23, the arithmetic/control unit 24 reads the low-speed data and obtains the distortion compensation coefficient that conforms to the level of the data from the distortion compensation coefficient memory 24a. Next, the arithmetic/control unit 24 uses the distortion compensation coefficient to apply pre-distortion processing to the data that have been obtained by converting the transmission data to the I and Q signals and writes the processed data in the output buffer 26. The data that have been written in the output buffer are orthogonally modulated immediately and then transmitted. Further, the transmission data are orthogonally detected and stored in the feedback buffer 37. The arithmetic/control unit 24 reads out the low-speed data that have been stored in the input buffer 23 as well as the demodulated data that have been stored in the feedback buffer 37, compares the data that have been read, executes processing to calculate the distortion compensation coefficient in such a manner that the difference between the data is eliminated and updates the old distortion compensation coefficient by the distortion compensation coefficient just calculated. The processing for updating the distortion compensation coefficient is executed in real time with regard to all low-speed data.

Though writing to and reading from the input buffer memory 23 and output buffer memory 26 is performed one sample at a time, means may be provided for bypassing the buffer memories.

When the burst period of the apparatus' own time slot nears, the TDMA 22 writes the burst data in the input buffer 23 and the arithmetic/control unit 24 subjects the high-speed burst data to pre-distortion processing one sample at a time and writes the processing data in the output buffer 26. The data that have been written in the output buffer are subsequently orthogonally modulated and transmitted in the burst period and the transmitted signal is orthogonally detected and stored in the feedback buffer 37 successively.

Next, the arithmetic/control unit 24 reads out the transmitted data of the burst period that have been stored in the input buffer 23 as well as the demodulated data that have been stored in the feedback buffer 37, compares the data that have been read, executes processing to calculate the distortion compensation coefficient in such a manner that the difference between the data approaches zero and updates the presently prevailing distortion compensation coefficient by the distortion compensation coefficient just calculated. The processing for updating the distortion compensation coefficient is executed in real time with regard to all burst data.

The foregoing operation is then repeated. If communication has ended, the arithmetic/control unit 24 stores the content of the distortion compensation coefficient memory in the non-volatile memory 25a and RAM 25b. The next time communication is performed, the distortion compensation coefficients are read out of the RAM 25b and set in the internally provided arithmetic/control unit 24, whereupon the above-described operation is executed.

(c) Third Embodiment (c-1) Construction

Figure 38:
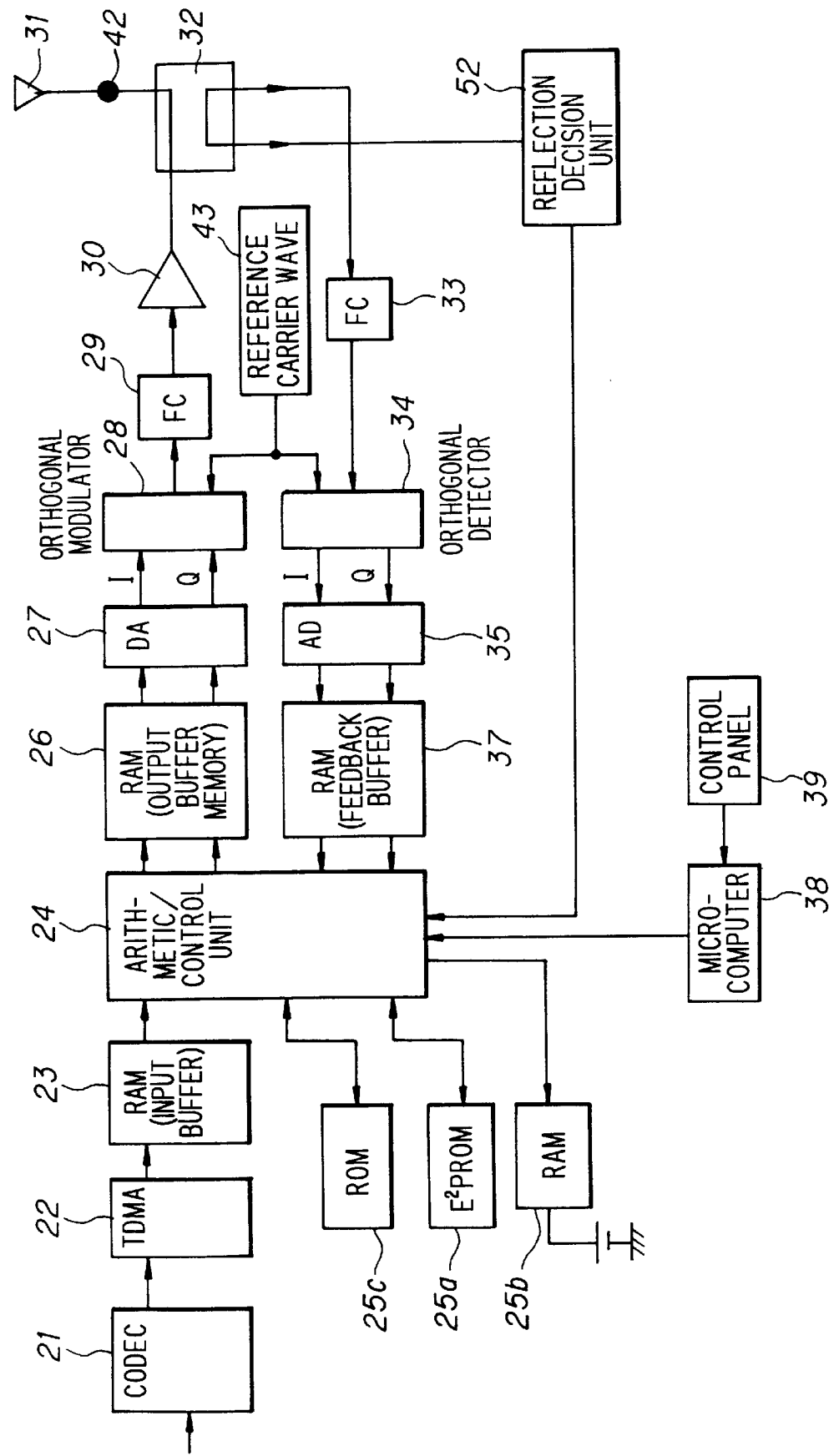
FIG. 38 is a diagram showing the construction of a third embodiment of a radio apparatus having a distortion compensating function for dealing with high-speed data.

FIG. 38 is a diagram showing the construction of a third embodiment, in which elements identical with those of the first embodiment in FIG. 27 are designated by like reference characters. This embodiment differs from the first embodiment in that (1) a reflection decision unit 52 is provided for detecting waves reflected by the antenna and determining whether the level of the reflected waves is greater than a set value, and (2) when the level of the reflected waves is greater than the set value, the arithmetic/control unit 24 does not execute the processing for the updating of distortion compensation coefficients.

(c-2) Operation

When the level of reflected waves is greater than the set value, this means that the characteristic of the antenna has changed and that the input impedance has changed correspondingly. Distortion compensation coefficients are valid in a case where the input impedance of the antenna exhibits a predetermined value (e.g., 50Ω). Accordingly, demodulated data obtained when the level of reflection is greater than the set value are not reliable. If processing for updating distortion compensation coefficients is executed in such case, the distortion compensation coefficients will diverge from the optimum values. In the third embodiment, therefore, it is so arranged that the arithmetic/control unit 24 will not execute the processing for updating distortion compensation coefficients when the reflection level is greater than the set value, thereby preventing the distortion compensation coefficients from diverging from the optimum values. In the third embodiment, the operation for initially setting the distortion compensation coefficients in the non-volatile memory 25a, the processing for distortion compensation when the apparatus is put into actual service and the processing for updating distortion compensation coefficients are executed in exactly the same way as set forth in the first embodiment.

When the apparatus is in actual service, the reflection decision unit 52 detects, via the directional coupler 32, the waves reflected by the antenna 31 and determines whether the reflection level is greater than the set value. If the reflection level is greater than the set level, the reflection decision unit 52 so notifies the arithmetic/control unit 24. As a result, the arithmetic/control unit 24 halts the processing for updating distortion compensation coefficients until the reflection level falls below the set value.

(c-3) Modification

Figure 39:
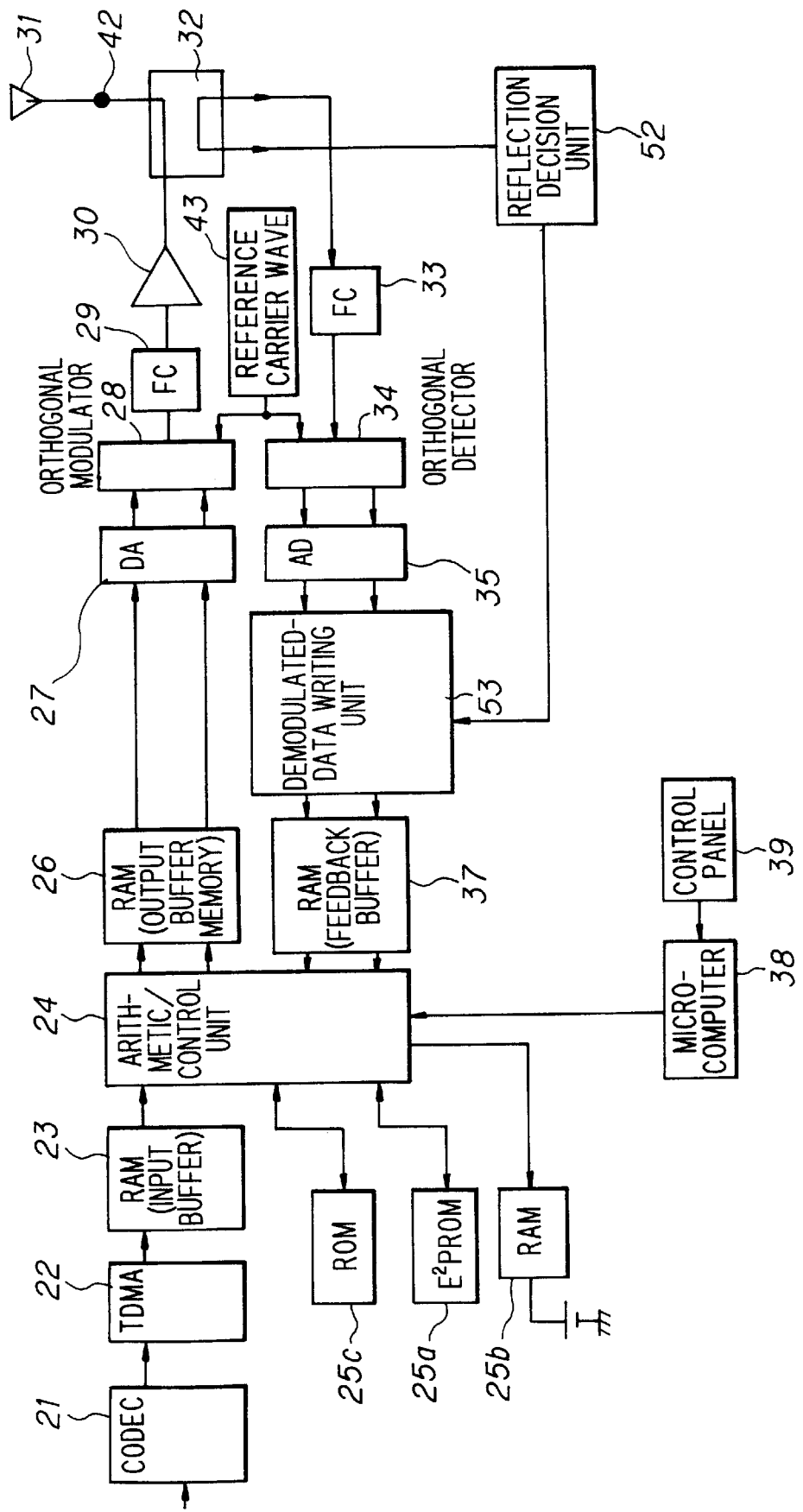
FIG. 39 is a diagram showing the construction of a radio apparatus which is a modification of the third embodiment.

FIG. 39 is a diagram showing the construction of a modification of the third embodiment. This modification differs from FIG. 38 in that (1) a demodulated-data writing unit 53 is provided for adding detection information onto demodulated data which prevail when the reflection level is greater than the set value and then writing the data in the feedback buffer 37, and (2) the arithmetic/control unit 24 does not calculate and update distortion compensation coefficients with regard to demodulated data onto which the detection information has been added. When the apparatus is in actual service, the reflection decision unit 52 detects the waves reflected by the antenna 31 and determines whether the reflection level is greater than the set value. If the reflection level is greater than the set level, the reflection decision unit 52 so notifies the demodulated-data writing unit 53. As a result, the demodulated-data writing unit 53 adds the detection information onto the demodulated data and writes the data in the buffer memory 37 until the reflection level falls below the set value. When distortion compensation coefficients are updated, the arithmetic/control unit 24 determines whether the detection information has been added onto the demodulated data. The arithmetic/control unit 24 updates distortion compensation coefficients if the detection information has not been added on and does not update the distortion compensation coefficients if detection information has been added on.

An arrangement can also be adopted in which the write address of demodulated data which prevail when the reflection level is greater than the set value is pointed out to the arithmetic/control unit 24 without adding the detection information onto the demodulated data, with the arithmetic/control unit 24 not updating distortion compensation coefficients with regard to demodulated data at the above-mentioned address.

(d) Fourth Embodiment

Figure 40:
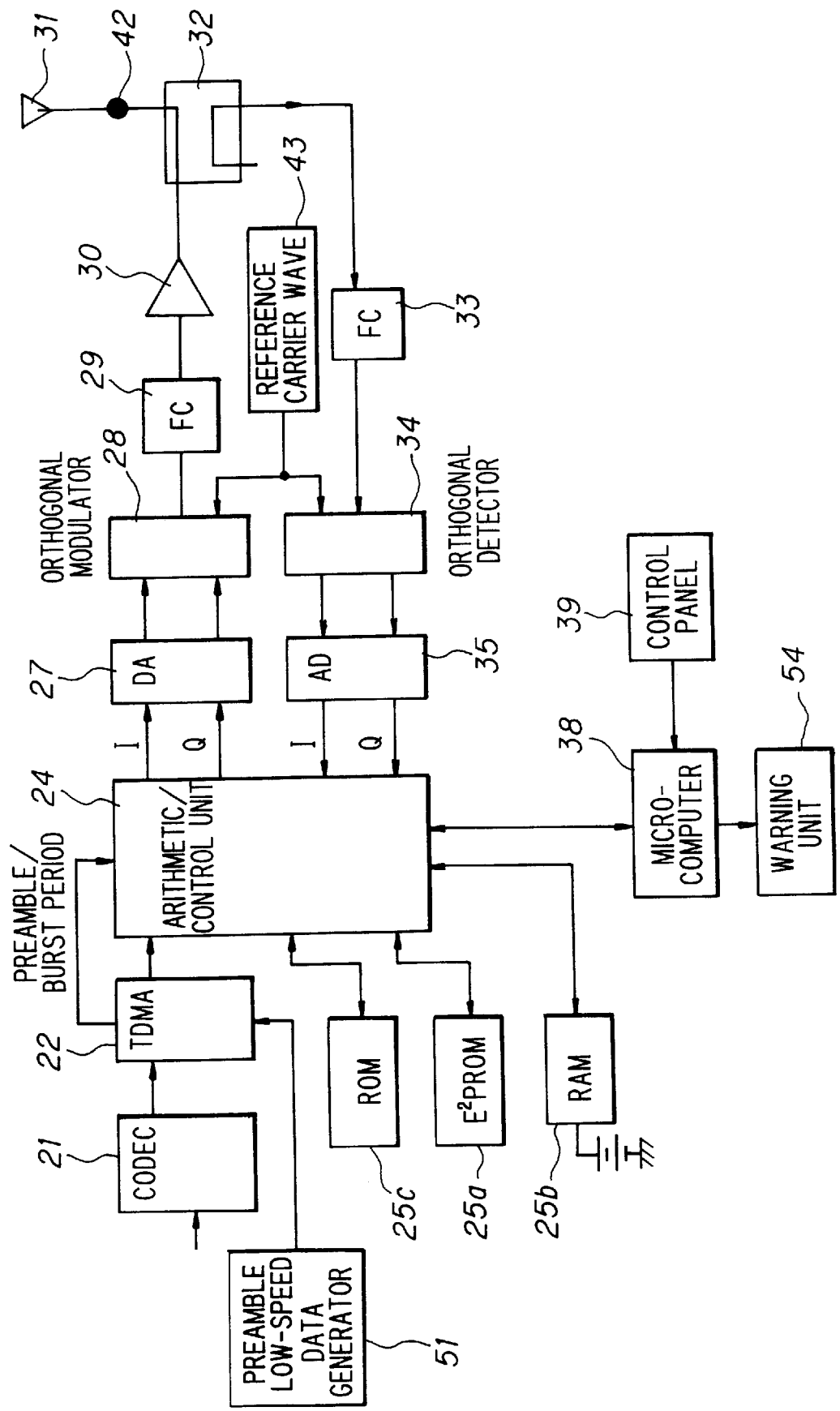
FIG. 40 is a diagram showing the construction of a fourth embodiment of a radio apparatus having a distortion compensating function for dealing with high-speed data.

FIG. 40 is a diagram showing the construction of a radio apparatus according to a fourth embodiment, in which elements identical with those of the first embodiment in FIG. 27 are designated by like reference characters. This embodiment differs from the first embodiment of FIG. 27 in that (1) the input buffer, output buffer and feedback buffer are eliminated, (2) the data generator 51 is provided for generating low-speed data and the TDMA unit 22 enters the low-speed data into the arithmetic/control unit 24 in the preamble period, (3) a warning unit 54 is provided for warning of the fact that a distortion compensation coefficient is not a suitable value, and (4) the arithmetic/control unit 24 compares the low-speed data and demodulated data in real time in the preamble period, determines whether a distortion compensation coefficient is suitable or not based upon the difference between the compared data, and outputs a warning or disables data transmission in a case where the difference is large and, hence, the distortion compensation coefficient is unsuitable.

In the first embodiment, the transmitted data are subjected to pre-distortion processing, the data that have been subjected to distortion compensation processing are transmitted and the demodulated data are saved, these operations being executed in the allocated time slot. The processing for updating distortion compensation coefficients is executed in the apparatus' own time slot and in the idle time slots. However, the first embodiment requires the input buffer, output buffer and feedback buffer. This raises the cost of the apparatus. It should be noted that since the distortion compensation coefficients are set in the non-volatile memory (EEPROM) 25a in such a manner that the distortion characteristic of the radio apparatus can be compensated for before the apparatus is shipped from the factory, the distortion compensation coefficients need not be updated if the distortion characteristic of the radio apparatus does not change.

Accordingly, in the fourth embodiment, each buffer is removed and it is so arranged that the processing for updating distortion compensation coefficients is not executed in the idle time slots. However, if the distortion characteristic changes and a distortion compensation coefficient takes on a value that is not appropriate, the band will spread and interference will be produced between adjacent channels. Accordingly, the TDMA unit 22 enters the low-speed data into the arithmetic/control unit 24 in the preamble period and the arithmetic/control unit 24 subjects the low-speed data to pre-distortion processing, outputs the processed data, compares the low-speed data and the demodulated data in real time, calculates the distortion compensation coefficients, uses the calculated distortion compensation coefficients to apply pre-distortion processing to the burst data as well and places the apparatus in service. If there is not enough time for execution of the processing for updating all distortion compensation coefficients because calculations are performed only in the preamble period and this results in a large deviation between the transmitted and the demodulated data, a warning is issued or the data transmission is disabled. If this arrangement is adopted, the buffers can be eliminated and a lower-cost radio apparatus can be provided. Moreover, if distortion compensation coefficients become unsuitable owing to a fluctuation in the characteristic of the transmitting section, such as in the transmission power amplifier, the user is capable of ascertaining the fact immediately and of dealing with the situation.

Figure 41:
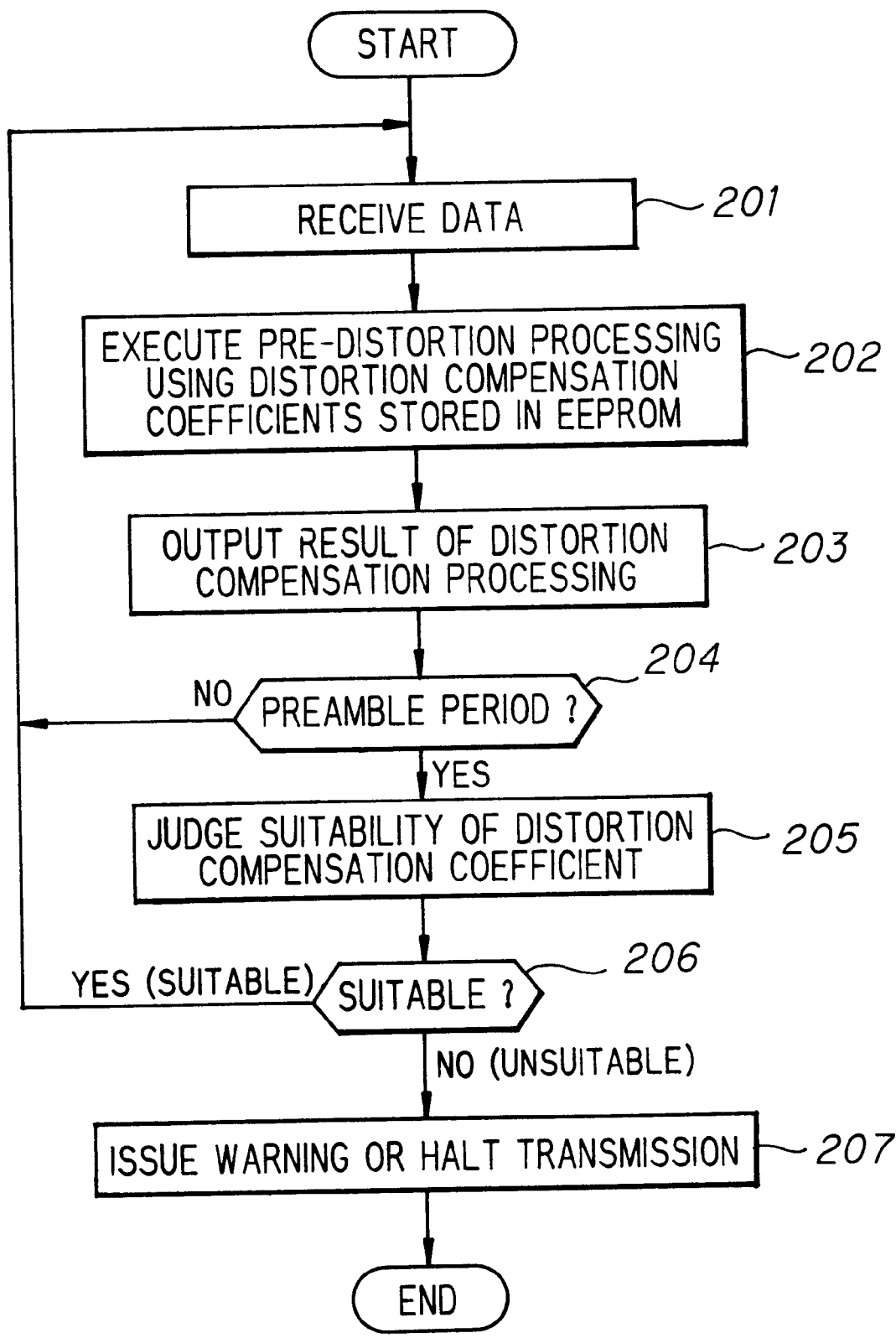
FIG. 41 is a flowchart of processing executed by the arithmetic/control unit in the fourth embodiment.

FIG. 41 is a flowchart of processing executed by the arithmetic/control unit 24. Upon receiving the transmission data from the TDMA 22 (step 201), the arithmetic/control unit 24 uses the distortion compensation coefficients, which have been stored in the EEPROM 25a, to apply pre-distortion processing (step 202) after the transmission data have been converted to the I and Q signals. The results are then outputted (step 203). The I and Q signals that have been subjected to the pre-distortion processing enter the orthogonal modulator 28 via the DA converter 27 and are subjected to an orthogonal conversion. The orthogonally converted carrier wave is frequency-converted, amplified by the transmission power amplifier 30 and broadcast from the antenna. Part of the carrier wave is frequency-converted by the frequency converter 33, the output of the converter 33 is applied to the orthogonal detector 34 where the signal is demodulated to the I and Q signals, and the I and Q signals are applied to the arithmetic/control unit 24 upon being converted to digital signals by the AD converter 35.

The arithmetic/control unit 24 determines whether the prevailing period is the preamble period or the burst period (step 204). The processing from step 201 onward is repeated if the period is not the preamble period. If the period is the preamble period, however, the arithmetic/control unit 24 compares the low-speed data and the demodulated data in real time, calculates distortion compensation coefficients, updates the distortion compensation coefficients and determines whether the distortion compensation coefficients are suitable (step 205). If the difference between the low-speed data and demodulated data is large and updating of the distortion compensation coefficients cannot be performed fully only during the preamble, a warning signal is applied to the microcomputer 38 and an alarm is generated or transmission of data is halted (steps 206 and 207). If the difference is small and the distortion compensation coefficients have suitable values, then processing from step 201 onward is repeated.

When distortion compensation coefficients are initially set in the non-volatile memory (EEPROM) 25a in the fourth embodiment, the low-speed data are entered into the arithmetic/control unit 24, updating of the distortion compensation coefficients is performed in real time and the distortion compensation coefficients are written in the non-volatile memory after convergence.

(e) Fifth Embodiment

Figure 42:
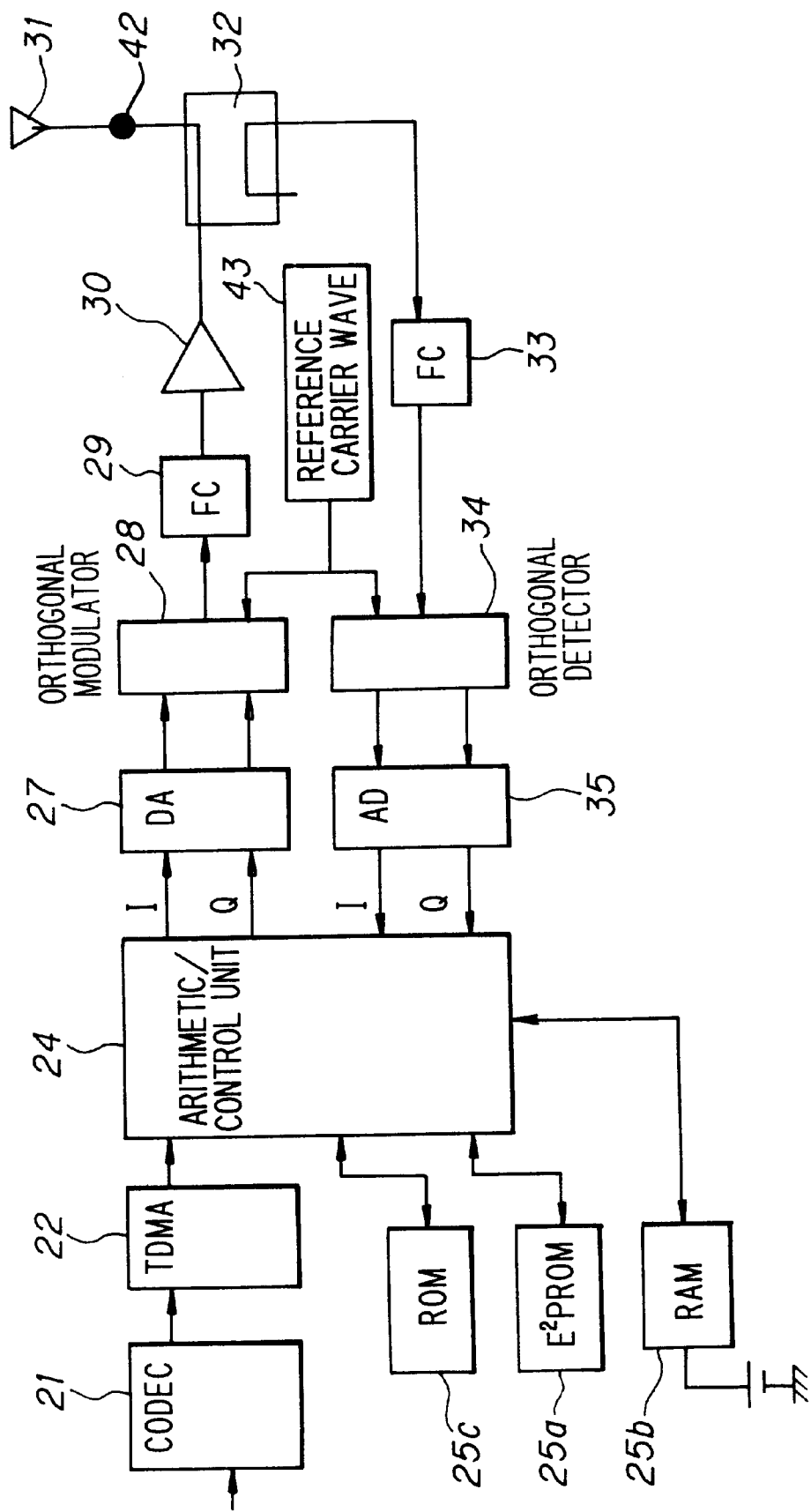
FIG. 42 is a diagram showing the construction of a fifth embodiment of a radio apparatus having a distortion compensating function for dealing with high-speed data.

FIG. 42 is a diagram showing the construction of a radio apparatus according to a fifth embodiment, in which elements identical with those of the first embodiment in FIG. 27 are designated by like reference characters. This embodiment differs from the first embodiment of FIG. 27 in that (1) the input buffer, output buffer and feedback buffer are eliminated and (2) the arithmetic/control unit 24 calculates and updates distortion compensation coefficients in real time using part of the transmission data as well as demodulated data obtained by demodulating a modulated signal which is the result of modulation by part of the transmission data.

In the first embodiment, the transmission data are subjected to pre-distortion processing, the data that have been subjected to distortion compensation processing are transmitted and the demodulated data are saved, these operations being executed in the allocated time slot. The processing for updating distortion compensation coefficients is executed in the apparatus' own time slot and in the idle time slots. The reason for thus executing the processing for updating distortion compensation coefficients in the idle time slots is that the distortion compensation coefficients cannot be updated in real time because of the high speed of the transmission. However, the first embodiment requires the input buffer, output buffer and feedback buffer and results in higher cost.

Accordingly, in the fifth embodiment, distortion compensation coefficients are calculated and updated once in real time with regard to some of the transmission data, e.g., n items (n samples) of the input data. If this arrangement is adopted, the distortion compensation coefficients can be updated in real time every n times even if the transmission is a high-speed transmission. Moreover, the input buffer, output buffer and feedback buffer can be eliminated.

Figure 43:
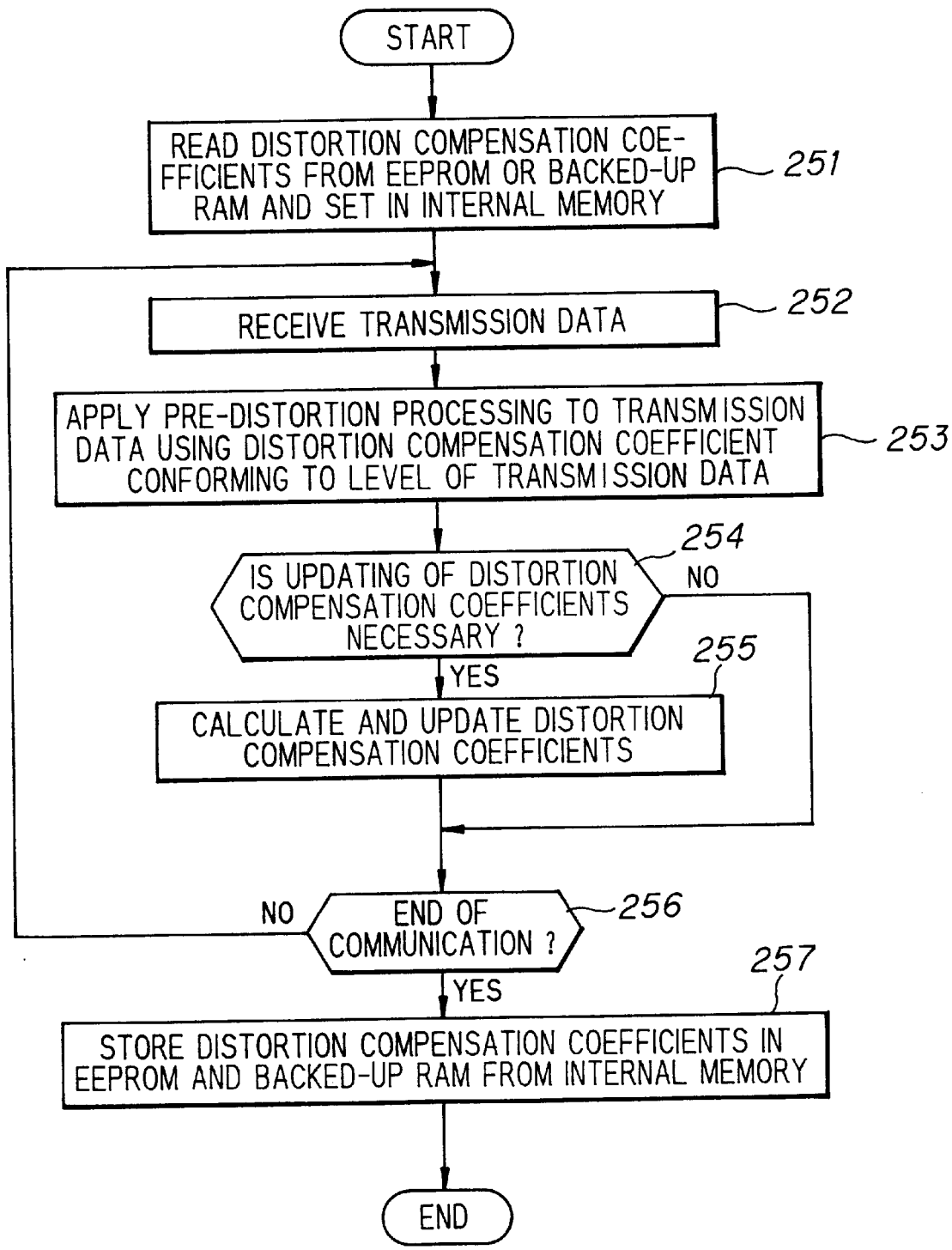
FIG. 43 is a flowchart of processing executed by the arithmetic/control unit in the fifth embodiment.

FIG. 43 is a flowchart of processing executed by the arithmetic/control unit 24 in the fifth embodiment.

When the start of communication is instructed, the arithmetic/control unit 24 reads the distortion compensation coefficients out of the EEPROM 25a or RAM 25b backed up by the battery and writes these coefficients in the internally provided distortion compensation coefficient memory (step 251). Next, upon receiving the transmission data from the TDMA 22, the arithmetic/control unit 24 converts the transmission data to the I and Q signals (step 252), applies pre-distortion processing to the transmission data using the distortion compensation coefficients and outputs the results (step 253). The I and Q signals that have been subjected to the pre-distortion processing enter the orthogonal modulator 28 via the DA converter 27 and are subjected to an orthogonal conversion. The orthogonally converted carrier wave is frequency-converted, amplified by the transmission power amplifier 30 and broadcast from the antenna. Part of the carrier wave is frequency-converted by the frequency converter 33, the output of the converter 33 is applied to the orthogonal detector 34 where the signal is demodulated to the I and Q signals, and the I and Q signals are applied to the arithmetic/control unit 24 upon being converted to digital signals by the AD converter 35.

The arithmetic/control unit 24 is adapted to update distortion compensation coefficients of n samples once in real time. The arithmetic/control unit 24 determines whether it is necessary to execute updating of distortion compensation coefficients with regard to the presently prevailing transmission data (step 254).

If updating of distortion compensation coefficients is required, the arithmetic/control unit 24 executes processing for updating distortion compensation coefficients using the transmission data and demodulated data (step 255). Thereafter, or if it is found at step 254 that updating of the distortion compensation coefficients is unnecessary, the arithmetic/control unit 24 determines whether communication has ended (step 256). If the answer is "NO", then the processing from step 252 onward is repeated. If communication has ended, the arithmetic/control unit 24 stores the content of the internal distortion compensation coefficient memory in the non-volatile memory 25a and backed-up RAM 25b (step 257). The next time communication is performed, the distortion compensation coefficients are read out of the RAM 25b and set in the internal distortion compensation coefficient memory, whereupon the above-described operation is executed.

If this arrangement is adopted, the input buffer, output buffer and feedback buffer can be eliminated. In addition, if the number of data samples in one time slot is N, the processing for updating the distortion compensation coefficients can be executed N/n times in real time.

(f) Sixth Embodiment

Figure 44:
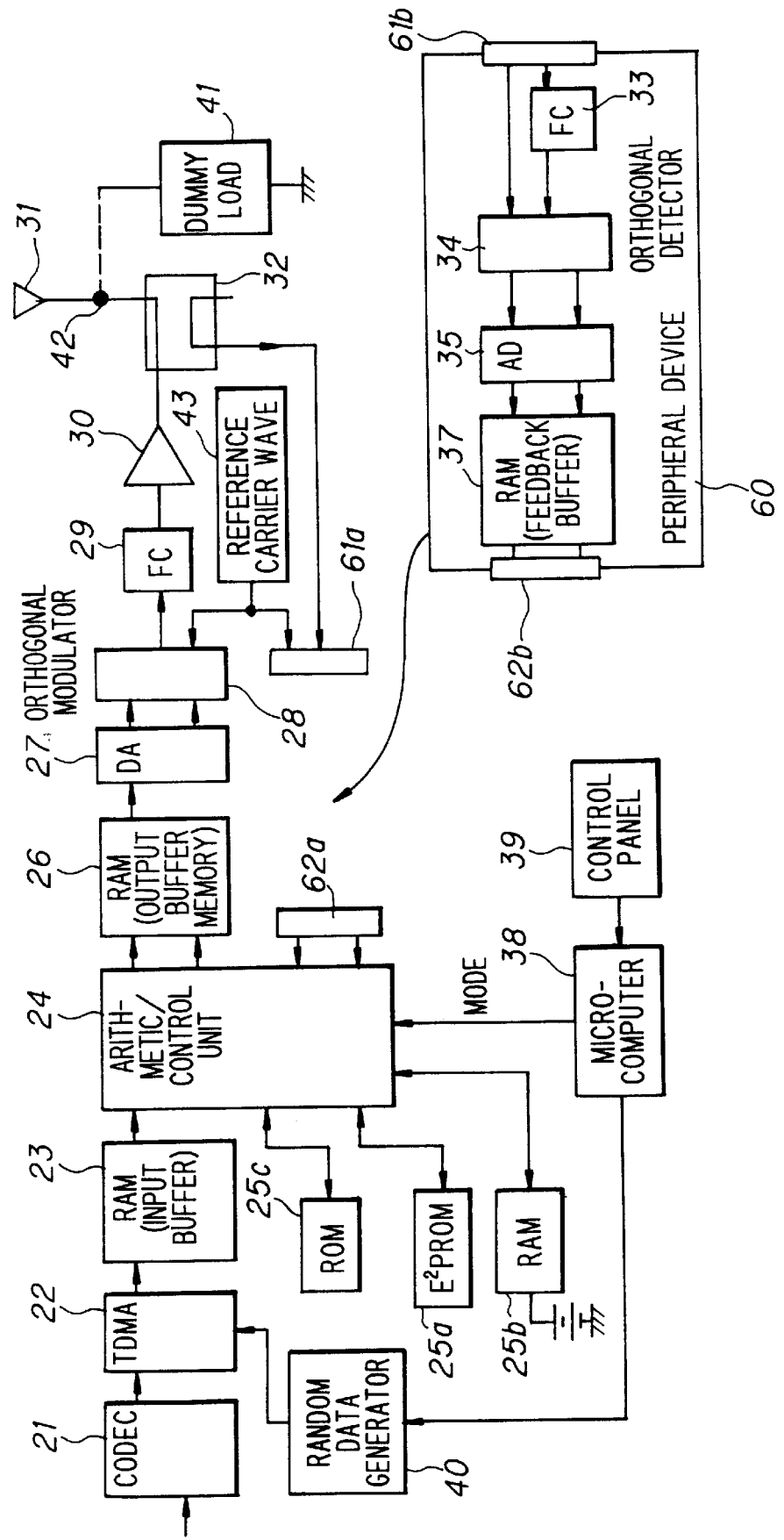
FIG. 44 is a diagram showing the construction of a radio apparatus according to a sixth embodiment.
Figure 45:
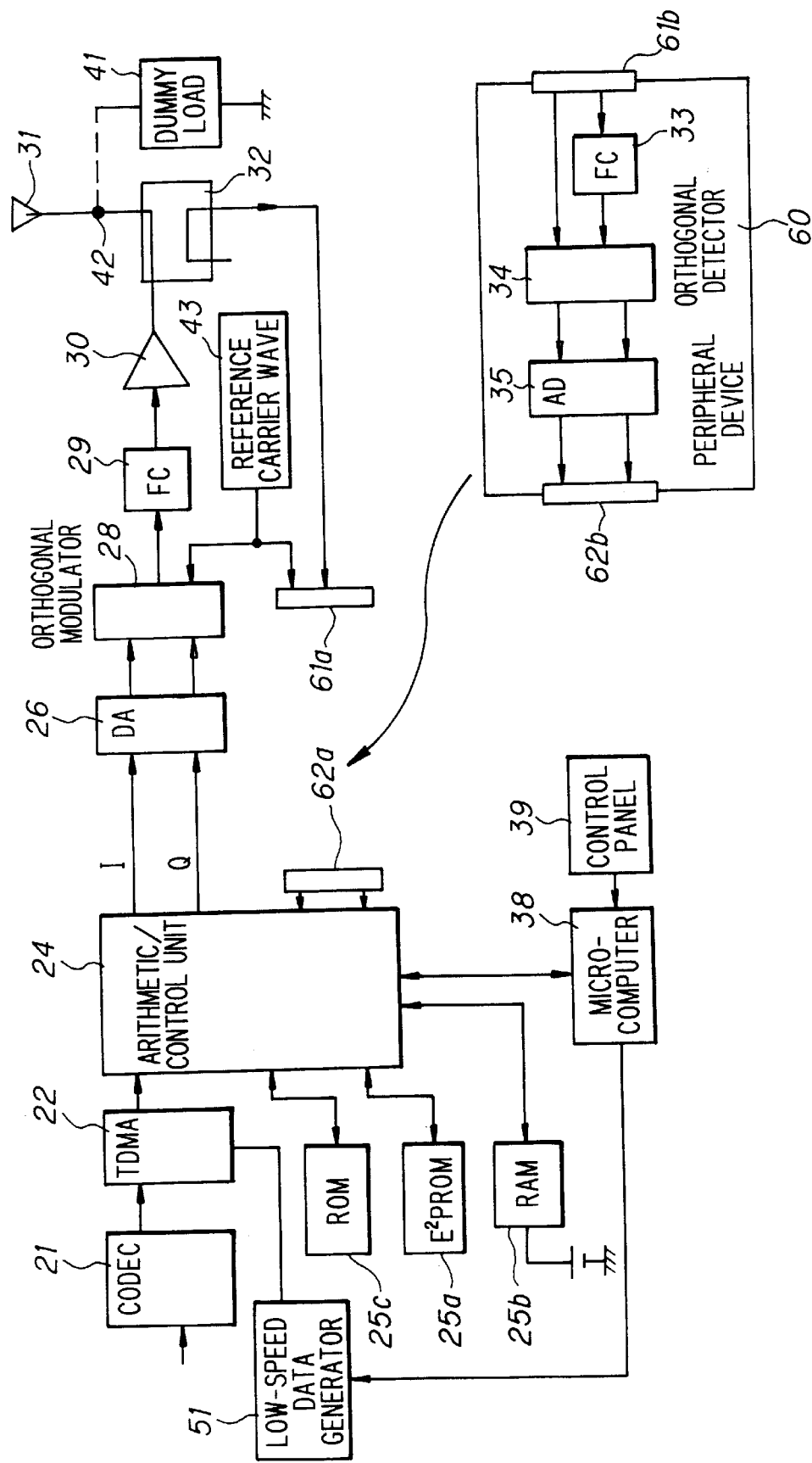
FIG. 45 is a diagram showing the construction of a radio apparatus which is a modification of the sixth embodiment.

FIG. 44 is a diagram showing the construction of a radio apparatus according to a sixth embodiment, in which elements identical with those of the first embodiment in FIG. 27 are designated by like reference characters. This embodiment differs from the first embodiment of FIG. 27 in that (1) a section for demodulating an orthogonally modulated signal and entering the demodulated data into the arithmetic/control unit 24 is provided as a peripheral device and is capable of being detachably connected to the radio apparatus, and (2) the updating of distortion compensation coefficients is not carried out when the apparatus is actually working.

In the first embodiment, the transmission data are subjected to pre-distortion processing and the demodulated data that have been fed back are saved in the allocated time slot. The processing for calculating and updating distortion compensation coefficients is executed in the apparatus' own time slot and in the idle time slots. However, the first embodiment requires the section for entering the demodulated data into the arithmetic/control unit 24 (this section comprising the frequency converter 33, the orthogonal detector 34, the AD converter 35 and the feedback buffer 37). The result is a radio apparatus that is high in cost and large in size. Since the distortion compensation coefficients are initially set in the n on-volatile memory (EEPROM) 25a in such a manner that the distortion characteristic of the radio apparatus can be compensated for before the apparatus is shipped from the factory, the distortion compensation coefficients need not be updated if the distortion characteristic of the radio apparatus does not change.

Accordingly, in the sixth embodiment, the section (the frequency converter 33, the orthogonal detector 34, the AD converter 35 and the feedback buffer 37) for demodulating the orthogonally modulated signal and entering the demodulated data into the arithmetic/control unit 24 is provided as a peripheral device 60 and it is so arranged that the peripheral device 60 can be freely detachably connected to the radio apparatus by connectors 61a and 62b. Before the apparatus is shipped from the factory, the peripheral device 60 and the dummy load are connected to the radio apparatus, the distortion compensation coefficients are made to converge and are then initially set in the non-volatile memory (EEPROM) 25a or RAM 25b backed up by the battery. The peripheral device 60 and dummy load 41 are then detached from the apparatus and the apparatus is shipped.

(g) Seventh Embodiment

Figure 46:
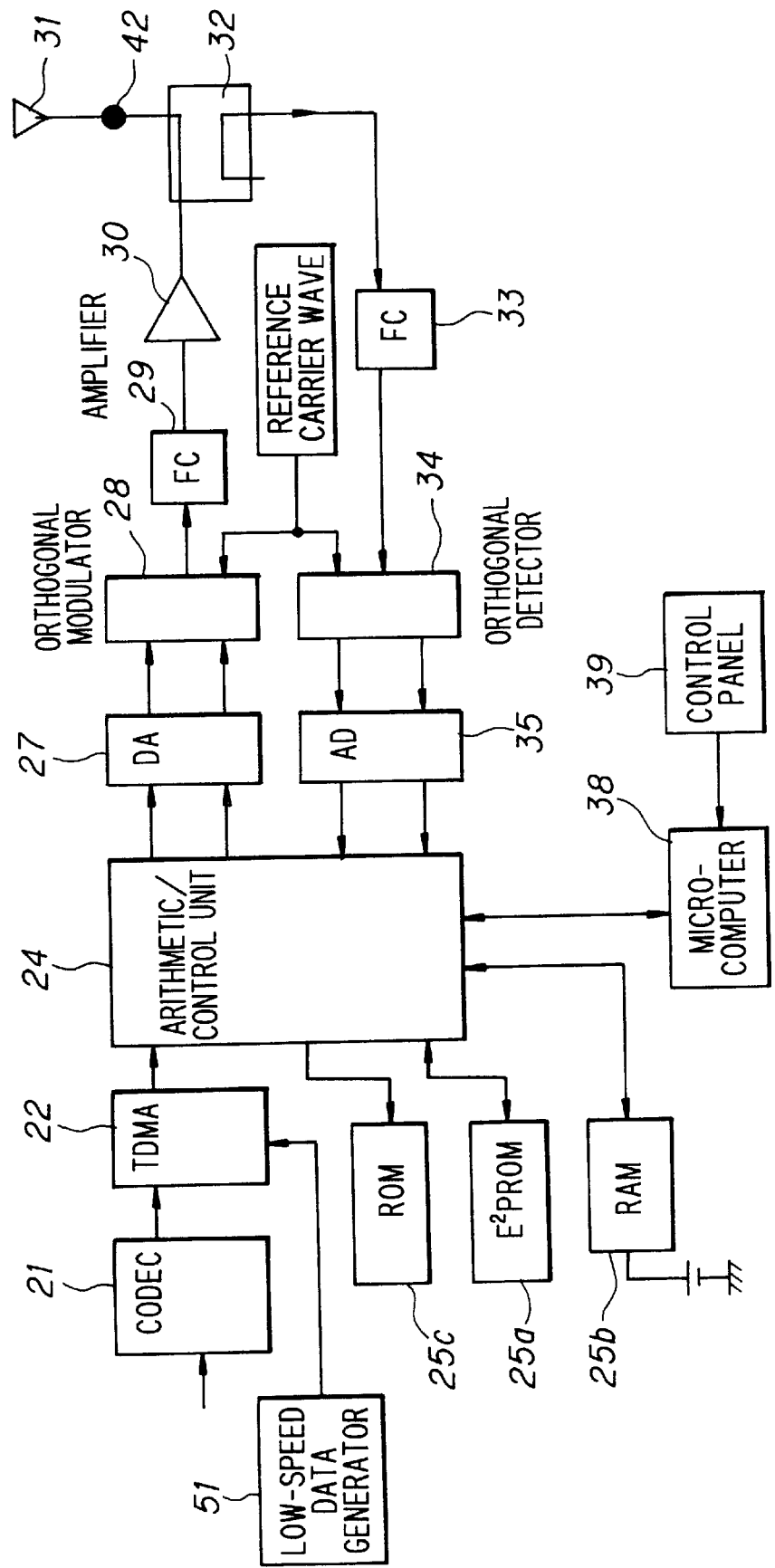
FIG. 46 is a diagram showing the construction of a radio apparatus according to a seventh embodiment.

FIG. 46 is a diagram showing the construction of a radio apparatus according to a seventh embodiment, in which elements identical with those of the first embodiment in FIG. 27 are designated by like reference characters. This embodiment differs from the first embodiment of FIG. 27 in that (1) the input buffer, output buffer and feedback buffer are eliminated, (2) the data generator 51 is provided for generating low-speed data and the TDMA unit 22 enters the low-speed data into the arithmetic/control unit 24 in the preamble period, (3) the arithmetic/control unit 24 updates the distortion compensation coefficients in real time solely in the preamble period using the low-speed data and demodulated data.

In the first embodiment, the transmitted data are subjected to pre-distortion processing, the data that have been subjected to distortion compensation processing are transmitted and the demodulated data are saved, these operations being executed in the allocated time slot. The processing for updating distortion compensation coefficients is executed in the apparatus' own time slot and in the idle time slots. With this method, however, a distortion compensation coefficient is only updated one time per one level over the duration of one TDMA frame. In other words, even if identical levels appear n times, the distortion compensation coefficients are updated only one time with regard to these levels. Moreover, the first apparatus requires the input buffer, output buffer and feedback buffer, as a result of which the apparatus is high in cost.

Figure 47:
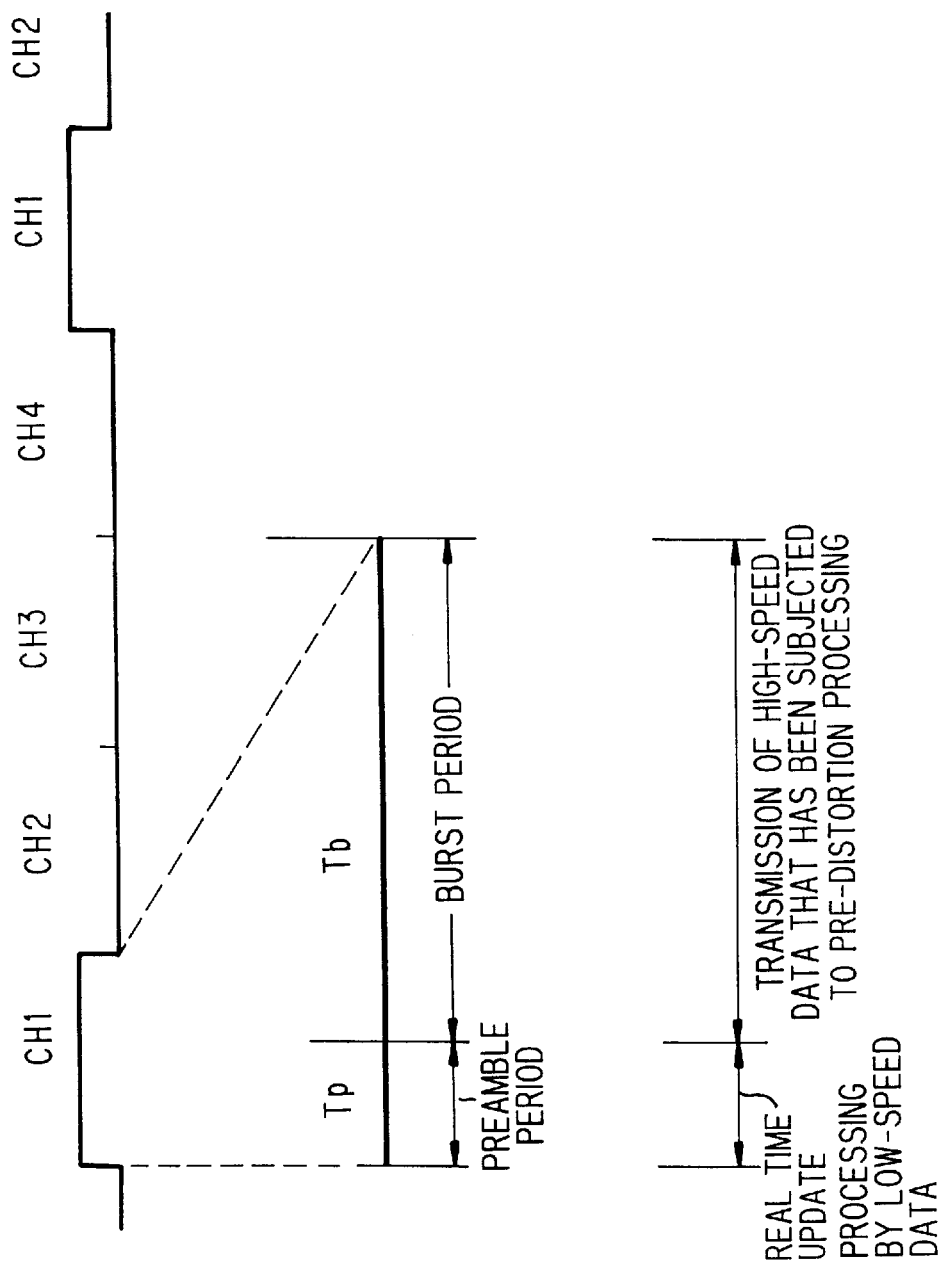
FIG. 47 is a diagram for describing a seventh embodiment.

In the seventh embodiment, therefore, each of the buffers is eliminated. In addition, the low-speed data are entered or input into the arithmetic/control unit 24 in the preamble period Tp of the time slot allocated' to the apparatus itself, as shown in FIG. 47, and the arithmetic/control unit 24 calculates and updates distortion compensation coefficients only in the preamble period Tp in real time using the low-speed data, applies pre-distortion processing in the burst period Tb and does nothing in the idle time slots.

Figure 48:
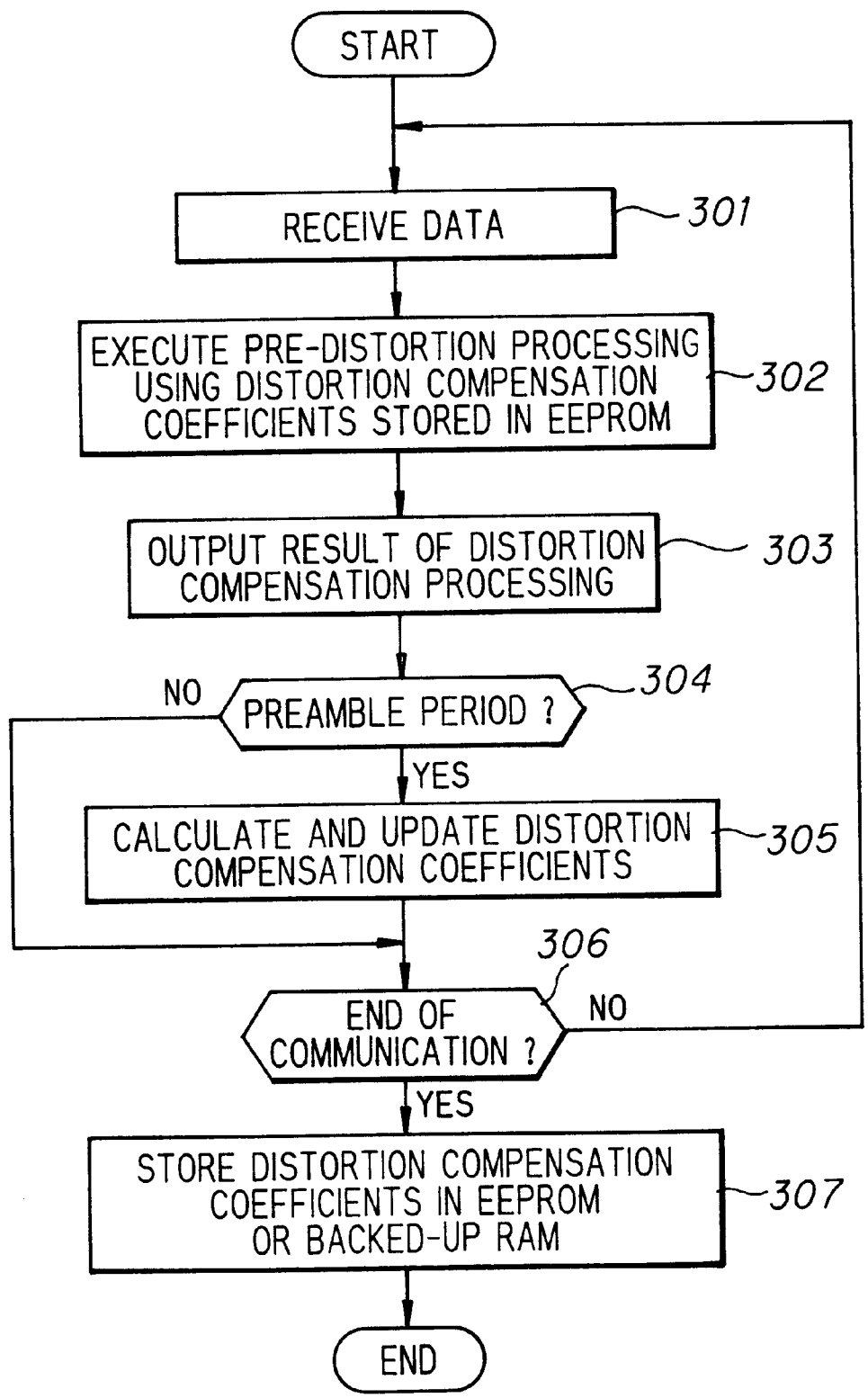
FIG. 48 is a flowchart of processing executed by the arithmetic/control unit in the seventh embodiment.

FIG. 48 is a flowchart of processing executed by the arithmetic/control unit 24 in the seventh embodiment. Upon receiving the transmitted data from the TDMA 22 (step 201), the arithmetic/control unit 24 uses the distortion compensation coefficients, which have been stored in the EEPROM 25a, to apply pre-distortion processing to the transmitted data, after which the processed data are outputted (steps 302, 303). The I and Q signals that have been subjected to the pre-distortion processing enter the orthogonal modulator 28 via the DA converter 27 and are subjected to an orthogonal conversion. The orthogonally converted carrier wave is frequency-converted, amplified by the transmission power amplifier 30 and broadcast from the antenna. Part of the carrier wave is frequency-converted by the frequency converter 33, the output of the converter 33 is applied to the orthogonal detector 34 where the signal is demodulated to the I and Q signals, and the I and Q signals are applied to the arithmetic/control unit 24 upon being converted to digital signals by the AD converter 35.

The arithmetic/control unit 24 determines whether the prevailing period is the preamble period or the burst period (step 304). If the period is the preamble period, the arithmetic/control unit 24 calculates and updates distortion compensation coefficients in real time using the low-speed data and demodulated data (step 305). Thereafter, if it is found at step 304 that the period is not the preamble period, the arithmetic/control unit 24 determines whether communication has ended (step 306). If communication has ended, the arithmetic/control unit 24 stores the updated distortion compensation coefficients in the non-volatile memory 25a and backed-up RAM 25b (step 307). The next time communication is performed, the distortion compensation coefficients are read out of the RAM 25b and set in the internal distortion compensation coefficient memory, whereupon the above-described operation is executed.

When the distortion compensation coefficients are initially set in the non-volatile memory (EEPROM) 25a in the seventh embodiment, the low-speed data are entered into the arithmetic/control unit 24, which then proceeds to execute processing for updating the distortion compensation coefficients. After the distortion compensation coefficients converge, they are written in the non-volatile memory.

The foregoing is a case in which the radio apparatus transmits burst data in one allocated time slot. However, the invention is also applicable to a case where data are transmitted in a plurality of time slots, as in the manner of the base station apparatus of a mobile radio system. More specifically, in a case where data are transmitted in a plurality of time slots, the low-speed data are entered into the arithmetic/control unit 24 and the latter updates distortion compensation coefficients in real time using the low-speed data and demodulated data, this being performed in a prescribed idle time slot. In a time slot other than the idle time slots, the arithmetic/control unit 24 applies pre-distortion processing to high-speed data and transmits the processed data. It should be noted that an identification signal which indicates whether the channel is a channel for insertion of the low-speed data is entered into the arithmetic/control unit 24 from the TDMA unit 22.

Figure 49:
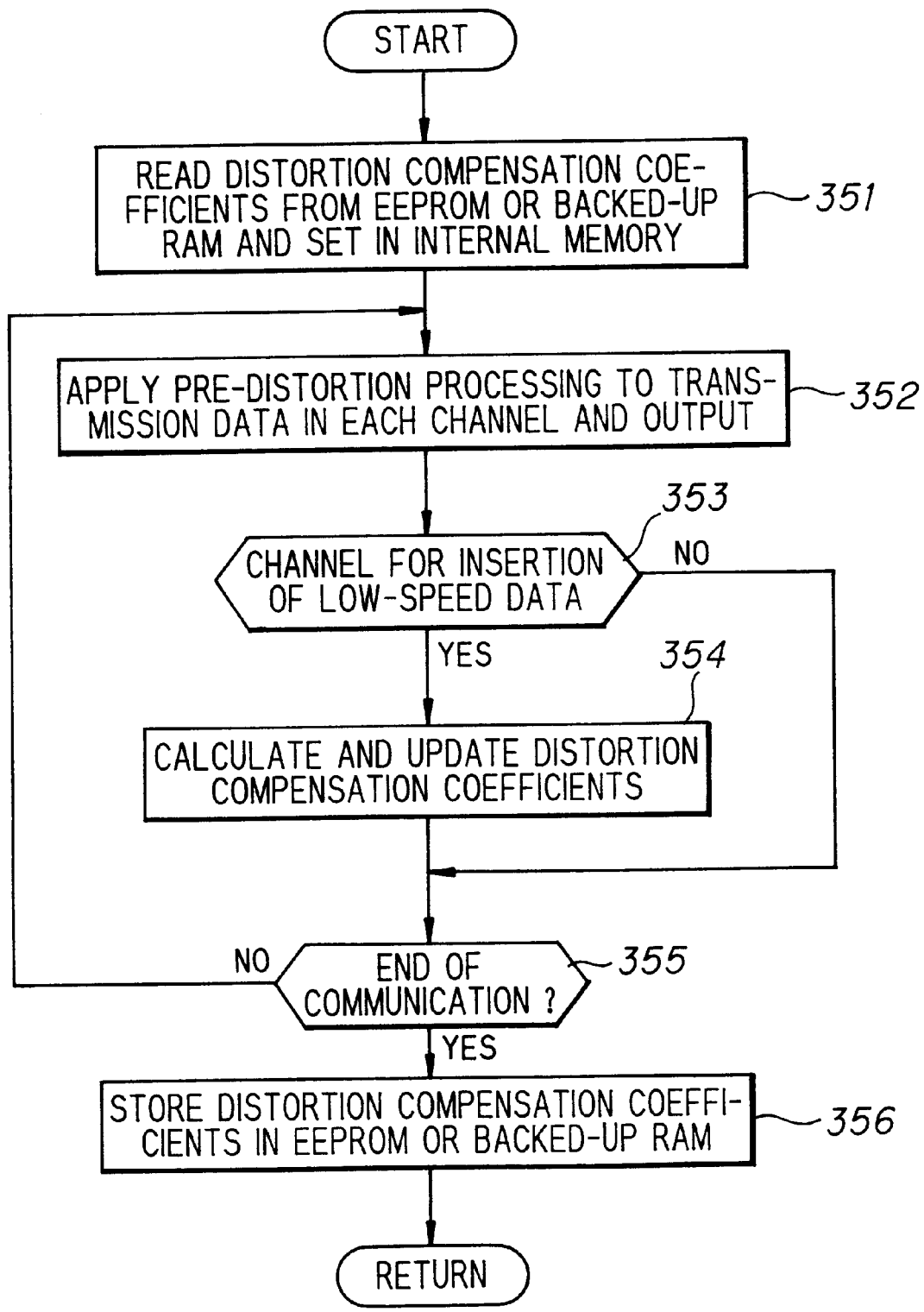
FIG. 49 is a flowchart of processing executed by an arithmetic/control unit in a case where data are transmitted in a plurality of time slots.

FIG. 49 is a flowchart of processing executed by the arithmetic/control unit 24 in a case where data are transmitted in a plurality of time slots.

When the start of communication is instructed, the arithmetic/control unit 24 reads the distortion compensation coefficients out of the EEPROM 25a or RAM 25b backed up by the battery and writes these coefficients in the internally provided distortion compensation coefficient memory (step 351). Next, upon receiving the data from the TDMA unit 22, the arithmetic/control unit 24 subjects the data to pre-distortion processing using the distortion compensation coefficients and then outputs the processed data (step 352). The I and Q signals that have been subjected to the pre-distortion processing enter the orthogonal modulator 28 via the DA converter 27 and are subjected to an orthogonal conversion. The orthogonally converted carrier wave is frequency-converted, amplified by the transmission power amplifier 30 and broadcast from the antenna. Part of the carrier wave is frequency-converted by the frequency converter 33, the output of the converter 33 is applied to the orthogonal detector 34 where the signal is demodulated to the I and Q signals, and the I and Q signals are applied to the arithmetic/control unit 24 upon being converted to digital signals by the AD converter 35.

The arithmetic/control unit 24 determines whether the present channel (time slot) is that for insertion of the low-speed data (step 353). If the answer is "YES", then the arithmetic/control unit 24 calculates and updates the distortion compensation coefficients in real time using the low-speed data and demodulated data (step 354). Thereafter, or if it is found at step 353 the present channel is not that for insertion of the low-speed data, the arithmetic/control unit 24 determines whether processing has ended and, if it has not, repeats the processing from step 352 onward. If communication has ended, the arithmetic/control unit 24 stores the updated distortion compensation coefficients in the non-volatile memory 25a and backed-up RAM 25b (step 356). The next time communication is performed, the distortion compensation coefficients are read out of the RAM 25b and the above-described operation is executed.

Thus, even if the radio apparatus is one which transmits data in a plurality of time slots, transmission can be started using the distortion compensation coefficients that conform to the transmission characteristic of the apparatus. It is possible to prevent the emission of radio waves having a widened band and the time required for convergence to the optimum distortion compensation coefficients can be shortened.

(h) Eighth Embodiment

Figure 50:
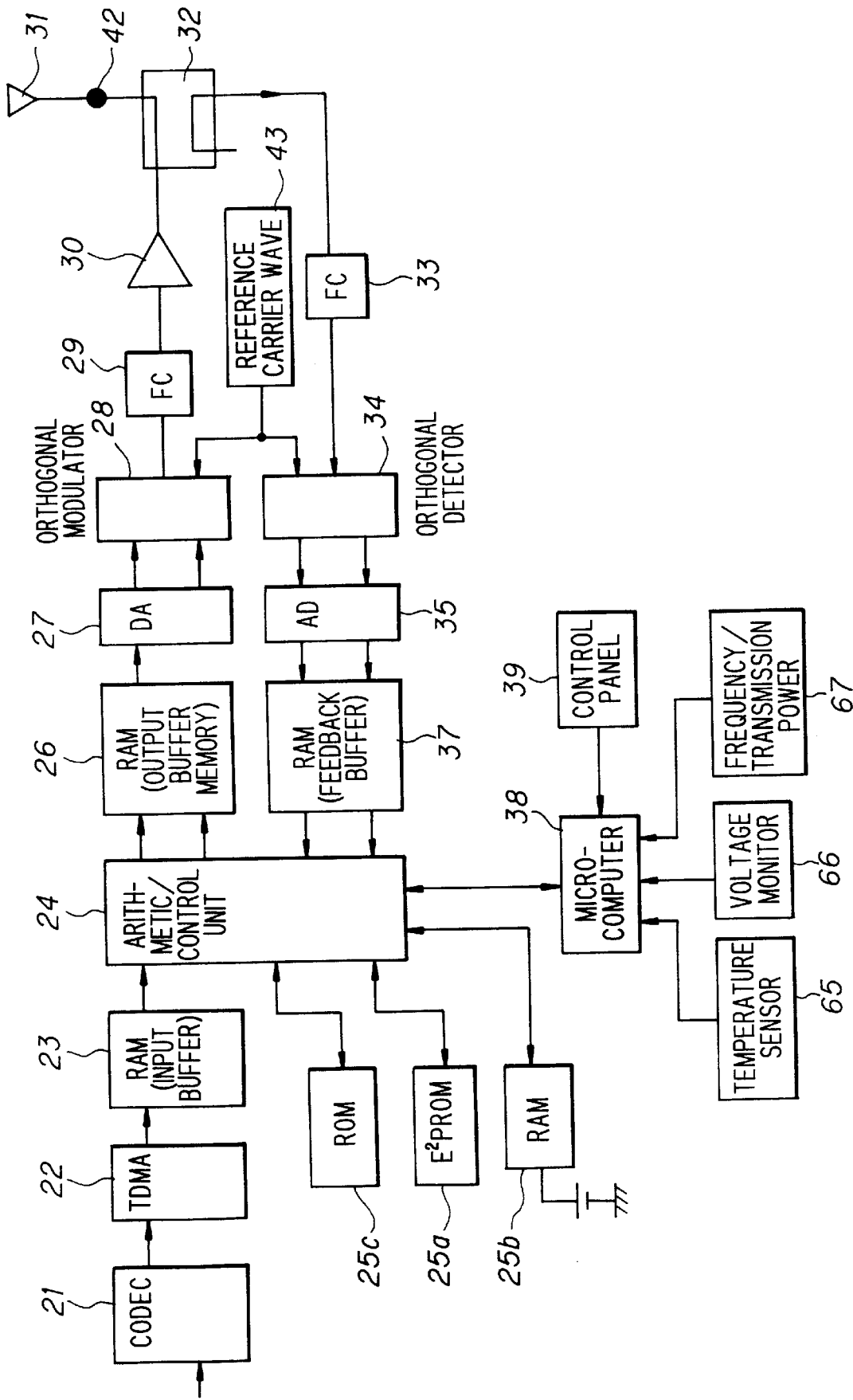
FIG. 50 is a diagram showing the construction of a radio apparatus according to an eighth embodiment.

FIG. 50 is a diagram showing the construction of a radio apparatus according to an eighth embodiment of this aspect of the invention. Elements in FIG. 50 identical with those of the first embodiment in FIG. 27 are designated by like reference characters. This embodiment differs from the first embodiment in that (1) a temperature sensor 65 for sensing ambient temperature, a voltage monitoring unit 66 for monitoring power supply voltage and a management unit 67 for managing channel frequency and transmission power are provided, and (2) a plurality of distortion compensation coefficients are stored beforehand, in the non-volatile memory (EEPROM) 25a or backed-up RAM 25b, for respective ones of the ambient temperature, power supply voltage, channel frequency and transmission power, and the arithmetic/control unit 24 executes pre-distortion processing and processing for updating distortion compensation coefficients using the distortion compensation coefficients conforming to the state (channel frequency, transmission power, ambient temperature, power supply voltage) of the apparatus at the time of use.

Since the distortion characteristic of the transmitter varies depending upon ambient temperature, power supply voltage, channel frequency and transmission power, a plurality of distortion compensation coefficients are stored beforehand, in the non-volatile memory, for respective ones of the ambient temperature, power supply voltage, channel frequency and transmission power. If distortion compensation coefficients conforming to ambient temperature, power supply voltage, channel frequency and transmission power at the time of communication are used, the distortion compensation coefficients converge in a short period of time and excellent communication can be carried out.

Accordingly, in the eighth embodiment, a plurality of distortion compensation coefficients are stored beforehand, in the non-volatile memory 25a, for respective ones of the ambient temperature, power supply voltage, channel frequency and transmission power, and the arithmetic/control unit 24 executes pre-distortion processing and processing for updating distortion compensation coefficients using the distortion compensation coefficients conforming to the state (channel frequency, transmission power, ambient temperature, power supply voltage) of the apparatus at the time of use. When communication ends, the old distortion compensation coefficients in the non-volatile memory are rewritten using the updated' distortion compensation coefficients. It should be noted that an arrangement can be adopted in which distortion compensation coefficients conforming solely to the ambient temperature, solely to the power supply voltage, solely to the channel frequency, solely to the transmission power or to any combination thereof are stored in the non-volatile memory, and the pre-distortion processing and processing for updating the distortion compensation coefficients can be executed using the stored distortion compensation coefficients.

FIG. 51A shows an example in which distortion compensation coefficients $H_{ij}$ are stored in the non-volatile memory 25a to correspond to various channel frequencies/transmission powers. $H_{ij}$ is constituted by the distortion compensation coefficient $h(P_i)$ of each level (see FIG. 29). FIG. 51B shows an example in which distortion compensation coefficients $H_i$ are stored in the non-volatile memory 25a to correspond to various temperatures. $H_i$ is constituted by the distortion compensation coefficient h(Pi) of each level. FIG. 51C shows an example in which distortion compensation coefficients $H_i'$ are stored in the non-volatile memory 25a to correspond to various power supply voltages. $H_i'$ is constituted by the distortion compensation coefficient $h(P_i)$ of each level.

(i) Ninth Embodiment

Figure 52:
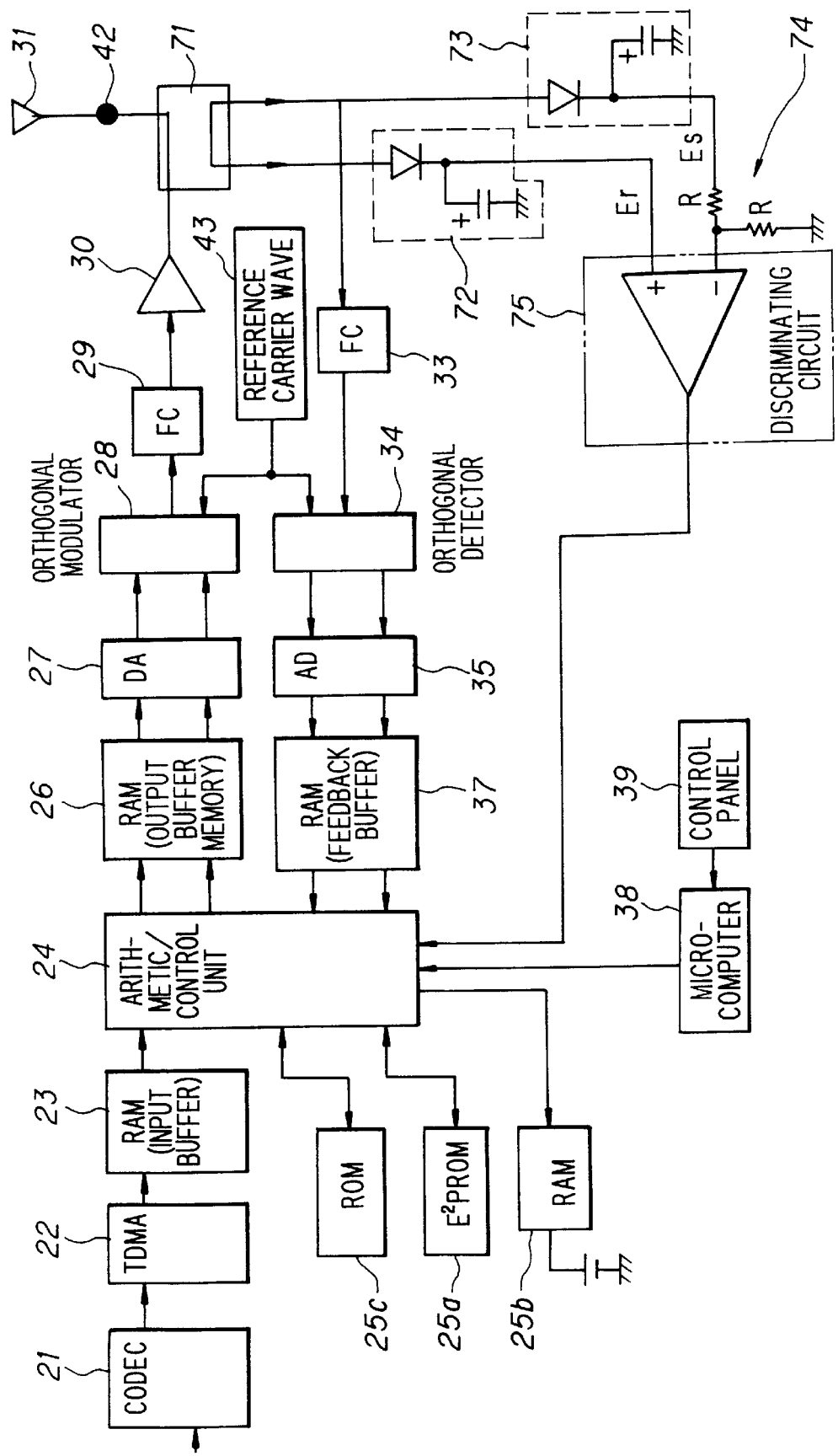
FIG. 52 is a diagram showing the construction of a radio apparatus according to a ninth embodiment.

FIG. 52 is a diagram showing the construction of a radio apparatus according to an ninth embodiment of this aspect of the invention. Elements in FIG. 52 identical with those of the first embodiment in FIG. 27 are designated by like reference characters. This embodiment differs from the first embodiment in that (1) a directional coupler 71 for detecting a traveling wave and a reflected wave, detecting circuits 72, 73 for detecting the traveling wave and reflected wave, a potential divider 74 and a discriminating circuit 75 for determining whether the voltage standing wave ratio VSWR of the antenna is less than or greater than a set value are provided, and (2) a plurality of distortion compensation coefficients are stored beforehand in the non-volatile memory (EEPROM) 25a or backed-up RAM 25b in correspondence with the voltage standing wave ratio, and the arithmetic/control unit 24 executes pre-distortion processing and processing for updating distortion compensation coefficients using the distortion compensation coefficients conforming to the voltage standing wave ratio at the time the apparatus is used.

The directional coupler 71 is provided between the transmission power amplifier 30 and antenna 31 to detect the traveling wave to the antenna and the reflected wave. The detecting circuits 72 and 73 each comprise a diode and a cathode and detect traveling waves and reflected waves. The potential divider 74 halves the input voltage. The discriminating circuit 75 comprises an operational amplifier to which a detected traveling-wave voltage Es and a detected reflected-wave voltage Er are applied. The discriminating circuit 75 determines whether the voltage standing wave ratio VSWR of the antenna 31 is less than a set value (e.g., 3) or greater than the set value. The voltage standing wave ratio VSWR is given by the following equation:

$$VSWR=(1+|\Gamma|)/(1-|\Gamma|) \quad (5)$$

where $\Gamma$ is a reflection coefficient and is obtained from $\Gamma$=(reflective-wave voltage Er)/(traveling-wave voltage Es).

Accordingly, when Er=Es/2 holds, the voltage standing wave ratio VSWR is given by the following equation:

$$VSWR=(1+0.5)/(1-0.5)=3$$

Since the traveling-wave voltage Es is halved by the potential divider 74, the operational amplifier of the discriminating circuit 75 assumes high and low levels about VSWR=3 as the boundary and is capable of determining whether the voltage standing wave ratio is less than or greater than the set value (=3). The outputs of the detecting circuits 72 and 73 are converted from analog to digital signals and the operation of the foregoing equation is executed so that VSWR can be obtained precisely.

As shown in FIG. 53, distortion compensation coefficients for when VSWR is greater than 3 and for when VSWR is less than 3 are set in the non-volatile memory (EEPROM) 25a. The distortion compensation coefficients conforming to various VSWRs are obtained by varying the impedance of a dummy load connected instead of the antenna.

The arithmetic/control unit 24 executes pre-distortion processing and processing for updating distortion compensation coefficients using the distortion compensation coefficients conforming to the VSWR at the time of use. When communication ends, the old distortion compensation coefficients in the non-volatile memory 25a are rewritten using the updated distortion compensation coefficients. If the foregoing arrangement is adopted, pre-distortion processing can be executing using optimum distortion compensation coefficients conforming to the characteristic of the antenna. Moreover, the time needed for convergence of the distortion compensation coefficients can be curtailed.

(j) Tenth Embodiment

Figure 76:
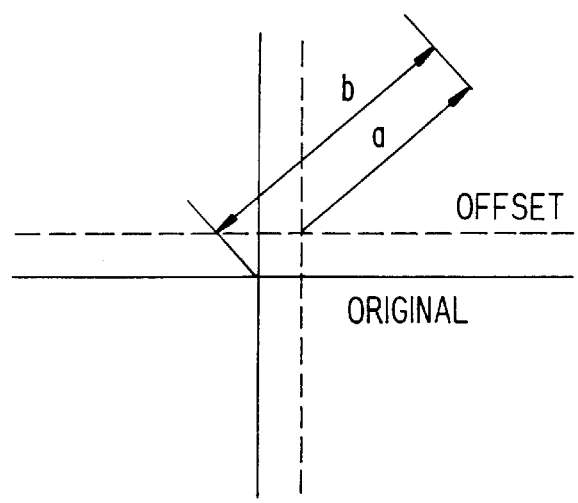
FIG. 76 is an explanatory view in which QPSK-modulated waves are represented on a complex plane.

The foregoing relates to a case where the offsets of the orthogonal modulator and orthogonal detector are not taken into account. If the offsets exist, however, accurate pre-distortion processing, calculation and updating of distortion compensation coefficients cannot be carried out, as described earlier in connection with FIG. 76. Accordingly, if offsets exist in the orthogonal modulator and orthogonal detector, it is required that the offsets be compensated for prior to pre-distortion processing and processing for updating distortion compensation coefficients.

When modulation is not being carried out, there should be no output from the orthogonal modulator. However, if the orthogonal modulator has an offset, a carrier proportional to the amount of offset appears as leakage, as illustrated in FIG. 2. Accordingly, in the tenth embodiment, the leakage of carrier is detected and I, Q input levels of the orthogonal modulator are finely adjusted to regulate the offset on the transmitting side. In other words, the transmission offset is eliminated before the operation for actual distortion compensation begins.

Figure 54:
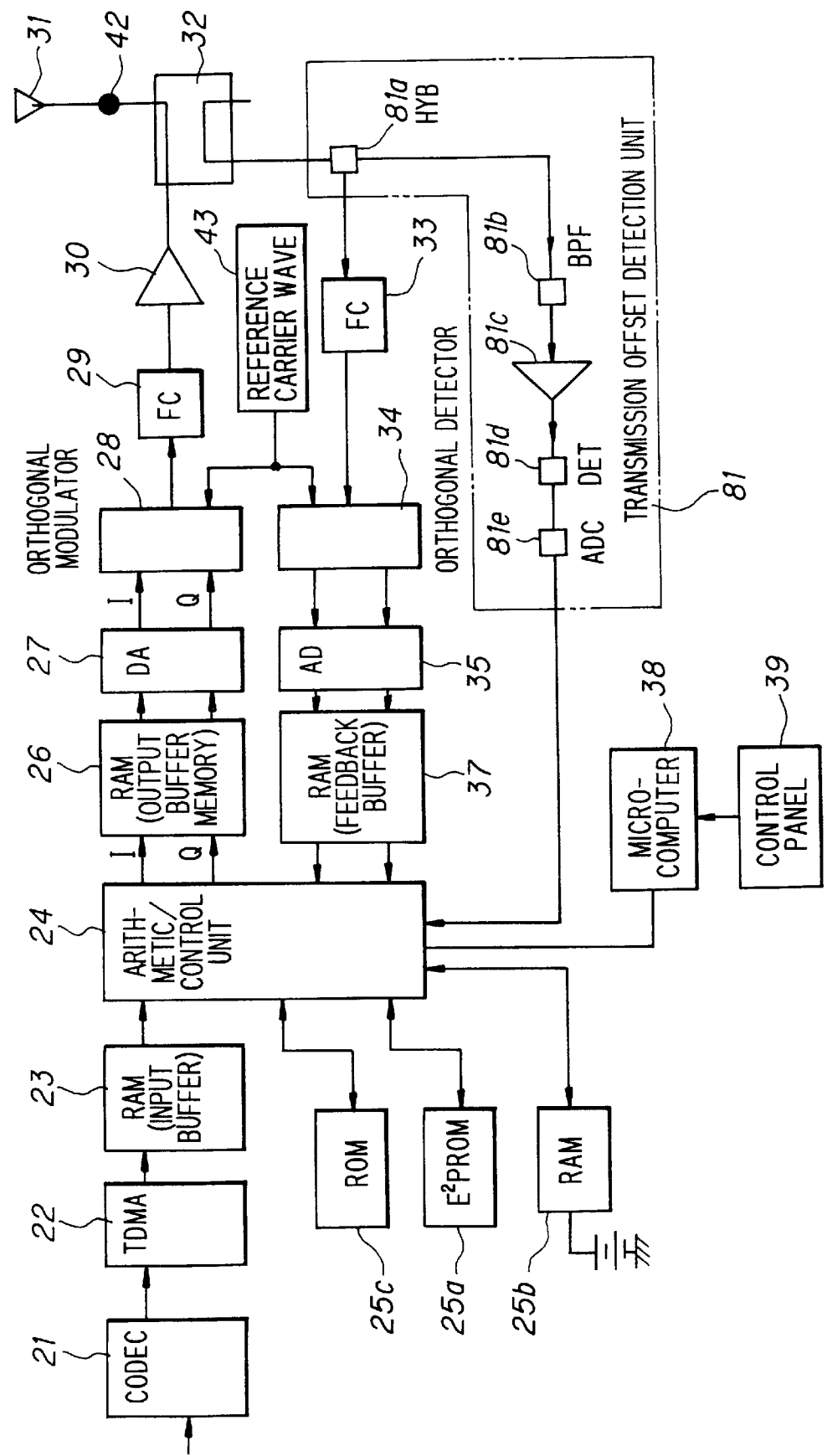
FIG. 54 is a diagram showing the construction of a radio apparatus according to a tenth embodiment.

FIG. 54 is a diagram showing the construction of the tenth embodiment of this aspect of the invention. Elements in FIG. 54 identical with those of the first embodiment in FIG. 27 are designated by like reference characters. This embodiment differs from the first embodiment in that (1) a transmission offset detection unit 81 is provided for detecting transmission offset by detecting leakage carrier from the orthogonal modulator 28, (2) the DTMA unit 22 establishes a modulation-free state by not outputting a signal in the preamble period of the allocated time slot, and (3) the arithmetic/control unit 24 executes offset compensation processing in addition to pre-distortion processing and processing for updating distortion compensation coefficients.

The transmission offset detection unit 81 includes a hybrid circuit 81a for detecting carrier leakage due to offset, a band-pass filter 81b, an amplifier 81c, a detector 81d and an AD converter 81e.

The DTMA unit 22 establishes a modulation-free state by not outputting a signal in the preamble period of the allocated time slot. In the preamble period (when modulation is not being carried out), the carrier leakage that leaks from the orthogonal modulator 28 is extracted by the hybrid 81*a* and limited in bandwidth by the band-pass filter 81*b*, after which the resulting signal is amplified by the amplifier 81*c* and then entered into the detector 81*d*. The latter detects the leakage of carrier and converts it to a DC signal. The DC signal is converted to a digital offset data by the AD converter 81*e* and the digital signal enters the arithmetic/control unit 24. On the basis of the offset data entered in the preamble period (when modulation is not being carried out), the arithmetic/control unit 24 finely adjusts the output levels of the I and Q signals, which are the transmission baseband signals. If the foregoing processing is subsequently repeated, the offset data gradually approach zero and the adjusted values (offset compensation coefficients) of the output levels of the I and Q signals eventually converge to optimum values so that the offset becomes zero.

If the offset compensation coefficients converge (if the offset data become zero) in the preamble period, the arithmetic/control unit 24 subjects the transmission data to pre-distortion processing and effects separation into the I and Q signals from the apparatus' next time slot and updates the distortion compensation coefficients over the idle time slots. When communication ends, the updated latest distortion compensation coefficients and the latest offset compensation coefficients are stored in the non-volatile memory (EEPROM) 25*a* and RAM 25*b*, which is backed up by the battery. The next time communication is performed, the arithmetic/control unit 24 starts distortion compensation processing and offset compensation processing using the distortion compensation coefficients and offset compensation coefficients that have been stored in the non-volatile memory (EEPROM) 25*a* and backed-up RAM 25*b*.

If the offset compensation coefficients do not converge in the preamble period, the processing for updating the distortion compensation coefficients in the present time slot is suspended, pre-distortion processing is executed using the distortion compensation coefficients that have been stored in the non-volatile memory 25*a* or RAM 25*b*, the processed data are entered into the orthogonal modulator and updating of the distortion compensation coefficients is not carried out.

Thus, pre-distortion processing is executed and updating of the distortion compensation coefficients is carried out after offset is eliminated by offset compensation processing. As a result, pre-distortion processing can be executed correctly and excellent communication can be performed promptly. Further, the latest values of the offset compensation coefficients are saved in the non-volatile memory or backed-up RAM. The next time communication is performed, offset processing is started using these offset compensation coefficients. As a result, the offset compensation coefficients can be made to converge and pre-distortion processing and processing for updating distortion compensation coefficients can be started in a short period of time.

(k) 11th Embodiment (k-1) Construction

The tenth embodiment is for a case where compensation is made for the offset (transmission offset) of the orthogonal modulator. However, the offset (reception offset) of the orthogonal detector can be measured and offset compensation can be applied in such a manner that the reception offset is nulled in similar fashion. Further, offset compensation processing can be executed in similar fashion in such a manner that both offsets become zero.

Figure 55:
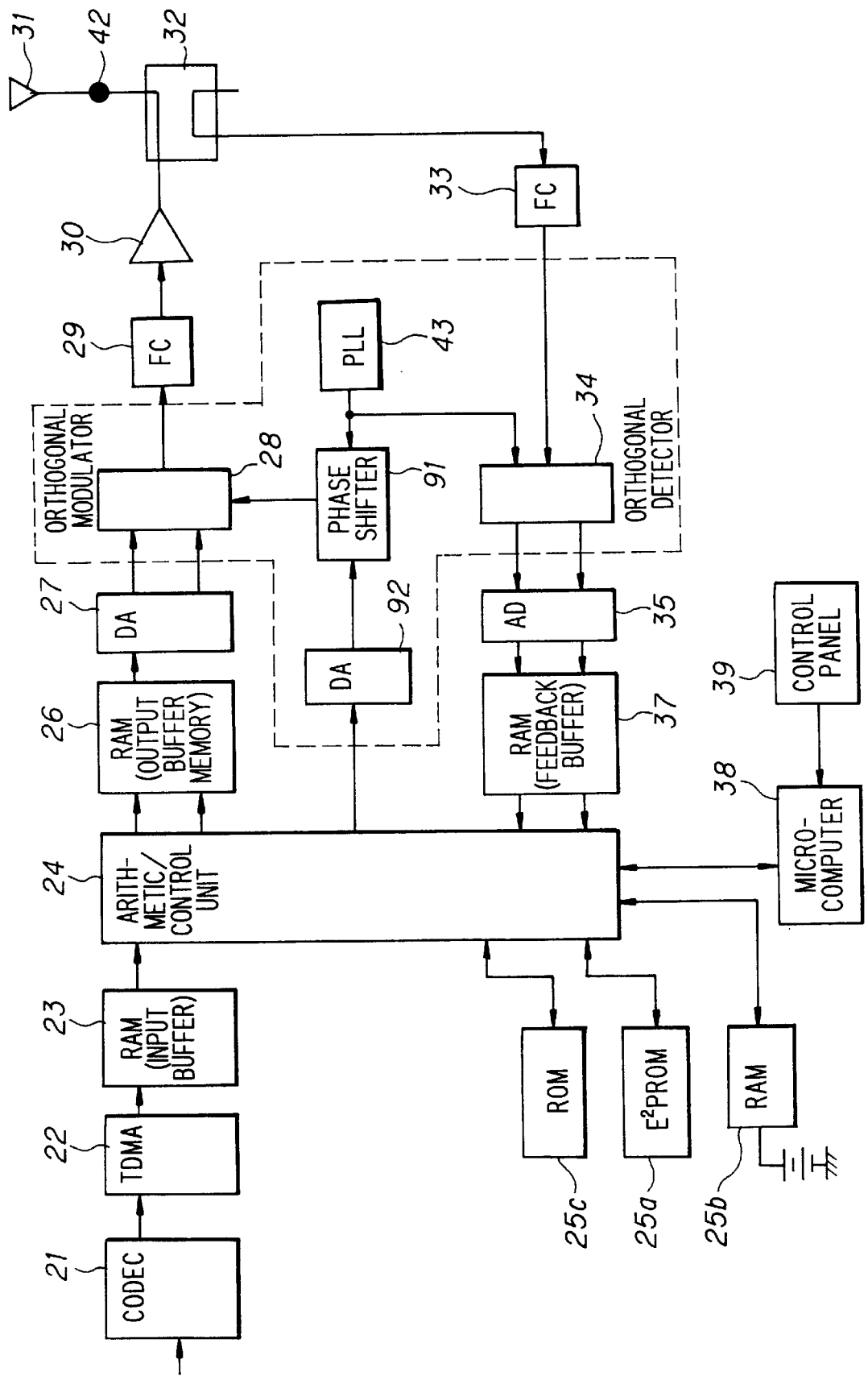
FIG. 55 is a diagram showing the construction of a radio apparatus according to an 11th embodiment.

FIG. 55 is a diagram showing the construction of a radio apparatus according to an 11th embodiment in which compensation is made for both transmission offset and reception offset. Elements in FIG. 55 identical with those of the first embodiment in FIG. 27 are designated by like reference characters. This embodiment differs from the first embodiment of FIG. 27 in that (1) a phase shifter 91 is provided for shifting the phase of the reference carrier applied to the orthogonal modulator 28, (2) the amount of phase shift by the phase shifter 91 is changed via a DA converter 92 in response to a command from the arithmetic/control unit 24, (3) the arithmetic/control unit 24 performs offset compensation processing in addition to pre-distortion processing and processing for updating distortion compensation coefficients, and (4) the arithmetic/control unit 24 measures transmission offset and reception offset in the preamble period of the allocated time slot and executes processing to compensate for each offset. It should be noted that the principle in accordance with which transmission offset and reception offset are detected is as described above in connection with FIGS. 4 and 5.

Figure 56:
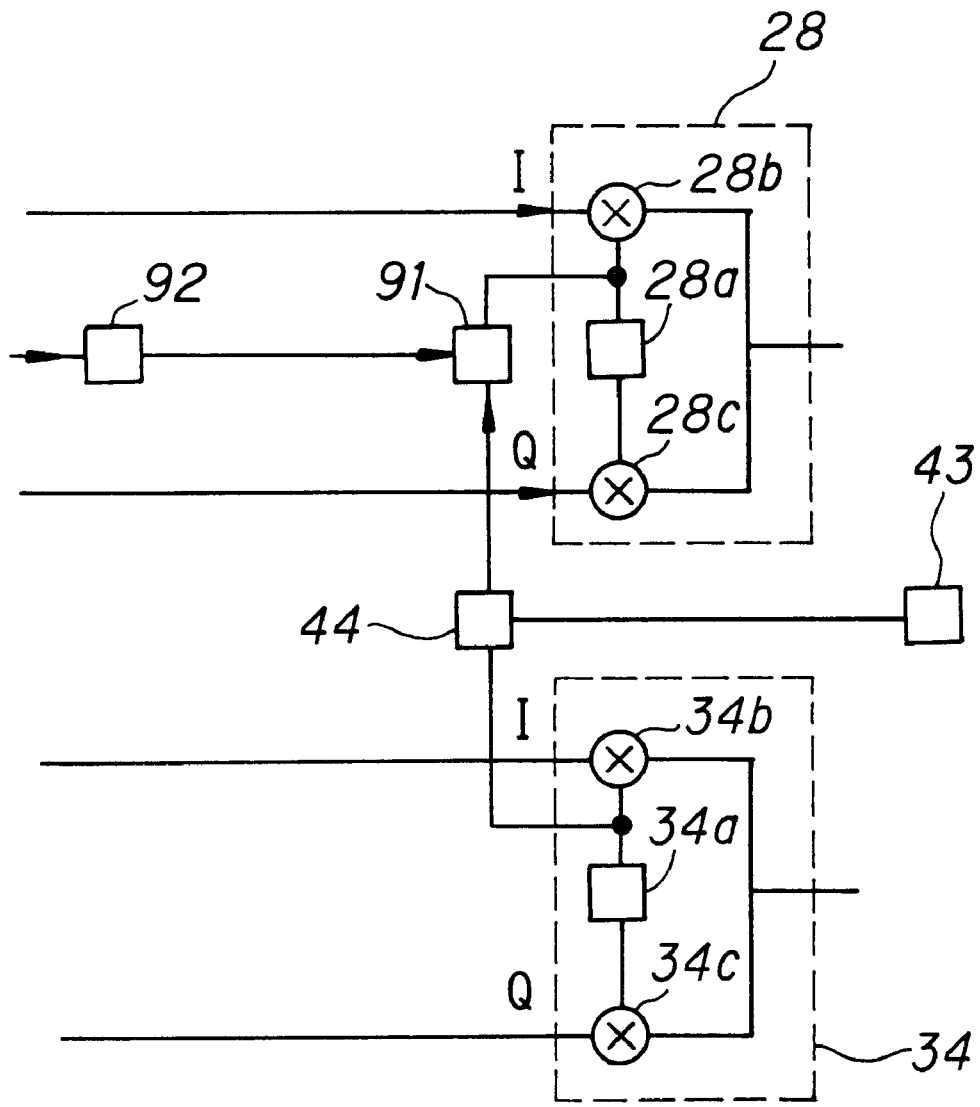
FIG. 56 is a diagram showing the construction of an orthogonal modulator and the construction of an orthogonal detector.

FIG. 56 is a diagram showing the details of the block indicated by the dashed line in FIG. 55. Shown in FIG. 56 are the orthogonal modulator 28, the orthogonal detector 34, the reference carrier wave generator 43 constituted by a PLL, the hybrid circuit 44 which branches the reference carrier wave to the orthogonal modulator and orthogonal detector, the phase shifter 91 an the DA converter 92. The phase shifter 91 shifts the phase of the reference carrier wave, which enters the orthogonal modulator 28, in accordance with a command from the arithmetic/control unit 24. The orthogonal modulator 29 includes the phase shifter 28*a* for shifting the phase of the reference carrier wave, which is outputted by the phase shifter 91, by 90°, the multiplier 28*b* for multiplying the I signal by the reference carrier wave, and the multiplier 28*c* for multiplying the Q signal by the output signal of the phase shifter 91 that has been shifted in phase by 90°. The products from the multipliers 28*b*, 28*c* are combined and outputted. The orthogonal detector 34 includes the phase shifter 34*a* for shifting the reference carrier wave by 90°, the multiplier 34*b* for multiplying the input signal by the reference carrier wave to produce and output the I signal, and the multiplier 34*c* for multiplying the input signal by the reference carrier wave that has been shifted in phase by 90°, thereby producing and outputting the Q signal.

(k-2) Operation

In the preamble period, the arithmetic/control unit 24 performs control based upon the principle through which transmission offset and reception offset are detected. The arithmetic/control unit 24 obtains reception offset first, obtains the overall offset next and then determines the transmission offset by subtracting the reception offset from the overall offset.

Offset compensation processing similar to that of the tenth embodiment is then performed based upon the transmission offset to adjust the I and Q signal levels. If the above processing is subsequently repeated, the transmission offset and reception offset gradually approach zero. The transmission offset compensation coefficients and the adjusted values of the input levels of the demodulated data (the reception offset compensation coefficients) eventually converge to optimum values.

If the offset compensation coefficients converge (if the transmission offset and reception offset become zero) in the preamble period, the arithmetic/control unit 24 subjects the transmission data to pre-distortion processing and outputs the processed data from the apparatus' next time slot and then calculates and updates distortion compensation coefficients over the period spanning the apparatus' own time slot and idle time slots. When communication ends, the updated latest distortion compensation coefficients, the latest transmission offset compensation coefficients and the latest reception offset compensation coefficients are stored in the non-volatile memory (EEPROM) 25a and in the RAM 25b backed up by the battery. The next time communication is performed, the arithmetic/control unit 24 starts offset compensation processing using the transmission offset compensation coefficients and reception offset compensation coefficients that have been stored in the non-volatile memory (EEPROM) 25a and RAM 25b.

If each offset compensation coefficient does not converge in the preamble period, the processing for updating the distortion compensation coefficients in the present time slot is suspended, pre-distortion processing is executed using the distortion compensation coefficients that have been stored in the non-volatile memory 25a or RAM 25b, the processed data are entered into the orthogonal modulator and updating of the distortion compensation coefficients is not carried out.

Thus, it is so arranged that processing for updating the distortion compensation coefficients is executed after each offset is eliminated by offset compensation processing. As a result, pre-distortion processing can be executed correctly and excellent communication can be performed promptly. Further, the latest values of transmission and reception offset compensation coefficients are saved in the non-volatile memory or backed-up RAM and offset processing is started using these offset compensation values the next time communication is carried out. As a result, the offset compensation coefficients can be made to converge and pre-distortion processing and processing for updating distortion compensation coefficients can be started in a short period of time.

Thus, in accordance with the radio apparatus having the distortion compensation processing function of the present invention, non-linear distortion of a transmission power amplifier is suppressed in advance and distortion compensation coefficients for reducing leakage of power between adjacent channels are obtained and initially set non-volatile memory means beforehand. At the time of actual operation, the distortion compensation coefficients are updated for the first time based upon these stored distortion compensation coefficients. As a result, the distortion compensation coefficients converge to optimum values in a short period of time so that correct pre-distortion processing conforming to the conditions prevailing during actual operation can be executed. This makes it possible to suppress spreading of the band and to reduce leakage of power between adjacent channels. Further, at the end of communication, the latest distortion compensation coefficients are saved in the memory and are used the next time communication is performed. As a result, the distortion compensation coefficients can be made to converge to optimum values in a short time when communication is performed next.

Figure 57:
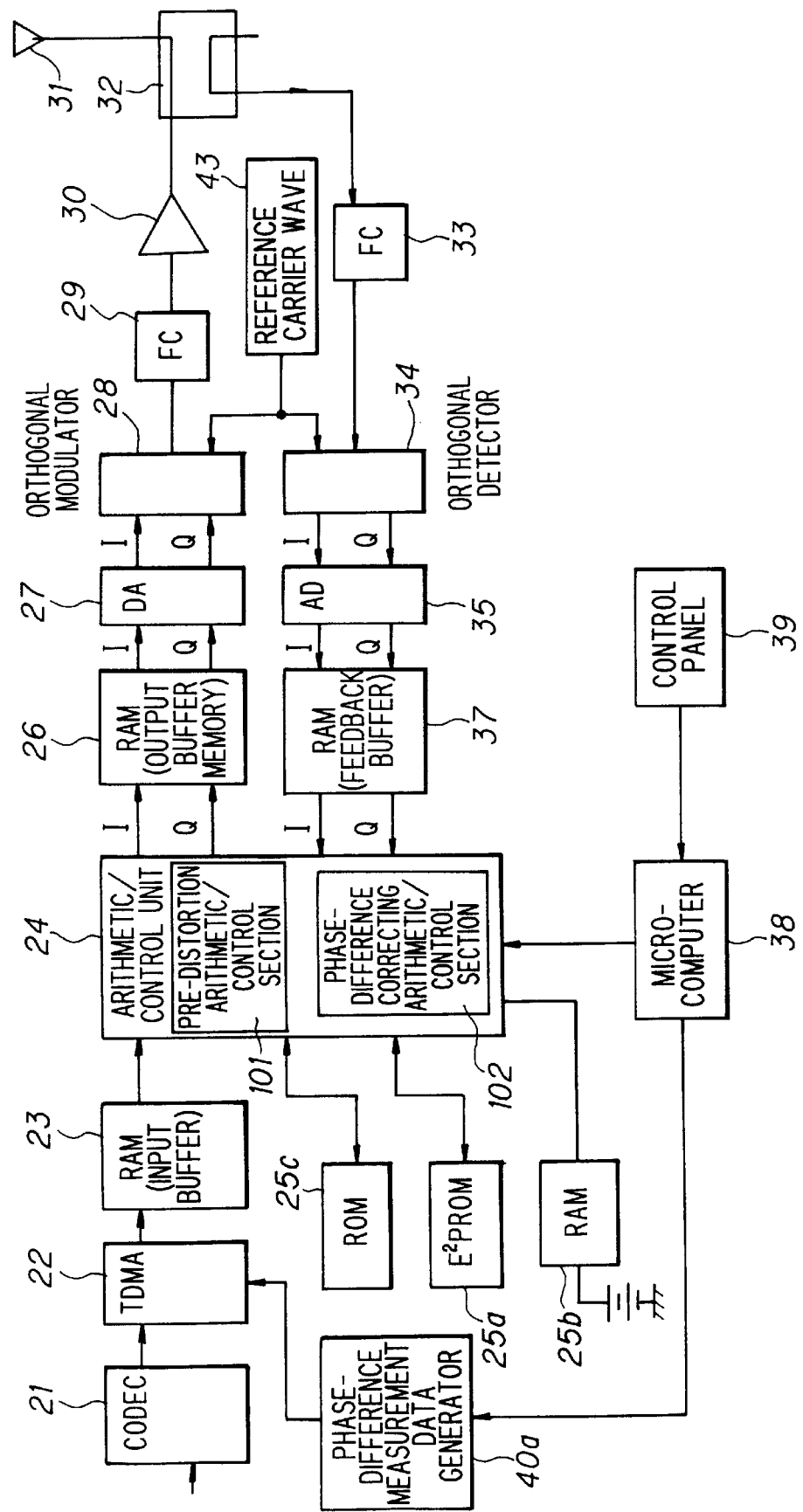
FIG. 57 is a diagram showing the construction of a first embodiment of a radio apparatus having a phase-difference correction function.

(D) Embodiment of Phase-difference Correction
(a) First Embodiment
(a-1) Overall Construction FIG. 57 is a diagram showing the construction of a radio apparatus according to a first embodiment of this aspect of the present invention. Shown in FIG. 57 are the CODEC 21 for converting an audio analog signal to digital data, the TDMA unit 22 for outputting burst data at a predetermined timing preceding an allocated time slot, the input buffer memory (RAM) 23 for storing the burst data, and the arithmetic/control unit 24 constituted by a DSP or the like and having the pre-distortion arithmetic/control section 101 and the phase-difference correcting arithmetic/control section 102. The pre-distortion arithmetic/control section 101 (1) applies pre-distortion processing to the modulating signal using distortion compensation coefficients h(Pi) conforming to the levels of the modulating signal, converts the processed modulating signal to I and Q signals and outputs the signals, and (2) compares the modulating signal with the demodulated signal obtained by demodulation performed by an orthogonal detector and updates the distortion compensation coefficients h(Pi) so as to null the difference between the compared signals. The phase-difference correcting arithmetic/control section 102 measures the phase difference between the modulating signal (transmission baseband signal) and the demodulated- signal (feedback baseband signal) and executes phase-difference correction processing so as to make the phase difference zero.

The non-volatile memory 25a such as an EEPROM is used to store, in advance, distortion compensation coefficients which compensate for the distortion characteristic of the transmission power amplifier, etc. The RAM 25b is backed up by a battery and the ROM 25c stores various parameters. The output buffer memory (RAM) 26 stores I and Q signals that have been subjected to pre-distortion compensation processing and phase-difference correction processing. The DA converter 27 converts the I and Q signals, which have been stored in the output buffer memory 26, to analog baseband signals. The orthogonal modulator 28 multiplies the input I and Q signals by a reference carrier wave and by a signal phase-shifted from the reference carrier by 90°, respectively, adds the two products, thereby performing an orthogonal conversion, and outputs the result. The frequency converter 29 mixes the orthogonally modulated signal and a local oscillation signal to perform an up-conversion, and the transmission power amplifier 30 power-amplifies the carrier-wave signal outputted by the frequency converter 29 and broadcasts the amplified signal into space from the antenna 31. The directional coupler 32 extracts part of the transmitted signal. The frequency converter 33 mixes the carrier wave and the local oscillation signal to perform a down-conversion. The orthogonal detector 34 multiplies the input signal by the reference carrier wave and by the signal phase-shifted from the reference carrier by 90°, performs orthogonal detection, reproduces the baseband I and Q signals from the transmitting side and enters these signals into the AD converter 35. The latter converts the input I and Q signals (demodulated signals) that have entered from the orthogonal detector to digital signals. The feedback buffer memory 37 stores the orthogonally detected demodulated signal data. The apparatus further includes the microcomputer 38 and the control panel 39. Numeral 40a denotes a phase-difference measurement data generator which, when phase difference is measured, outputs data (a modulating signal) having a fixed phase and amplitude.

(a-2) Construction of Arithmetic/Control Unit

Figure 58:
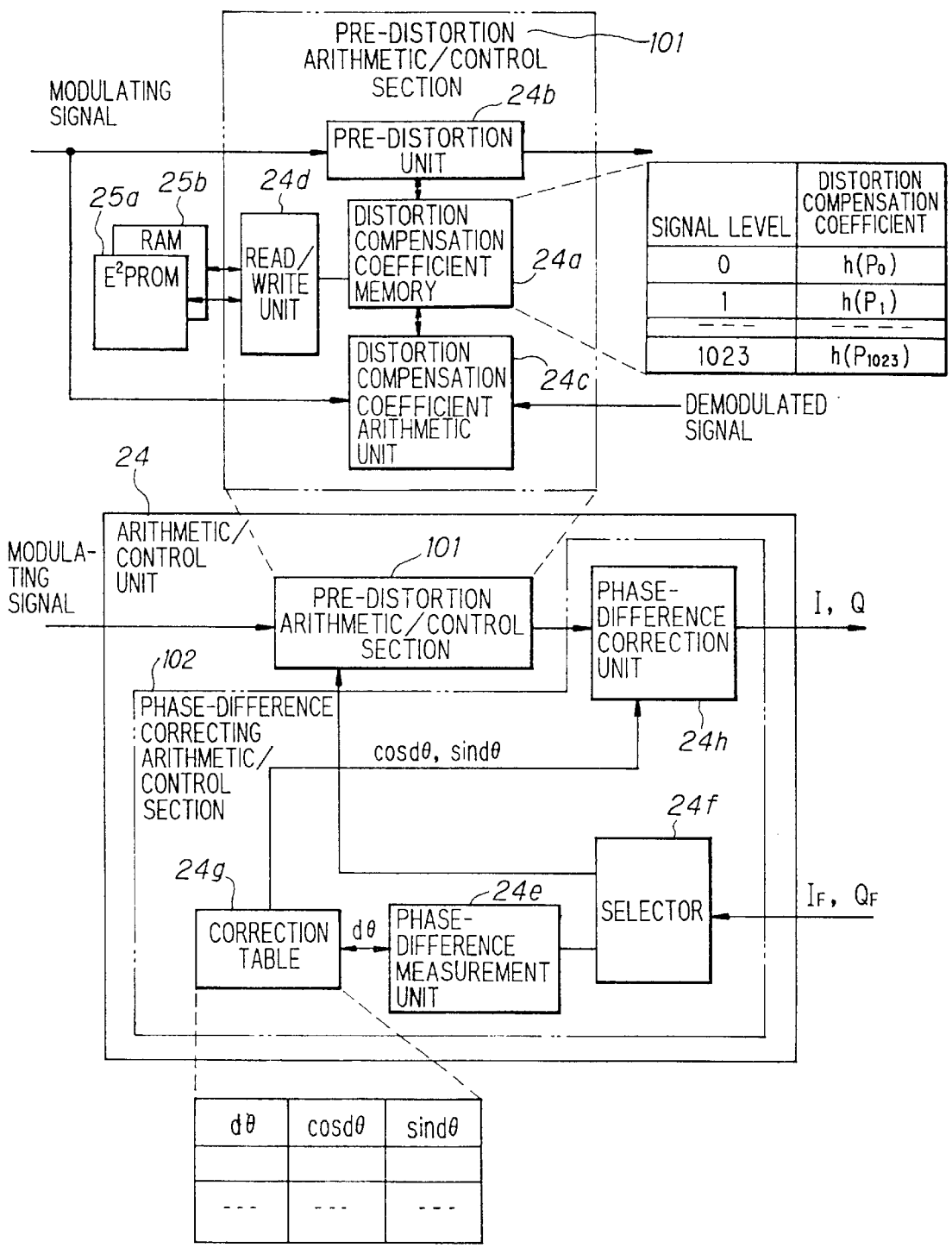
FIG. 58 is a diagram showing the construction of an arithmetic/control unit.

FIG. 58 is a functional block diagram of the arithmetic/control unit 24. Shown in FIG. 58 are the non-volatile memory 25a such as the EEPROM, the RAM 25b backed up by the battery, the pre-distortion arithmetic/control section 101 and the phase-difference correcting arithmetic/control section 102.

The pre-distortion arithmetic/control section 101 includes the distortion compensation coefficient memory 24a, the pre-distortion unit 24b which applies pre-distortion processing to the modulating signal using the distortion compensation coefficients h(Pi) conforming to the levels of the modulating signal, the distortion compensation coefficient arithmetic unit 24c for comparing the modulating signal with demodulated signal obtained by demodulation using the orthogonal detector 34, updating the distortion compensation coefficients h(Pi) in such a manner that the difference between the compared signals becomes zero and storing the updated coefficients in the distortion compensation coefficient memory 24a, and the distortion coefficient read/write unit 24d. Distortion compensation coefficients h(Pi) (i=0~1023) conforming to the input levels 0~1023 of the transmission data are stored in the non-volatile memory 25a in advance.

The phase-difference correcting arithmetic/control section 102 has a phase-difference arithmetic unit 24e for calculating the phase difference between the modulating and demodulated signals, a selector 24f for selectively entering the demodulated signals into the pre-distortion arithmetic/control section 101 and the phase-difference arithmetic unit 24e, a correction table 24g which stores the correspondence between phase difference dθ and phase-difference correction coefficients cos dθ, sin dθ, and a phase-difference correction unit 24h for subjecting the modulating signal, which has undergone distortion compensation processing, to phase-difference correction processing using the phase-difference correction coefficients.

(a-3) Phase-difference Correction Processing

Figure 59A:
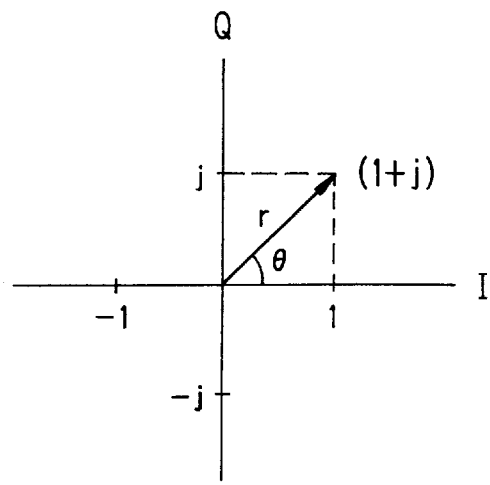
FIGS. 59A, 59B and 59C are diagrams for describing modulated signal level and phase.
Figure 59B:
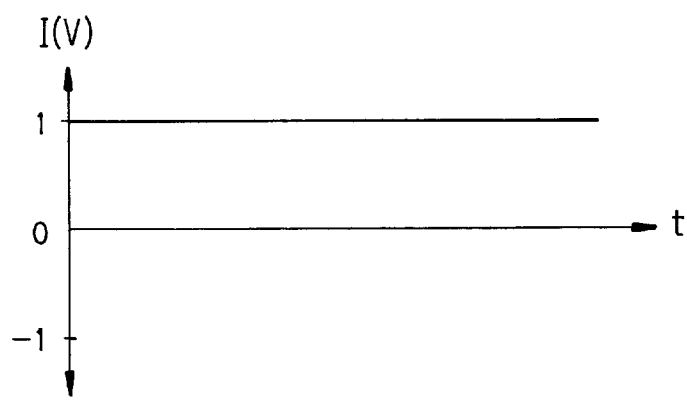
Figure 59C:
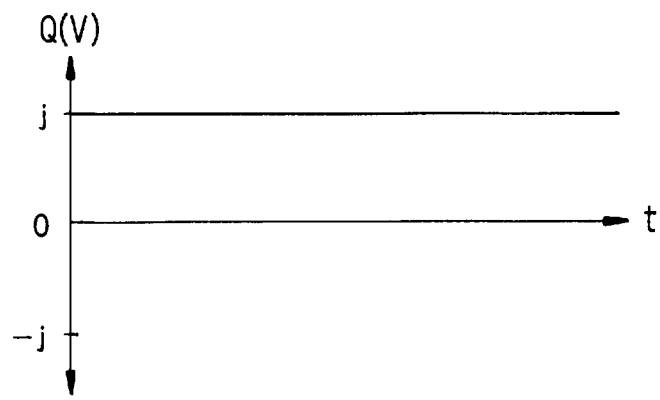
Figure 60A:
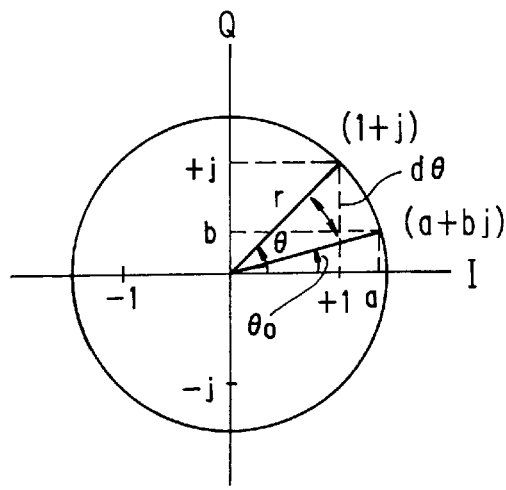
FIGS. 60A, 60B and 60C are diagrams for describing demodulated signal level and phase.
Figure 60B:
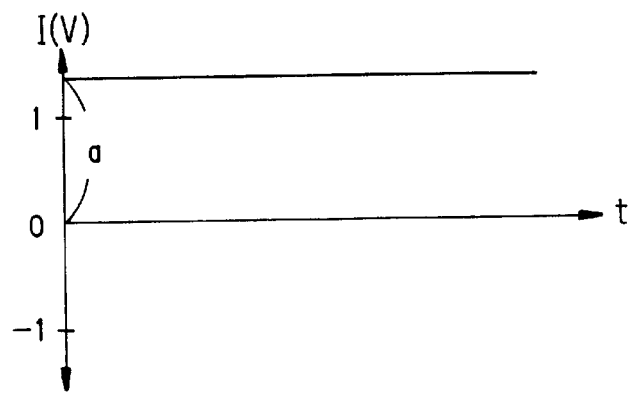
Figure 60C:
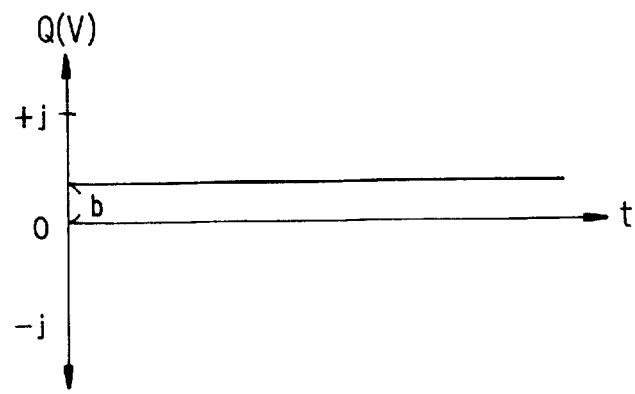

As shown in FIGS. 59A~59C, a fixed voltage $1+1_j$ (I=1, Q=1) of a signal level for which distortion does not occur in a transmission power amplifier is outputted as the modulating signals I and Q by the arithmetic/control unit 24. If demodulated signals (feedback baseband signals) $I_F$, $Q_F$ are monitored under these conditions, there is a transition ($I_F$=a, $Q_F$=b) to a point $a+b_j$ (−r<a, b<r) on the circumference of a circle of radius r (=√2), as illustrated in FIGS. 60A~60C. Accordingly, by individually A/D-converting the demodulated signals $I_F$ and $Q_F$ and mapping the voltage values thereof along the IQ axes, the phase difference dθ [rad] between the baseband signal (modulating signal) at the time of transmission and the baseband signal (demodulated signal) after feedback can be obtained. In other words, with the I axis serving as the basic axis, an angle $θ_0$ [rad] from this axis to the point $a+b_j$ is found in accordance with the following equation:

$$θ_0 = \tan^{-1}(b/a) \text{ [rad]} \quad (6)$$

Since the initial phase of the demodulated signal (transmission baseband signal) is situated at an angle of π/4 from the basic axis (θ=π/4), the phase difference dθ is found in accordance with the following equation:

$$dθ = θ_0 - π/4 \text{ [rad]} \quad (7)$$

If the phase of the modulating signals I and Q is corrected by the amount of the phase difference dθ and outputted from the arithmetic/control unit 24, the phase of the modulating signals and the phase of the demodulated signals will coincide. Accordingly, if we let $I_C$ and $Q_C$ represent the modulating signals after the correction of phase difference, it will suffice to obtain $I_C$ and $Q_C$ in accordance with the following equations and output the result:

$$I_C = r\cos(θ - dθ) \quad (8)$$
$$= r\cos θ \cos dθ + r\sin θ \sin dθ$$
$$= I\cos dθ + Q\sin dθ$$
$$Q_C = r\sin(θ - dθ) \quad (9)$$
$$= r\sin θ \cos dθ + r\cos θ \sin dθ$$
$$= Q\cos dθ + I\sin dθ$$

Since calculating cos dθ and sin dθ takes time, cos dθ, sin dθ are stored beforehand in the correction table 24g as phase-difference correction coefficients in correspondence with the phase difference dθ. The phase-difference correction unit 24h goes to the correction table 24g to obtain the phase-difference correction coefficients cos dθ, sin dθ corresponding to a measured phase difference dθ, calculates the modulated signals from Equations (8), (9) and outputs the corrected signals.

Figure 61:
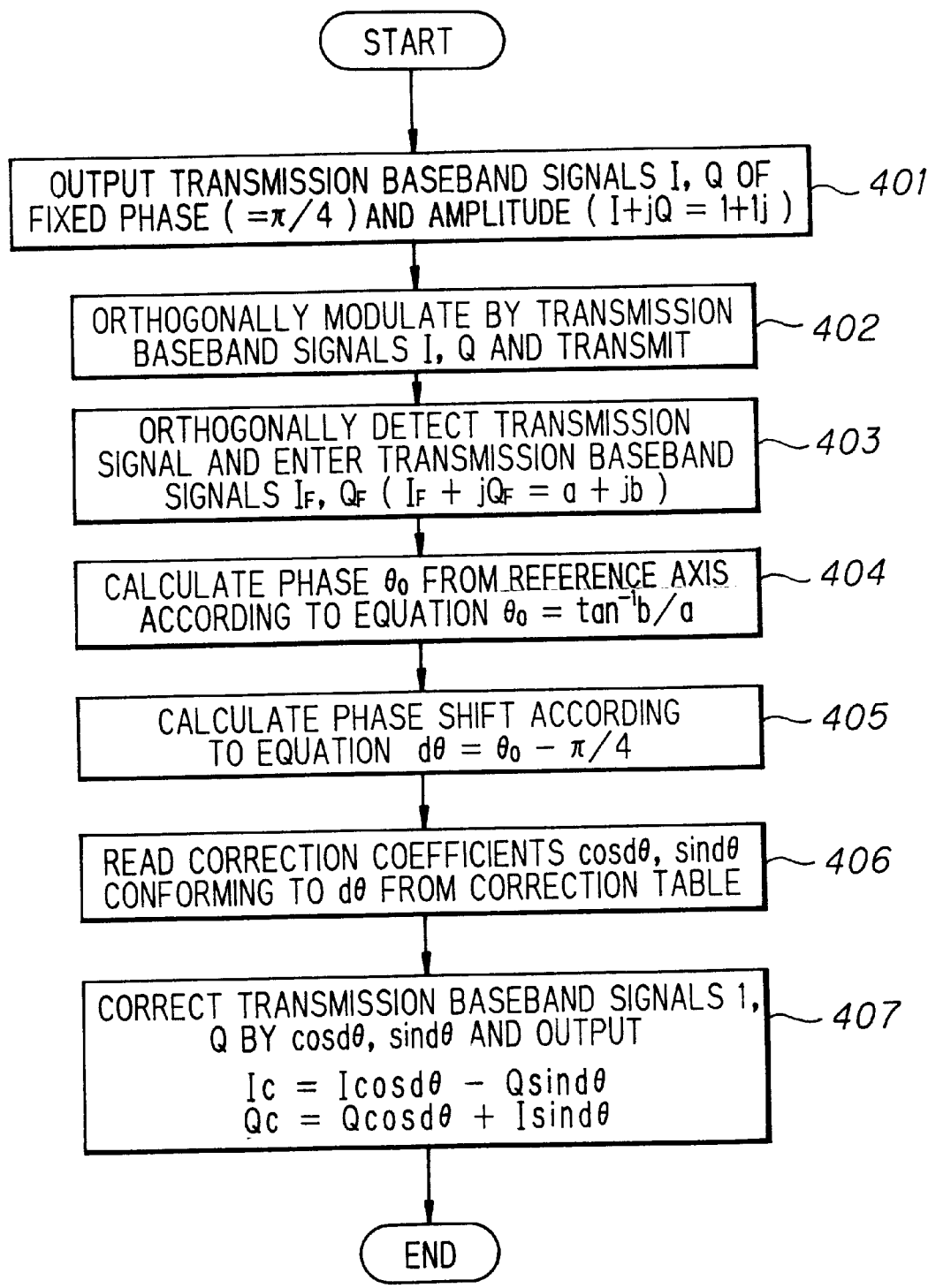
FIG. 61 is a flowchart of phase-difference correction processing according to a first embodiment.

FIG. 61 is a flowchart of processing for correcting phase difference. Before distortion compensation processing is executed by the pre-distortion arithmetic/control section 101, the phase-difference correcting arithmetic/control section 102 measures phase difference and controls the correction of phase difference. More specifically, when power is introduced to the radio apparatus, the microcomputer 38 instructs the arithmetic/control unit 24 and the phase-difference measurement data generator 40a to start the correction of phase difference. Data having a fixed amplitude r and phase θ for the purpose of measuring phase difference are generated as transmission data by the phase-difference measurement data generator 40a. For example, data for phase-difference measurement indicative of r=29√2, θ=π/4 $(1+1_j$ when expressed in the form of complex numbers) are generated. The pre-distortion arithmetic/control section 101 does not apply pre-distortion processing to these data, effects the conversion to the I and Q signals (I=1, Q=1) and outputs the signals (step 401). The orthogonal modulator 28 orthogonally modulates the carrier wave by the I, Q signals, the frequency converter 29 frequency-converts the modulated carrier wave to a high-frequency signal, and the transmission power amplifier 30 amplifies the high-frequency signal and transmits the amplified signal from the antenna (step 402). The orthogonal detector 34 applies detection processing to the transmission signal that has entered via the directional coupler 32 and the frequency converter 33 and outputs the feedback baseband signals (demodulated signals) $I_F$ and $Q_F$ (step 403). It should be noted that the feedback baseband signals $I_F$ and $Q_F$ are a+bj ($I_F$=a, $Q_F$=b).

Next, the phase-difference arithmetic unit 24e (FIG. 58) obtains the phase $θ_0$ of the demodulated signal from Equation (6) and obtains the phase difference dθ from Equation (7) (steps 404, 405). If the phase difference dθ is obtained, a reading unit (not shown) reads the phase-difference correction coefficients cos dθ, sin dθ from the correction table 34g and enters these coefficients into the phase-difference correction unit 24h (step 406). This ends the processing for measuring phase difference and the processing for reading out the phase-difference correction coefficients.

Thereafter, pre-distortion processing by the pre-distortion arithmetic/control section 101 starts and the modulating signals are subjected to pre-distortion processing. The phase-difference correction unit 24h performs a phase-difference correction by executing the operations of Equations (8), (9) using the I and Q signals that have been subjected to pre-distortion processing as well as the phase-difference correction coefficients cos dθ, sin dθ and outputs the signals that have undergone the phase-difference correction (step 407).

It is so arranged that the measured phase difference dθ or phase-difference correction coefficients cos dθ, sin dθ is (are) stored in the non-volatile memory 25a and RAM 25b and can be read out and used the next time power is introduced to the apparatus. If this arrangement is adopted, the main pre-distortion processing can start and the processing for correcting phase difference can be carried out immediately without measuring the phase difference when power is introduced.

(a-4) Distortion Compensation Processing

If control for correction of phase difference is finished, the pre-distortion arithmetic/control section 101 subjects the entered modulating signals to pre-distortion compensation processing and outputs the processed signals. More specifically, at the time of initial communication, the distortion coefficient read/write unit 24d (FIG. 58) sets the distortion compensation coefficients, which have been stored in the non-volatile memory 25a, in the distortion compensation coefficient memory 24a, after which the pre-distortion unit 24b converts the modulating signal to the I and Q signals, obtains the distortion compensation coefficient h(Pi), which conforms to the level of the modulating signal, from the distortion compensation coefficient memory 24a and applies pre-distortion processing to the I and Q signals in dependence upon this distortion compensation coefficient. The phase-difference correction unit 24h performs a phase-difference correction by executing the operations of Equations (8), (9) using the I and Q signals that have been subjected to pre-distortion processing as well as the phase-difference correction coefficients cos dθ, sin dθ and outputs the signals that have undergone the phase-difference correction.

The distortion compensation coefficient arithmetic unit 24c compares the modulating signal with the demodulated signal obtained by demodulation using the orthogonal detector 34, updates the distortion compensation coefficient h(Pi) in such a manner that the difference between the compared signals becomes zero and rewrites the content of the distortion compensation coefficient memory 24a.

Thereafter, the pre-distortion unit 24b performs pre-distortion processing using the updated distortion compensation coefficients, the phase-difference correction unit 24h performs phase-difference correction processing and the compensation coefficient arithmetic unit 24c performs processing for updating the distortion compensation coefficients. If communication is finished, the distortion coefficient read/write unit 24d stores the content of the distortion compensation coefficient memory 24a in the non-volatile memory 25a or battery backed-up RAM 25b.

The next time communication is performed, the distortion coefficient read/write unit 24d reads the distortion compensation coefficients out of the RAM 25b and sets them in the distortion compensation coefficient memory 24a. In a case where the data that have been stored in the RAM 25b vanish because the radio apparatus has not been used for a long time, the distortion compensation coefficients are read out of the non-volatile memory 25a and set in the distortion compensation coefficient memory 24a. Then, when communication ends, the distortion coefficient read/write unit 24d stores the content of the distortion compensation coefficient memory 24a in the non-volatile memory 25a and battery backed-up RAM 25b.

In a case where the radio apparatus transmits signals through time-division multiplexing by the TDMA method, the phase-difference correcting arithmetic/control section 102 measures phase difference and executes the phase-difference correction processing in the preamble period situated ahead of the burst period of the apparatus' own time slot. If this arrangement is adopted, the phase-difference correction processing ends in the preamble period and the main distortion compensation processing is executed rapidly from the next burst period.

(a-5) Modification

Figure 62:
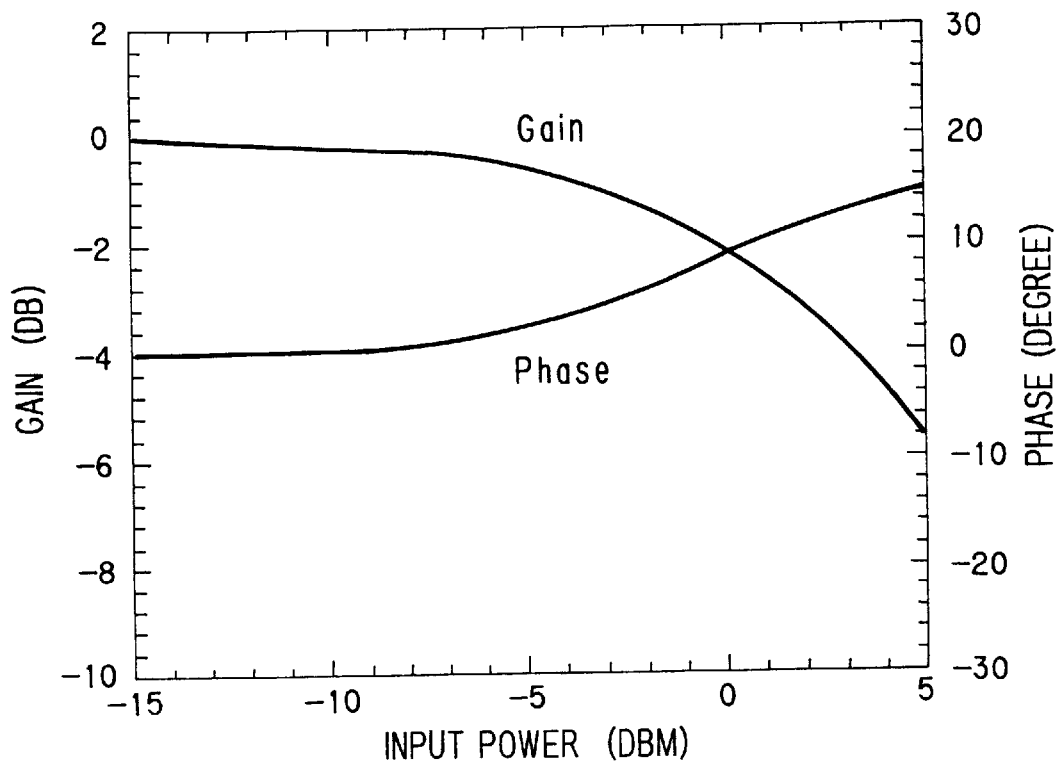
FIG. 62 is a characteristic diagram of input power/gain and input power/phase of a transmission power amplifier.
Figure 63A:
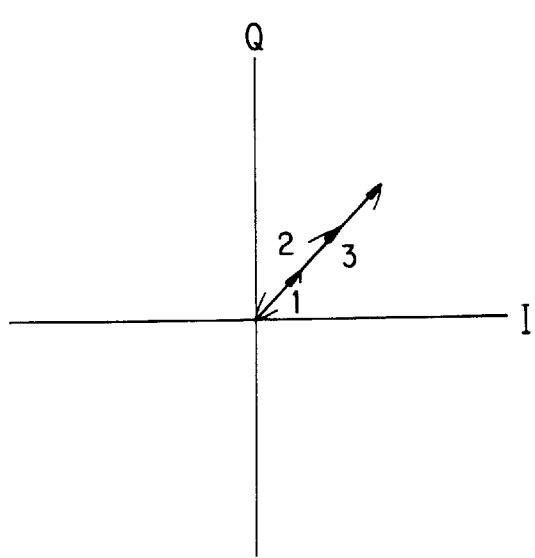
FIGS. 63A and 63D are diagrams for describing a change in phase difference due to amplitude.
Figure 63B:
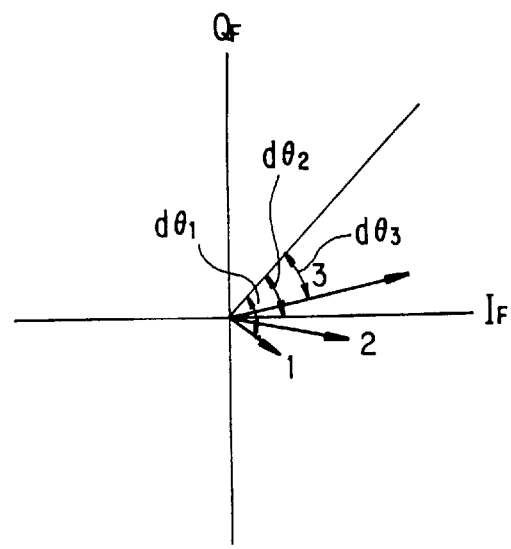

The foregoing is for a case in which a carrier wave is transmitted upon being orthogonally modulated by a modulating signal having a level that does not give rise to distortion in the transmission power amplifier 30, the phase difference dθ between the modulating and demodulated signals is measured and a correction is applied so as to null the phase difference dθ. However, as shown in FIG. 62, the output phase of the transmission power amplifier 30 varies in dependence upon the input power (input level), as shown in FIG. 62. More specifically, when the amplitude of the modulating signal differs, the phase difference dθ changes even if the phase is the same, as shown in FIGS. 63A, 63B. Further, in case of an amplitude level at which distortion does not occur, the amplitudes r of the modulating and demodulated signals are the same and Equations (8) and (9) hold. However, when the amplitude level takes on a large value, the amplitude of the modulating and demodulated signal at which distortion occurs differ and Equations (8) and (9) no longer hold true. Consequently, if the phase difference is corrected by Equations (8) and (9) in a case where the amplitude level has a large value, a correction error arises.

Accordingly, as shown in FIG. 64, amplitude level A is divided into three regions, namely $0 < A \leq A_1$, $A_1 < A \leq A_2$ and $A_2 < A$, phase-difference correction coefficients $c_1$, $c_2$ conforming to the phase difference dθ are obtained for each region and these are stored in the correction table 24g. The phase differences are obtained with regard to the amplitude level of each region when phase difference is measured and the phase-difference compensation coefficients conforming to these phase differences are obtained from the correction table 24g. When phase difference is corrected, the correction is performed in accordance with the following equations using the phase-difference compensation coefficients conforming to the region to which the amplitude level of the modulating signal belongs:

$$I_c = I \cdot c_1 + Q \cdot c_2 \qquad (8)'$$

$$Q_c = Q \cdot c_1 - I \cdot c_2 \qquad (9)'$$

If this arrangement is adopted, phase difference can be corrected accurately irrespective of the amplitude level.

(b) Second Embodiment

(b-1) Overall Construction

Figure 65:
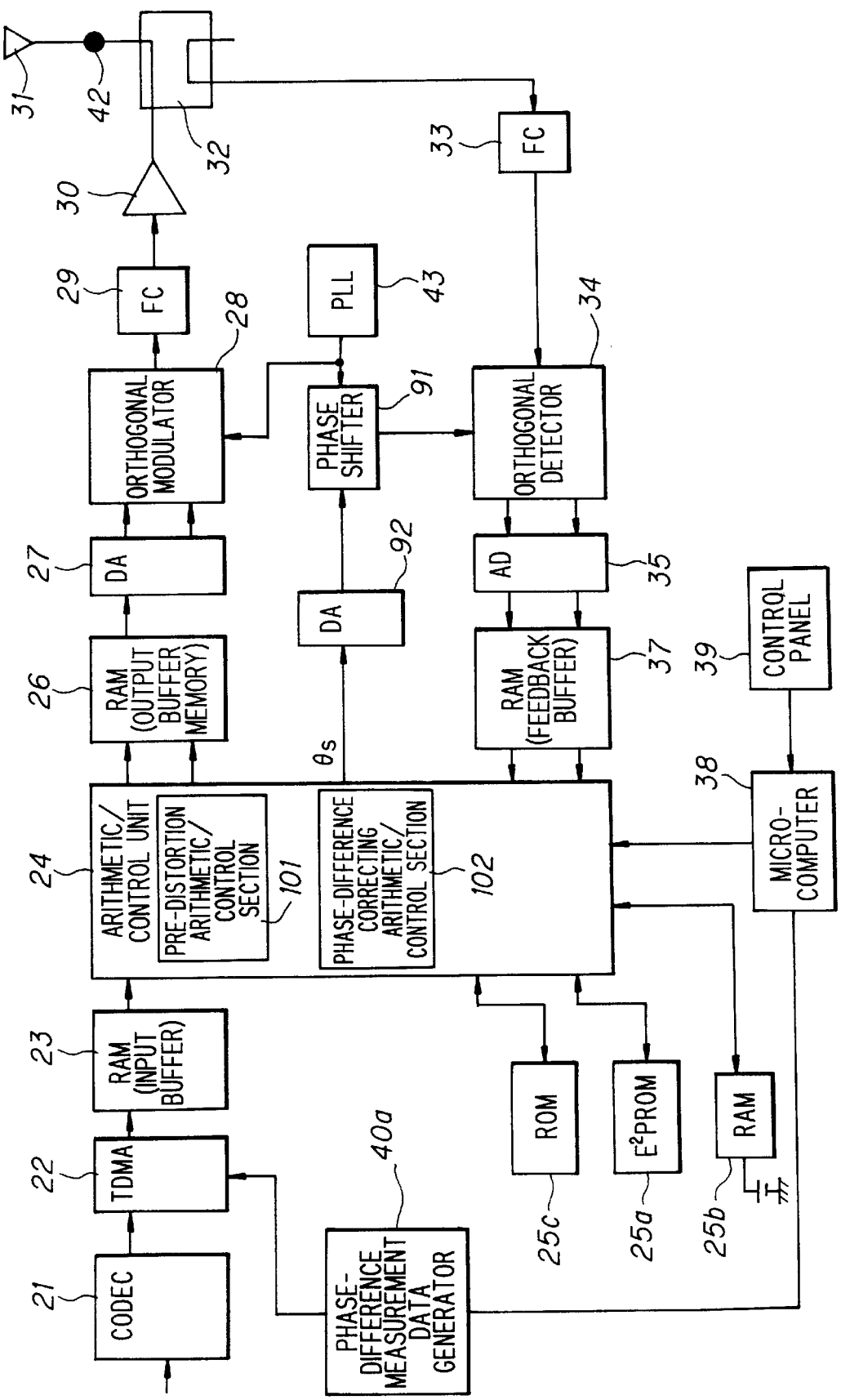
FIG. 65 is a diagram showing the construction of a second embodiment of a radio apparatus having a phase-difference correction function.
Figure 66:
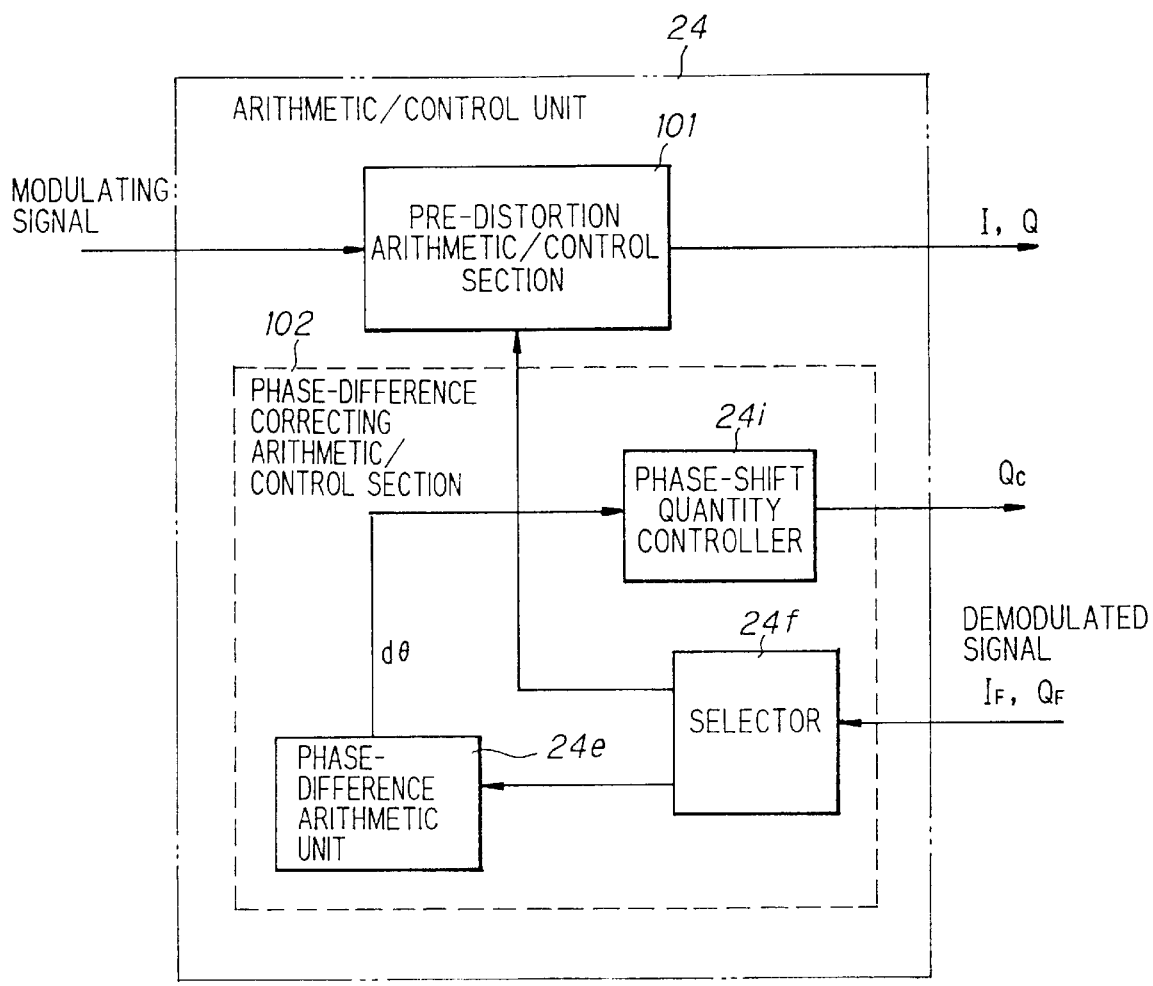
FIG. 66 is a diagram showing the construction of an arithmetic/control unit according to the second embodiment.

FIG. 65 is a diagram showing the construction of a radio apparatus according to a second embodiment of this aspect of the invention. Elements in FIG. 65 identical with those of the first embodiment in FIG. 57 are designated by like reference characters. This embodiment differs from the second embodiment in that the phase-difference correcting arithmetic/control section 102 shifts the phase of the reference carrier applied to the orthogonal modulator 28 or orthogonal detector 34, thereby nulling the phase difference dθ. Therefore, in the second embodiment of FIG. 65, (1) the phase shifter 91 for shifting the phase of the reference carrier wave and the DA converter 92 for DA-converting a phase-shift quantity θs, which is outputted by the phase-difference correcting arithmetic/control section 102, and entering or inputting the analog signal into the DA converter 92 are provided, and (2) the phase-difference correcting arithmetic/control section 102 is constructed as shown in FIG. 66.

The phase-difference correcting arithmetic/control section 102 includes the arithmetic unit 24e for calculating the phase difference dθ between the modulating and demodulated signals in accordance with Equations (6), (7), the selector 24f for selectively entering the demodulated signals $I_F$ and $Q_F$ into the pre-distortion arithmetic/control section 101 and the phase-difference arithmetic unit 24e, and a phase-shift quantity controller 24i for outputting the phase-shift quantity θs of the reference carrier wave in such a manner that the phase difference dθ becomes zero. It should be noted that when the phase of the reference carrier which enters the orthogonal modulator 28 or orthogonal detector 34 is changed by 0~360°, the phase of the feedback baseband signals (demodulated signals) varies in dependence upon this change.

Figure 67:
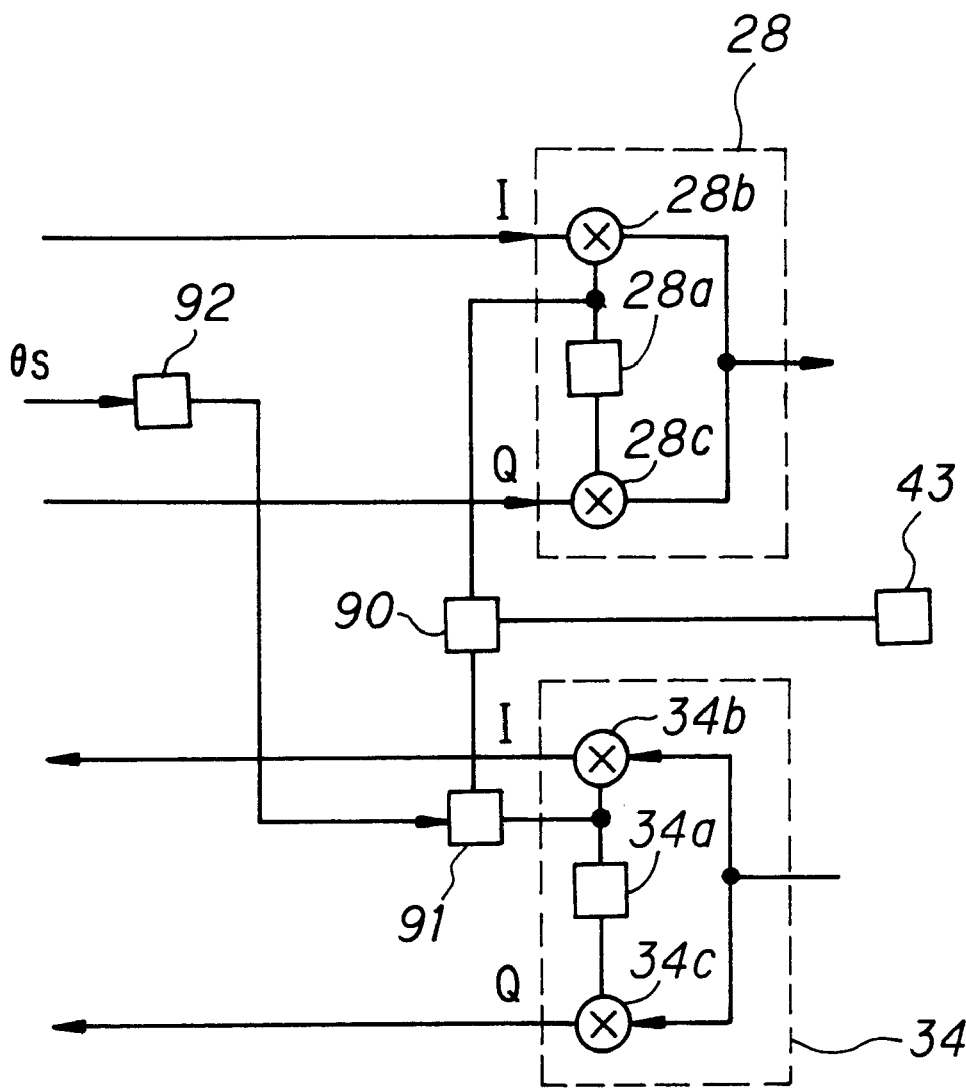
FIG. 67 is a diagram showing the details of an orthogonal modulator and an orthogonal detector.

FIG. 67 is a detailed diagram of the arithmetic/control unit in a case where the phase of the reference carrier applied to the orthogonal detector is varied. Shown in FIG. 67 are the orthogonal modulator 28, the orthogonal detector 34, the reference carrier wave generator 43 constituted by a PLL, a hybrid circuit 90 which branches the reference carrier wave to the orthogonal modulator and orthogonal detector, the phase shifter 91 an the DA converter 92. The phase shifter 91 shifts the phase of the reference carrier wave, which enters the orthogonal detector 34 or orthogonal modulator 28, in accordance with a command (amount of phase shift) from the phase-shift quantity controller 24$i$ of the phase-difference correcting arithmetic/control section 102. It should be noted that the arrangement for changing the phase of the reference carrier that enters the orthogonal modulator 28 is the same as that shown in FIG. 56.

(b-2) Principle of Phase Adjustment

Figure 68A:
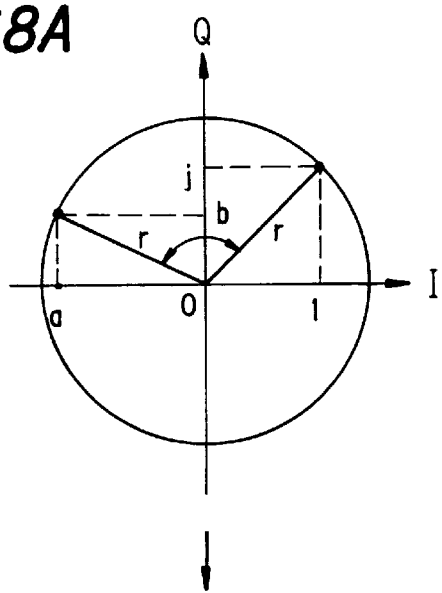
FIGS. 68A, 68B and 68C is a diagram for describing the principle of phase adjustment according to the second embodiment.
Figure 68B:
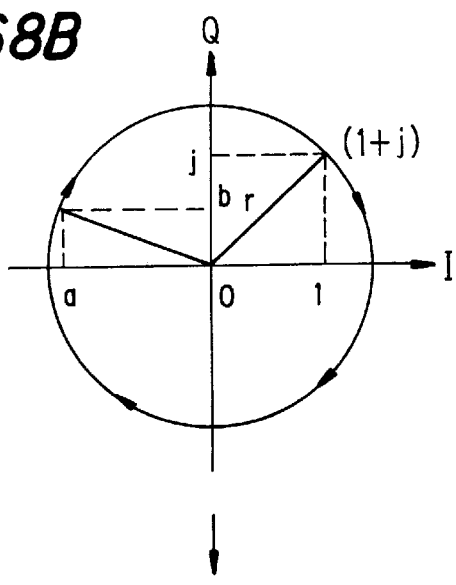
Figure 68C:
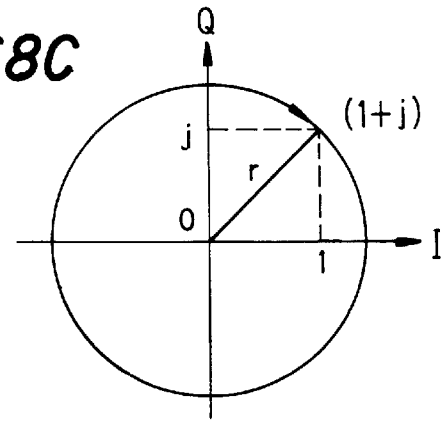

A fixed voltage 1+1j (I=1, Q=1) of a signal level for which distortion does not occur in the transmission power amplifier is outputted as the modulated signals I and Q by the arithmetic/control unit 24. If the demodulated signals (feedback baseband signals) $I_F$ and $Q_F$ are monitored under these conditions, there is a transition to a point a+bj (−r<a, b<r) on the circumference of a circle of radius r, as illustrated in FIG. 68A. If the phase of the reference carrier which enters the orthogonal modulator 28 or orthogonal detector 34 is changed by 0~360°, the phase of the feedback baseband signals (demodulated signals) varies in dependence upon this change, as indicated by the arrows in FIG. 68B. Accordingly, when the phase of the reference carrier is shifted by a prescribed angle, the phase of the demodulated signals coincides with the phase of the modulating signals in the manner shown in FIG. 68C.

(b-3) Phase-difference Compensating Processing

Figure 69:
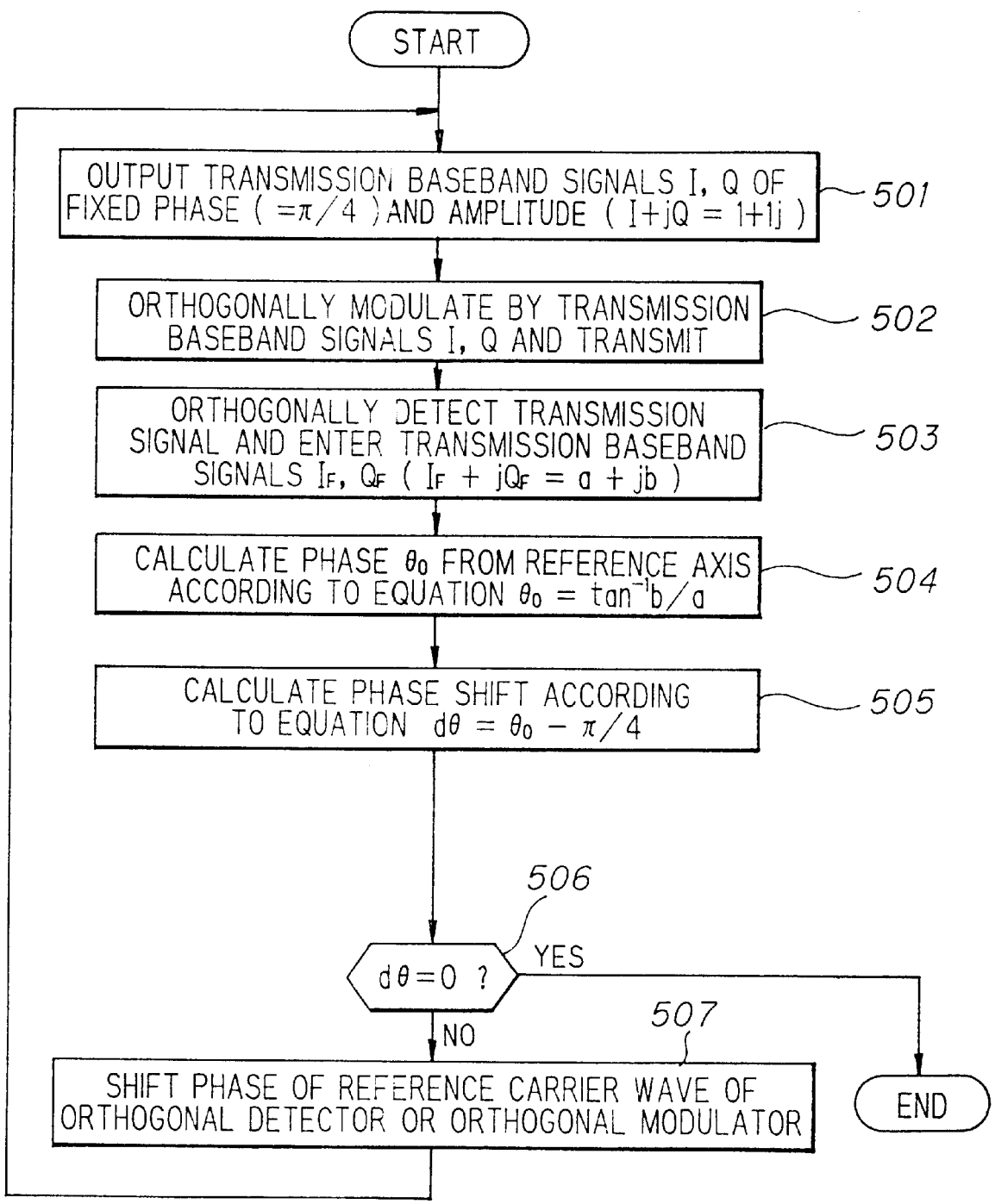
FIG. 69 is a flowchart of phase-difference correction processing according to the second embodiment.

FIG. 69 is a flowchart of processing for correcting phase difference. Before distortion compensation processing is executed by the pre-distortion arithmetic/control section 101, the phase-difference correcting arithmetic/control section 102 measures phase difference and controls the correction of phase difference. More specifically, when power is introduced to the radio apparatus, the microcomputer 38 instructs the arithmetic/control unit 24 and the phase-difference measurement data generator 40$a$ to start the correction of phase difference. Data having a fixed amplitude r and phase θ for the purpose of measuring phase difference are generated as transmission data by the phase-difference measurement data generator 40$a$. For example, data for phase-difference measurement indicative of r=√2, θ=π/4 (1+1j when expressed in the form of complex numbers) are generated. The pre-distortion arithmetic/control section 101 does not apply pre-distortion processing to these data, effects the conversion to the I and Q signals (I=1, Q=1) and outputs the signals (step 501). The orthogonal modulator 28 orthogonally modulates the carrier wave by the I and Q signals, the frequency converter 29 frequency-converts the modulated carrier wave to a high-frequency signal, and the transmission power amplifier 30 amplifies the high-frequency signal and transmits the amplified signal from the antenna (step 502). The orthogonal detector 34 applies detection processing to the transmission signal that has entered via the directional coupler 32 and the frequency converter 33 and outputs the feedback baseband signals (demodulated signals) $I_F$ and $Q_F$ (step 503). It should be noted that the feedback baseband signals $I_F$ and $Q_F$ are a+bj ($I_F$=a, $Q_F$=b).

Next, the phase-difference arithmetic unit 24$e$ (FIG. 66) obtains the phase $θ_0$ of the demodulated signal from Equation (6), obtains the phase difference dθ from Equation (7) and enters or inputs these into the phase-shift quantity controller 24$i$ (steps 504, 505). The phase-shift quantity controller 24$i$ checks to see whether the phase difference dθ is zero or not (step 506). If the phase difference is zero, the phase-shift quantity controller 24$i$ terminates the processing for correcting phase difference. If the phase difference dθ is not zero, however, the phase-shift quantity controller 24$i$ outputs the phase-shift quantity θs in order to shift the phase of the reference carrier of orthogonal detector 34 or orthogonal modulator 28 through the prescribed angle (step 507). By thenceforth returning to the beginning and repeating the above processing, the phase difference dθ can be successively reduced and eventually made zero. It should be noted that phase-shift quantity controller 24$i$ compares the size of the preceding phase difference of which it has been informed and the size of the present phase difference, determines that the direction of the phase shift is positive and shifts the phase in this direction if the present phase difference is smaller, and shifts the phase in the opposite direction if the present phase difference is larger.

In the foregoing, the phase-shift quantity θs that nulls the phase difference dθ is stored in the non-volatile memory 25$a$ and backed-up RAM 25$b$. The next time power is introduced to the apparatus, θs is read out and used. If this arrangement is adopted, the main pre-distortion processing can start and the processing for correcting phase difference can be carried out immediately without measuring the phase difference when power is introduced.

Further, the phase-difference correcting arithmetic/control section 102 executes processing for correcting phase difference in the preamble period situated ahead of the burst period. If this arrangement is adopted, the phase-difference correction processing ends in the preamble period and the main distortion compensation processing is executed rapidly from the next burst period.

(b-4) First Modification

Figure 70:
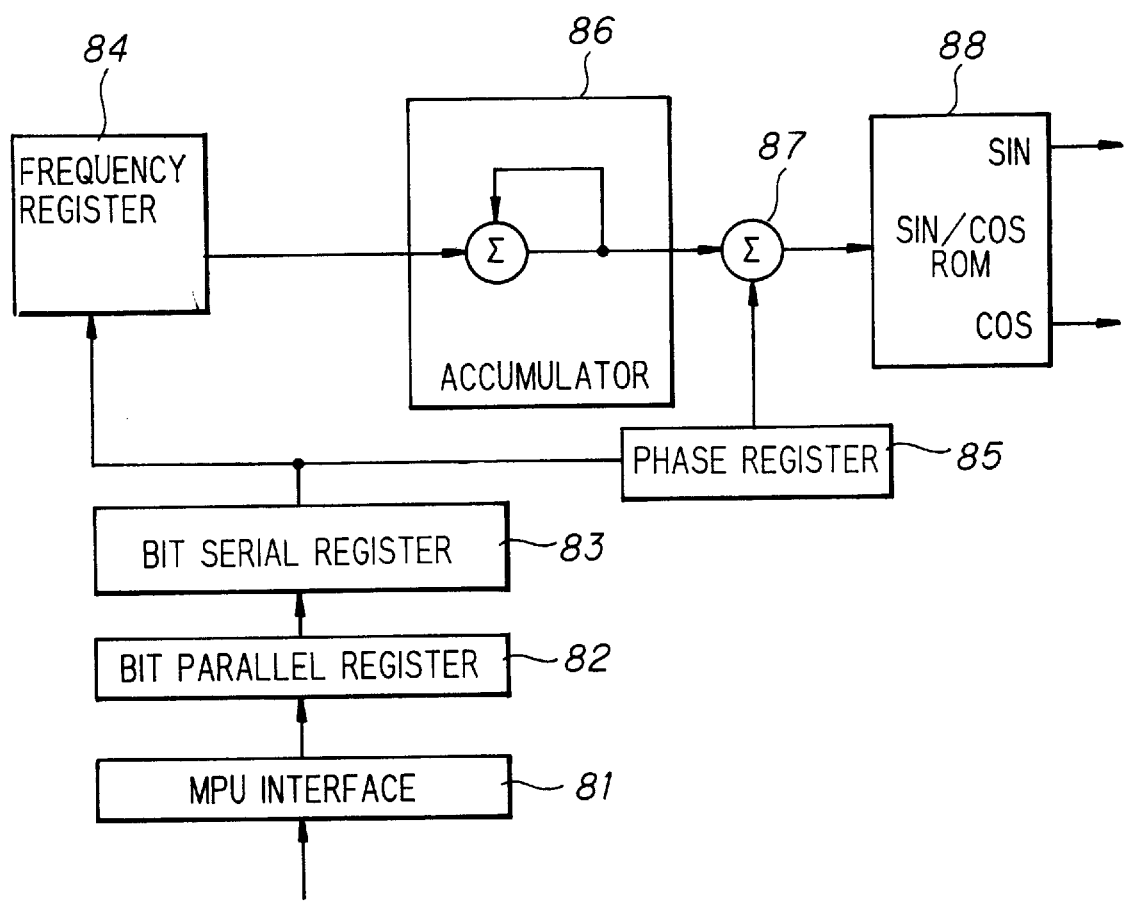
FIG. 70 is a diagram showing the construction of a direct digital synthesizer.
Figure 71:
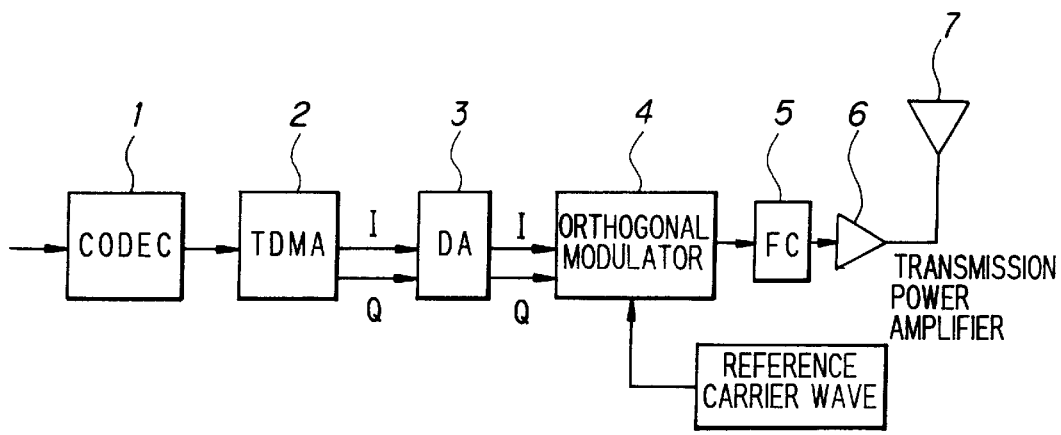
FIG. 71 is a diagram showing the construction of a transmission apparatus according to the prior art.
Figure 72A:
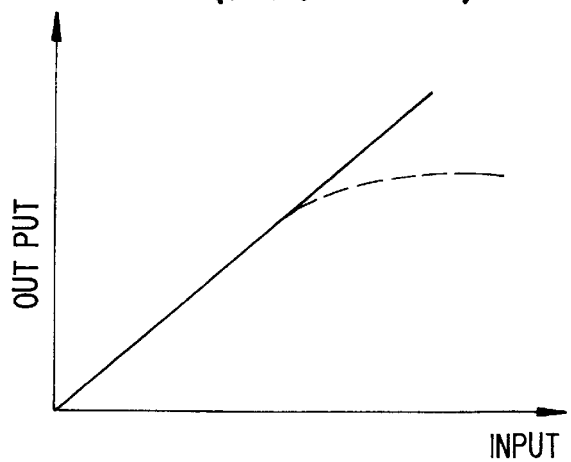
FIGS. 72A and 72B are diagrams for describing problems due to non-linearity of a transmission power amplifier.
Figure 72B:
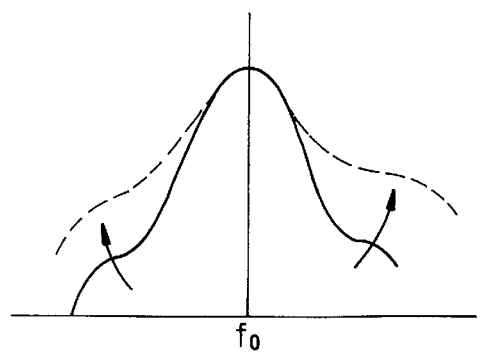
Figure 73:
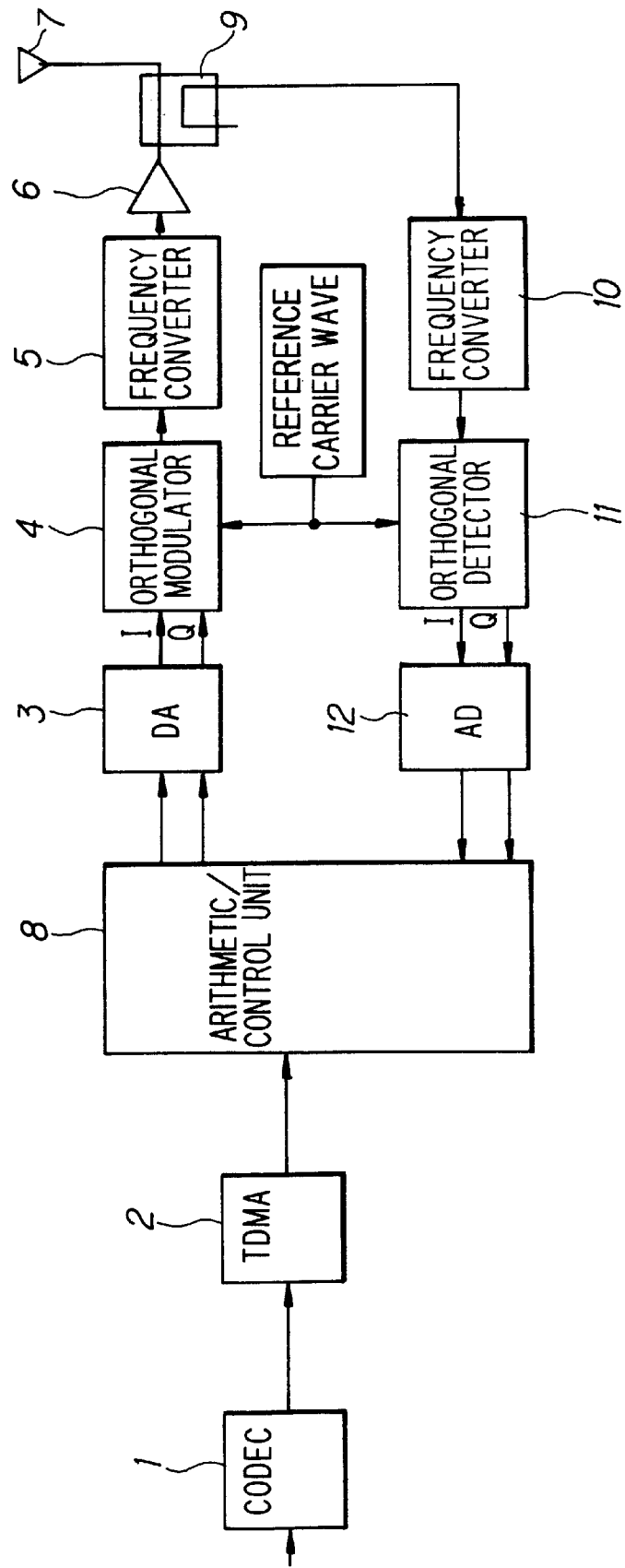
FIG. 73 is a diagram showing the construction of a transmission apparatus having a function for digitally compensating for non-linear distortion according to the prior art.
Figure 74:
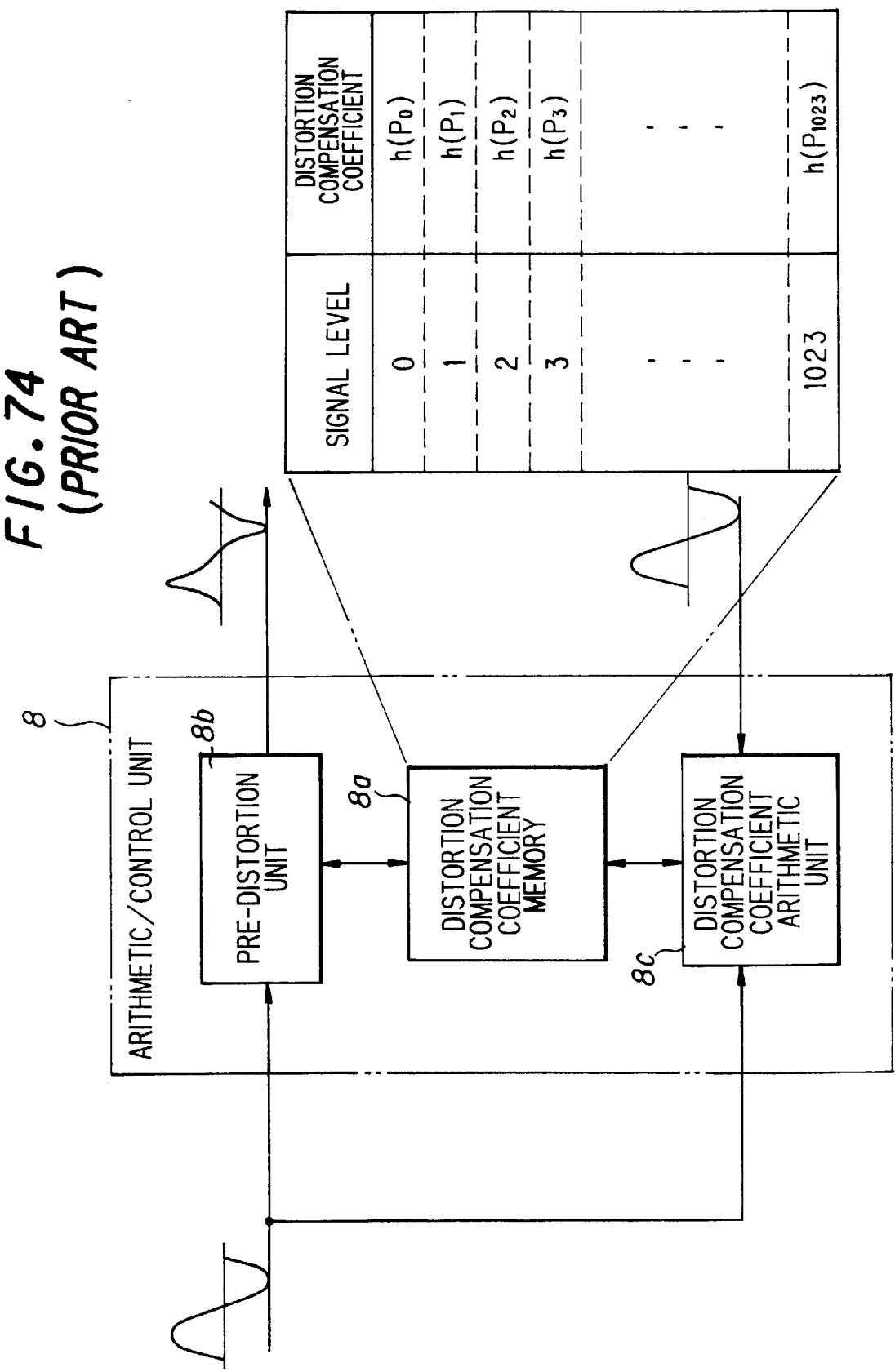
FIG. 74 is a functional block diagram of an arithmetic/control unit.
Figure 75:
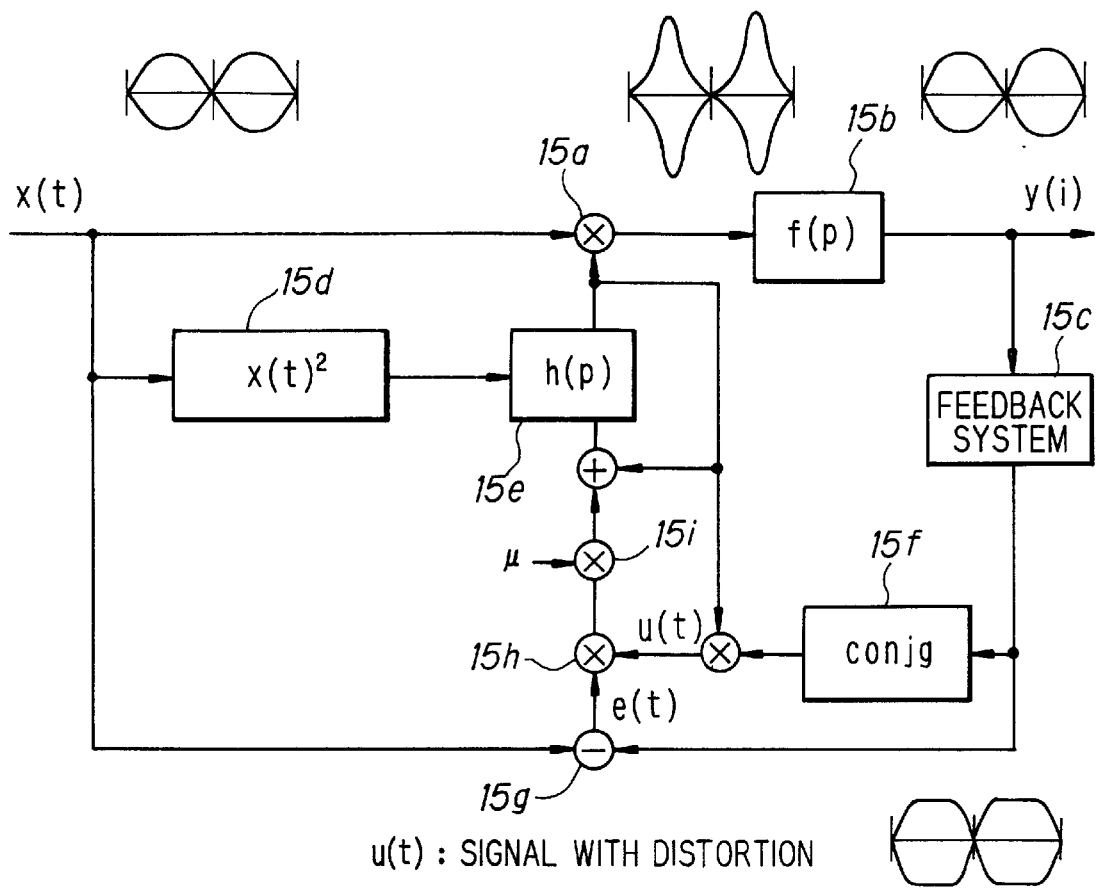
FIG. 75 is a diagram for describing distortion compensation processing.

The foregoing relates to a case where the phase shifter 91 is provided to control the phase of the feedback baseband signals. However, it is also possible to shift phase using a DDS (direct digital synthesizer). FIG. 70 is a block diagram showing the DDS. The DDS includes an MPU interface 81 for interfacing the microprocessor MPU, a bit parallel register 82 for storing commanded frequency data and phase data, a bit serial register 83, a frequency register 84 in which frequency data are set, a phase register 85 in which phase data are set, an accumulator 86 for cumulatively adding frequency data whenever a prescribed clock signal is generated, an adder 87 for adding a pulse which overflows from the accumulator 86 to the phase data and outputting the sum as address data, and a sin/cos generating ROM for storing sine wave data and cosine wave data and outputting sin data and cos data from an address designated by the sum from the adder 87.

The accumulator 86 outputs pulses at a frequency proportional to the frequency data that have been set in the frequency register 84. Accordingly, if the phase data are indicative of zero, the ROM 88 delivers the cos signal and sin signal having the commanded frequency. If the phase data are not indicative of zero, the sum from the adder 87 changes by an amount equivalent to the phase data and, hence, the cos signal and sin signal change in phase.

Accordingly, the phase of the reference signal can be controlled by changing the phase data set in the phase register 85.

(b-5) Second Modification

In the offset processing, the phase of the reference carrier which enters the orthogonal modulator 28 is shifted by 0~360° and the phase of the carrier is rotated. Consequently, the offset compensation processing and the phase-difference correction processing can be executed simultaneously. For example, when the carrier leakage signal in the absence of modulation is regarded as a modulating signal for detection of phase difference and the phase of the reference carrier has been shifted by 0~360°, the phase-shift quantity θs that will cause the phase of the demodulated signal to coincide with the phase of this modulating signal is obtained.

Further, in offset compensation processing, the arithmetic/control unit 24 outputs I and Q signals in such a manner that the $I_F$ and $Q_F$ signals of a unit circle are detected and outputted. Accordingly, phase-difference correction processing can be executed by measuring the phase difference dθ using the $I_F$ and $Q_F$ signals regarding the prescribed I and Q signals and obtaining the phase-difference correction coefficients conforming to the phase difference.

Thus, the radio apparatus of the present invention possessing a phase-difference correction function has the following advantages: the phase difference dθ between the modulating and demodulated signals is measured prior to pre-distortion processing and the modulating signal is subjected to phase-difference correction processing so as to null the phase difference. As a result, phase difference can be eliminated and accurate distortion compensation processing can be executed. Moreover, phase difference can be eliminated irrespective of circuit mounting position and frequency.

Further, phase difference is measured prior to distortion compensation processing, phase-difference correction coefficients are obtained so as to null the phase difference, and a modulating signal obtained by distortion compensation processing is subjected to phase-difference correction processing using the phase-difference correction coefficients. As a result, phase difference need not always be measured and processing for measuring phase difference and for correcting the same can be executed without placing a load upon the arithmetic/control unit.

Measured phase difference or a phase-difference correction coefficient conforming to phase difference is stored in non-volatile memory means or in memory means backed up by a battery. The next time communication is performed, phase-difference correction processing is executed using the phase-difference correction coefficient that has been stored. As a result, distortion compensation processing can be started immediately and phase difference corrected without measuring phase difference.

Further, the correspondence between phase differences and phase-difference correction coefficients is stored in memory for each amplitude of a modulating signal and phase-difference correction processing is applied to the modulating signal using the phase-difference correction coefficient conforming to the amplitude of the modulating signal and the phase difference dθ. This makes possible more accurate phase-difference correction processing.

Furthermore, processing for measuring phase difference and for correcting phase difference is executed in the preamble period situated ahead of the burst period of the time slot. As a result, the main distortion compensation processing can be executed rapidly.

Further, the phase difference dθ between the modulating and demodulated signals is measured prior to pre-distortion processing and the phase of a reference carrier wave applied to the orthogonal modulator or orthogonal detector is shifted in such a manner that the phase difference dθ becomes zero. As a result, phase difference can be eliminated and accurate distortion compensation processing can be executed. Moreover, phase difference can be eliminated irrespective of circuit mounting position and frequency.

Further, the amount of shift that will eliminate a phase difference is stored in non-volatile memory means or memory means backed up by a battery. The next time communication is performed, the phase of a reference carrier wave applied to the orthogonal modulator or orthogonal detector is shifted using the amount of shift stored. As a result, distortion compensation processing can be started immediately and phase difference can be corrected without measuring the phase difference.

As many apparently widely different embodiments of the present invention can be made without departing from the spirit and scope thereof, it is to be understood that the invention is not limited to the specific embodiments thereof except as defined in the appended claims.

What is claimed is:

1. A radio apparatus having a distortion compensating function for amplifying a carrier wave, which has been modulated by digital modulation, by a transmission power amplifier and transmitting the amplified carrier wave, comprising:

non-volatile memory means or memory means backed up by a battery, in which distortion compensation coefficients for compensating for a distortion characteristic of the amplifier are stored in advance; and an arithmetic/control unit for applying pre-distortion processing to a modulating signal using the distortion compensation coefficients that have been stored in said memory means and updating the distortion compensation coefficients in such a manner that a difference between the modulating signal and a demodulated signal obtained by branching and demodulating a transmitted carrier wave becomes zero, and wherein an antenna of the radio apparatus is removed, an output of the radio apparatus is terminated by a dummy load having same input impedance as that of said antenna, and said arithmetic/control unit compares the modulating signal and the demodulated signal obtained by branching and demodulating the carrier wave, calculates and updates the distortion compensation coefficients of the amplifier and subsequently repeats pre-distortion processing and processing for calculating and updating distortion compensation coefficients, thereby to obtain converged distortion compensation coefficients, and stores the converged distortion compensation coefficients in said memory means as initial values.

2. A radio apparatus having a distortion compensating function for amplifying a carrier wave, which has been modulated by digital modulation, by a transmission power amplifier and transmitting the amplified carrier wave, comprising:

non-volatile memory means or memory means backed up by a battery, in which distortion compensation coefficients for compensating for a distortion characteristic of the amplifier are stored in advance;

an arithmetic/control unit for applying predistortion processing to a modulating signal using the distortion compensation coefficients that have been stored in said memory means and updating the distortion compensation coefficients in such a manner that a difference between the modulating signal and a demodulated signal obtained by branching and demodulating a transmitted carrier wave becomes zero;

first storage means for storing the modulating signal that has been subjected to pre-distortion processing by said arithmetic/control unit prior to an allocated time slot;

a transmitter section for amplifying a carrier wave, which has been modulated by the modulating signal stored in said first storage means, and transmitting the amplified carrier wave in said allocated time slot; and second storage means for storing the demodulated signal obtained by feeding back the carrier wave, which has been branched from said transmitter section, and orthogonally detecting said carrier wave;

wherein said arithmetic/control unit comparing the modulating signal and the demodulated signal and executing processing for calculating and updating the distortion compensation coefficients in the apparatus' own time slot and in idle time slots.

3. The apparatus according to claim 2, wherein said arithmetic/control unit executes processing for updating distortion compensation coefficients per level of a modulating signal and, with regard to a modulating signal having a level for which updating has already been performed in a TDMA frame period, deletes calculation of distortion compensation coefficients in this TDMA period.

4. The apparatus according to claim 2, further comprising a monitoring unit for monitoring whether the apparatus' own time slot in the next TDMA frame period has approached;

wherein when the apparatus' own time slot has approached, processing for calculating and updating the distortion compensation coefficients by said arithmetic/control unit is suspended.

5. The apparatus according to claim 2, further comprising means which, in a case where a time slot has a burst period and a preamble period situated ahead of said burst period, is for entering low-speed signal into said arithmetic/control unit in said preamble period;

wherein said arithmetic/control unit calculates and updates the distortion compensation coefficients in real time using the low-speed signal which enter in the preamble period, subsequently subjects high-speed signal outputted in the burst period to pre-distortion processing by the distortion compensation coefficients obtained, outputs the processed high-speed signal and calculates and updates the distortion compensation coefficients in the apparatus' own time slot and in idle time slots.

6. The apparatus according to claim 2, further comprising:

reflected-wave detecting means for detecting waves reflected by an antenna of the radio apparatus; and a reflection decision unit for determining whether the level of the reflected waves in a data-transmission burst period is greater than a set value;

wherein when the level of the reflected waves is greater than the set value, said arithmetic/control unit forgoes execution of processing for updating the distortion compensation coefficients.

7. The apparatus according to claim 2, further comprising:

reflected-wave detecting means for detecting waves reflected by an antenna of the radio apparatus;

a reflection decision unit for determining whether the level of the reflected waves in a data-transmission burst period is greater than a set value; and means for making identifiable any demodulated signals which prevail when the level of the reflected waves is greater than the set value;

wherein said arithmetic/control unit forgoes execution of processing for updating the distortion compensation coefficients using the demodulated signal which prevail when the level of the reflected waves is greater than the set value.

8. A radio apparatus having a distortion compensating function for amplifying a carrier wave, which has been modulated by digital modulation, by a transmission power amplifier and transmitting the amplified carrier wave, comprising:

non-volatile memory means or memory means backed up by a battery, in which distortion compensation coefficients for compensating for a distortion characteristic of the amplifier are stored in advance in correspondence with each of various temperatures;

an arithmetic/control unit for applying pre-distortion processing to a modulating signal using the distortion compensation coefficients conforming to actual ambient temperature that have been stored in said memory means and updating the distortion compensation coefficients in such a manner that a difference between the modulating signal and a demodulated signal obtained by branching and demodulating a transmitted carrier wave becomes zero; and temperature detecting means for detecting ambient temperature;

wherein said arithmetic/control unit executes the pre-distortion processing and processing for updating distortion compensation coefficients using the distortion compensation coefficients conforming to ambient temperature from said temperature detecting means when the apparatus is working.

9. A radio apparatus having a distortion compensating function for amplifying a carrier wave, which has been modulated by digital modulation, by a transmission power amplifier and transmitting the amplified carrier wave, comprising:

non-volatile memory means or memory means backed up by a battery, in which distortion compensation coefficients for compensating for a distortion characteristic of the amplifier are stored in advance; and an arithmetic/control unit for applying predistortion processing to a modulating signal using the distortion compensation coefficients that have been stored in said memory means and updating the distortion compensation coefficients in such a manner that a difference between the modulating signal and a demodulated signal obtained by branching and demodulating a transmitted carrier wave becomes zero; and power supply voltage detecting means for detecting power supply voltage of the radio apparatus; and wherein distortion compensation coefficients are stored in said memory means in correspondence with each of various power supply voltages, and said arithmetic/control unit executes pre-distortion processing and processing for updating distortion compensation coefficients using the distortion compensation coefficients conforming to power supply voltage of the apparatus when the apparatus is working.

10. A radio apparatus having a distortion compensating function for amplifying a carrier wave, which has been modulated by digital modulation, by a transmission power amplifier and transmitting the amplified carrier wave, comprising:

non-volatile memory means or memory means backed up by a battery, in which distortion compensation coefficients for compensating for a distortion characteristic of the amplifier are stored in advance; and an arithmetic/control unit for applying predistortion processing to a modulating signal using the distortion compensation coefficients that have been stored in said memory means and updating the distortion compensation coefficients in such a manner that a difference between the modulating signal and a demodulated signal obtained by branching and demodulating a transmitted carrier wave becomes zero, and wherein distortion compensation coefficients are stored in said memory means in conformity with a combination of transmission frequency and transmission power of the radio apparatus, and said arithmetic/control unit executes pre-distortion processing and processing for updating distortion compensation coefficients using the distortion compensation coefficients conforming to transmission frequency and transmission power at the time of data transmission.

11. A radio apparatus having a distortion compensating function for amplifying a carrier wave, which has been modulated by digital modulation, by a transmission power amplifier and transmitting the amplified carrier wave, comprising:

non-volatile memory means or memory means backed up by a battery, in which distortion compensation coefficients for compensating for a distortion characteristic of the amplifier are stored in advance; and an arithmetic/control unit for applying pre-distortion processing to a modulating signal using the distortion compensation coefficients that have been stored in said memory means and updating the distortion compensation coefficients in such a manner that a difference between the modulating signal and a demodulated signal obtained by branching and demodulating a transmitted carrier wave becomes zero;

means, provided between the transmission power amplifier and an antenna, for detecting a traveling wave to the antenna and a reflected wave;

detector means for detecting the traveling wave and the reflected wave; and means for calculating voltage standing wave ratio of the antenna based upon each voltage of the detected traveling wave and detected reflected wave; and wherein distortion compensation coefficients are stored in said memory means beforehand in correspondence with various voltage standing wave ratios, and said arithmetic/control unit executes pre-distortion processing and processing for updating distortion compensation coefficients using the distortion compensation coefficients conforming to a voltage standing wave ratio when the apparatus is working.

12. A radio apparatus having a distortion compensating function for amplifying a carrier wave, which has been modulated by digital modulation, by a transmission power amplifier and transmitting the amplified carrier wave, comprising:

non-volatile memory means or memory means backed up by a battery, in which distortion compensation coefficients for compensating for a distortion characteristic of the amplifier are stored in advance;

distortion compensating means for applying pre-distortion processing to a modulating signal using the distortion compensation coefficients that have been stored in said memory means;

means which, in a case where a time slot has a burst period and a preamble period situated ahead of said burst period, is for entering low-speed signal and communication signal into said distortion compensating means in said preamble period and said burst period, respectively;

means for comparing a modulating signal, which is low-speed signal, and a demodulated signal obtained by demodulating a carrier wave that has been modulated by said modulating signal, calculating and updating the distortion compensation coefficients and determining whether the distortion compensation coefficients are suitable or not; and alarm means for issuing an alarm, or means for disabling data transmission, if the distortion compensation coefficients are unsuitable.

13. A radio apparatus having a distortion compensating function for amplifying a carrier wave, which has been modulated by digital modulation, by a transmission power amplifier and transmitting the amplified carrier wave, comprising:

non-volatile memory means or memory means backed up by a battery, in which distortion compensation coefficients for compensating for a distortion characteristic of the amplifier are stored in advance; and an arithmetic/control unit for applying pre-distortion processing to a modulating signal using the distortion compensation coefficients that have been stored in said memory means, comparing the modulating signal and a demodulated signal obtained by demodulating the carrier wave modulated by the modulating signal, and updating the distortion compensation coefficients; and connecting means for connecting a peripheral device which enters the demodulated signal obtained by demodulating the carrier wave into said arithmetic/control unit;

wherein said peripheral device is connected to enter the demodulated signal into said arithmetic/control unit only when distortion compensation coefficients are stored in said memory means, in which case distortion compensation coefficients are calculated by said arithmetic/control unit and stored in said memory means, and no use of said peripheral device is made when the radio apparatus is put into actual service, in which case said arithmetic/control unit applies pre-distortion processing to the modulating signal using the distortion compensation coefficients that have been stored in said memory means.

14. The apparatus according to claim 13, wherein when the distortion compensation coefficients are stored in said memory means, transmission speed of the modulating signal is made low speed, and said arithmetic/control unit compares the low-speed modulating signal and the demodulated signal fed back and detected, updates the distortion compensation coefficients in real time and stores these distortion compensation coefficients in said memory means.

15. A radio apparatus having a distortion compensating function for amplifying a carrier wave, which has been modulated by digital modulation, by a transmission power amplifier and transmitting the amplified carrier wave, comprising:

non-volatile memory means or memory means backed up by a battery, in which distortion compensation coefficients for compensating for a distortion characteristic of the amplifier are stored in advance;

means which, in a case where a time slot has a burst period and a preamble period situated ahead of said burst period, is for outputting low-speed signal and communication signal in said preamble period and said burst period, respectively, in the apparatus' own time slot, and an arithmetic/control unit for applying pre-distortion processing to an entered modulating signal using the distortion compensation coefficients that have been stored in said memory means, comparing the modulating signal, which is low-speed signal, and a demodulated signal obtained by demodulating a carrier wave that has been modulated by said modulating signal, and calculating and updating the distortion compensation coefficients in real time.

16. A radio apparatus having a distortion compensating function for amplifying a carrier wave, which has been modulated by digital modulation, by a transmission power amplifier and transmitting the amplified carrier wave, comprising:

non-volatile memory means or memory means backed up by a battery, in which distortion compensation coefficients for compensating for a distortion characteristic of the amplifier are stored in advance;

an arithmetic/control unit for applying pre-distortion processing to a modulating signal using the distortion compensation coefficients that have been stored in said memory means, comparing the modulating signal and a demodulated signal obtained by demodulating a carrier wave that has been modulated by said modulating signal, and updating the distortion compensation coefficients; and means which, in a case where the radio apparatus transmits signals in a plurality of time slots, is for storing the modulating signal and the demodulated signal in a prescribed time slot;

said arithmetic/control unit comparing the stored modulating signal and the stored demodulated signal in a time slot other than said prescribed time slot and executing processing for calculating and updating the distortion compensation coefficients.

17. A radio apparatus having a distortion compensating function for amplifying a carrier wave, which has been modulated by digital modulation, by a transmission power amplifier and transmitting the amplified carrier wave, comprising:

non-volatile memory means or memory means backed up by a battery, in which distortion compensation coefficients for compensating for a distortion characteristic of the amplifier are stored in advance;

an arithmetic/control unit for applying pre-distortion processing to a modulating signal using the distortion compensation coefficients that have been stored in said memory means, comparing the modulating signal and a demodulated signal obtained by demodulating a carrier wave that has been modulated by said modulating signal, and updating the distortion compensation coefficients; and means which, in a case where the radio apparatus transmits signals in a plurality of time slots, is for entering low-speed signal in a prescribed idle time slot;

wherein said arithmetic/control unit comparing the modulating signal, which is said low-speed signal, and a demodulated signal obtained by demodulating a carrier wave by said modulating signal, and updating the distortion compensation coefficients in real time.

18. A radio apparatus having a distortion compensating function for amplifying a carrier wave, which has been modulated by digital modulation, by a transmission power amplifier and transmitting the amplified carrier wave, comprising:

non-volatile memory means or memory means backed up by a battery, in which distortion compensation coefficients for compensating for a distortion characteristic of the amplifier are stored in advance;

distortion compensating means for applying pre-distortion processing to a modulating signal using the distortion compensation coefficients that have been stored in said memory means, comparing the modulating signal and a demodulated signal obtained by demodulating a carrier wave that has been modulated by said modulating signal, and updating the distortion compensation coefficients;

offset measuring means for measuring an offset value of a modulator; and offset compensating means for applying offset compensation processing to the modulating signal based upon the offset value and detecting convergence of the offset compensation;

wherein, in a preamble period situated ahead of a burst period, said offset measuring means measures the offset value and said offset compensating means executes offset compensation processing based upon the offset value obtained by measurement, the measurement of the offset value and the offset compensation processing being executed until the offset is compensated for; and when the offset is compensated for in the preamble period, said distortion compensating means calculates and updates the distortion compensation coefficients from the next time slot allocated to the apparatus, and stores the updated distortion compensation coefficients in said memory means at the end of communication.

19. The apparatus according to claim 18, wherein when the offset is not compensated for in the preamble period, said distortion compensating means applies pre-distortion processing to the modulating signal using the distortion compensation coefficients that have been stored in said memory means, enters the processed modulating signal into said modulator and foregoes updating of the distortion compensation coefficients.

20. The apparatus according to claim 18, further comprising non-volatile memory means or memory means backed up by a battery, in which offset compensation coefficients that compensate for offset of the modulator are stored;

wherein when communication ends, the latest offset compensation coefficients are stored in said memory means, and said offset compensating means starts offset compensation processing in the next preamble period, using as initial values the offset compensation coefficients that have been stored in said memory means, when communication is next performed.

21. A radio apparatus having a distortion compensating function for amplifying a carrier wave, which has been modulated by digital modulation, by a transmission power amplifier and transmitting the amplified carrier wave, comprising:

non-volatile memory means or memory means backed up by a battery, in which distortion compensation coefficients for compensating for a distortion characteristic of the amplifier are stored in advance;

distortion compensating means for applying pre-distortion processing to a modulating signal using the distortion compensation coefficients that have been stored in said memory means, comparing the modulating signal and a demodulated signal obtained by demodulating a carrier wave that has been modulated by said modulating signal, and calculating and updating the distortion compensation coefficients;

offset measuring means for measuring an offset value of a detector which demodulates the carrier wave; and offset compensating means for applying offset compensation processing to the demodulated signal based upon the offset value and detecting convergence of the offset compensation;

wherein, in a preamble period situated ahead of a burst period, said offset measuring means measures the offset value and said offset compensating means executes offset compensation processing based upon the offset value obtained by measurement, the measurement of the offset value and the offset compensation processing being executed until the offset is compensated for; and when the offset is compensated for in the preamble period, said distortion compensating means calculates and updates the distortion compensation coefficients from the apparatus' own time slot which is next, and stores the updated distortion compensation coefficients in said memory means at the end of communication.

22. The apparatus according to claim 21, wherein when the offset is not compensated for in the preamble period, said distortion compensating means applies pre-distortion processing to the modulating signal using the distortion compensation coefficients that have been stored in said memory means, enters the processed modulating signal into a modulator and foregoes calculation and updating of the distortion compensation coefficients.

23. The apparatus according to claim 21, further comprising non-volatile memory means or memory means backed up by a battery, in which offset compensation coefficients that compensate for offset of the detector are stored;

wherein when communication ends, the latest offset compensation coefficients are stored in said memory means, and said offset compensating means starts offset compensation processing in the next preamble period, using as initial values the offset compensation coefficients that have been stored in said memory means, when communication is next performed.

24. A radio apparatus having a distortion compensating function for amplifying a carrier wave, which has been modulated by digital modulation, by a transmission power amplifier and transmitting the amplified carrier wave, comprising:

non-volatile memory means or memory means backed up by a battery, in which distortion compensation coefficients for compensating for a distortion characteristic of the amplifier are stored in advance;

distortion compensating means for applying predistortion processing to a modulating signal using the distortion compensation coefficients that have been stored in said memory means, comparing the modulating signal and a demodulated signal obtained by demodulating a carrier wave that has been modulated by said modulating signal, and updating the distortion compensation coefficients;

offset measuring means for measuring a transmission offset value of a modulator and a reception offset value of a detector; and offset compensating means for applying offset compensation processing to the modulating signal based upon the transmission offset value, applying offset compensation processing to the demodulated signal based upon the reception offset value, and detecting convergence of transmission offset compensation and convergence of reception offset compensation;

wherein, in a preamble period situated ahead of a burst period, said offset measuring means measures each offset value and said offset compensating means executes offset compensation processing based upon each offset value obtained by measurement, the measurement of each offset value and the offset compensation processing being executed until each offset is compensated for; and when each offset is compensated for in the preamble period, said distortion compensating means calculates and updates the distortion compensation coefficients from the next time slot allocated to the apparatus, and stores the updated distortion compensation coefficients in said memory means at the end of communication.

25. The apparatus according to claim 24, wherein, in prescribed idle time slots in a case where the radio apparatus transmits signals in a plurality of time slots, said offset measuring means measures the offset values and said offset compensating means executes offset compensation processing based upon the offset values obtained by measurement, the measurement of each offset value and the offset compensation processing being executed until each offset is compensated for.

* * * * *